United States Patent
Itoh

(10) Patent No.: US 8,957,701 B2
(45) Date of Patent: Feb. 17, 2015

(54) INTEGRATED CIRCUIT

(75) Inventor: Tomoyasu Itoh, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/233,176

(22) PCT Filed: Aug. 7, 2012

(86) PCT No.: PCT/JP2012/070108
§ 371 (c)(1),
(2), (4) Date: Jan. 16, 2014

(87) PCT Pub. No.: WO2013/024751
PCT Pub. Date: Feb. 21, 2013

(65) Prior Publication Data
US 2014/0145755 A1    May 29, 2014

(30) Foreign Application Priority Data
Aug. 12, 2011  (JP) .................................. 2011-176820

(51) Int. Cl.
*H03K 19/177* (2006.01)
*H03K 19/173* (2006.01)

(52) U.S. Cl.
CPC ...... *H03K 19/17728* (2013.01); *H03K 19/1733* (2013.01); *H03K 19/17704* (2013.01); *H03K 19/17712* (2013.01)
USPC ............................................. 326/39; 326/41

(58) Field of Classification Search
None
See application file for complete search history.

(56) References Cited

U.S. PATENT DOCUMENTS

| 5,315,178 A | 5/1994 | Snider |
| 6,300,792 B1 | 10/2001 | Pedersen |
| 6,323,680 B1 | 11/2001 | Pedersen et al. |
| 6,339,341 B1 | 1/2002 | Fujii et al. |
| 6,342,792 B1 | 1/2002 | Huang et al. |
| 6,359,468 B1 | 3/2002 | Park et al. |
| 6,366,120 B1 | 4/2002 | Schleicher et al. |
| 6,407,576 B1 | 6/2002 | Ngai et al. |
| 6,424,171 B1 | 7/2002 | Motomura et al. |
| 6,480,027 B1 | 11/2002 | Ngai et al. |

(Continued)

FOREIGN PATENT DOCUMENTS

| JP | 05-074935 A | 3/1993 |
| JP | 09-074351 A | 3/1997 |
| JP | 2009-194676 A | 8/2009 |

OTHER PUBLICATIONS

International Search Report of the International Searching Authority mailed Nov. 20, 2012 for the corresponding international application No. PCT/JP2012/070108 (with English translation).

(Continued)

*Primary Examiner* — Crystal L Hammond
(74) *Attorney, Agent, or Firm* — Posz Law Group, PLC

(57) ABSTRACT

An integrated circuit capable of improving all factors, which are area, cost, logic change function, operating frequency, flexibility, through-put and power consumption, and a reconfigurable processor capable of changing an instruction function are provided. Unit cells, each having four-input and two-output, are arranged in a brick manner to constitute a reconfigurable array. Based on selection information, A/L selection and B/R selection are performed. Based on configuration information, an output of logical operation on inputs being A/L, B, B/R and A, and a non-reversed/revered inputs are outputted to an adjacent unit cell unit cell.

5 Claims, 49 Drawing Sheets

(56) References Cited

U.S. PATENT DOCUMENTS

| | | | |
|---|---|---|---|
| 2001/0026778 A1* | 10/2001 | Ackley et al. | 422/129 |
| 2001/0033511 A1 | 10/2001 | Saito et al. | |
| 2005/0218930 A1 | 10/2005 | Schleicher et al. | |
| 2006/0006904 A1 | 1/2006 | Marui | |
| 2007/0058420 A1* | 3/2007 | Ogiwara et al. | 365/154 |
| 2008/0002455 A1* | 1/2008 | Toda et al. | 365/148 |
| 2008/0143379 A1* | 6/2008 | Norman | 326/39 |
| 2008/0231317 A1 | 9/2008 | Cashman | |
| 2009/0128189 A1* | 5/2009 | Madurawe et al. | 326/41 |
| 2010/0226495 A1* | 9/2010 | Kelly et al. | 380/30 |
| 2012/0306532 A1 | 12/2012 | Itoh | |

OTHER PUBLICATIONS

Written Opinion of the International Searching Authority mailed Nov. 20, 2012 for the corresponding international application No. PCT/JP2012/070108 (with English translation).

Office Action mailed by the Japanese Patent Office on Oct. 30, 2014 in corresponding Japanese Patent Application No. 2013-528976 (and English translation).

* cited by examiner $$f(x_1, x_2) = s_0 \overline{x_1}\,\overline{x_2} + s_1 \overline{x_1} x_2 + s_2 x_1 \overline{x_2} + s_3 x_1 x_2$$

Input $x_1$    Input $x_2$

59

$f_1(x_1, x_2)$

Output $f_1(x_1, x_2) = x_2$

Input $x_1$    Input $x_2$ $$f_1(x_1, x_2) = s_{00} \overline{x_1}\,\overline{x_2} + s_{01} \overline{x_1} x_2 + s_{02} x_1 \overline{x_2} + s_{03} x_1 x_2$$

$$f_2(x_1, x_2) = s_{10} \overline{x_1}\,\overline{x_2} + s_{11} \overline{x_1} x_2 + s_{12} x_1 \overline{x_2} + s_{13} x_1 x_2$$

Output $f_1(x_1, x_2)$    Output $f_2(x_1, x_2)$

FIG. 18

| c0 | c1 | c2 | c3 | Logic |
|----|----|----|----|-------|
| 0 | 0 | 0 | 0 | 0 |
| 1 | 0 | 0 | 0 | a and b |
| 0 | 1 | 0 | 0 | (not a) and b |
| 1 | 1 | 0 | 0 | b |
| 0 | 0 | 1 | 0 | a and (not b) |
| 1 | 0 | 1 | 0 | a |
| 0 | 1 | 1 | 0 | a xor b |
| 1 | 1 | 1 | 0 | a or b |
| 0 | 0 | 0 | 1 | a nor b |
| 1 | 0 | 0 | 1 | a xnor b |
| 0 | 1 | 0 | 1 | not a |
| 1 | 1 | 0 | 1 | (not a) or b |
| 0 | 0 | 1 | 1 | not b |
| 1 | 0 | 1 | 1 | a or (not b) |
| 0 | 1 | 1 | 1 | a nand b |
| 1 | 1 | 1 | 1 | 1 |

FIG. 33D

| Configuration Memory bit | | | | Input Select | | | | Input A, B or L, R | | | | Function of X |
|---|---|---|---|---|---|---|---|---|---|---|---|---|
| C0 | C1 | C2 | C3 | S0=0 L→ | S1=0 R→ | S0=1 A→ | S1=1 B→ | | | | | |
| | | | | | | | | 0 | 0 | 1 | 1 | |
| | | | | | | | | 0 | 1 | 0 | 1 | |
| | | | | | | | | Output X | | | | |
| 0 | 0 | 0 | 0 | | | | | 1 | 1 | 1 | 1 | X = 1 |
| 0 | 0 | 0 | 1 | | | | | 1 | 1 | 1 | 0 | X = NAND (A, B) |
| 0 | 0 | 1 | 0 | | | | | 1 | 1 | 0 | 1 | X = A ≧ B |
| 0 | 0 | 1 | 1 | | | | | 1 | 1 | 0 | 0 | X = NOT (B) |
| 0 | 1 | 0 | 0 | | | | | 1 | 0 | 1 | 1 | X = A ≦ B |
| 0 | 1 | 0 | 1 | | | | | 1 | 0 | 1 | 0 | X = NOT (A) |
| 0 | 1 | 1 | 0 | | | | | 1 | 0 | 0 | 1 | X = XNOR(A, B) |
| 0 | 1 | 1 | 1 | | | | | 1 | 0 | 0 | 0 | X = NOR(A, B) |
| 1 | 0 | 0 | 0 | | | | | 0 | 1 | 1 | 1 | X = OR (A, B) |
| 1 | 0 | 0 | 1 | | | | | 0 | 1 | 1 | 0 | X = XOR(A, B) |
| 1 | 0 | 1 | 0 | | | | | 0 | 1 | 0 | 1 | X = A |
| 1 | 0 | 1 | 1 | | | | | 0 | 1 | 0 | 0 | X = A>B |
| 1 | 1 | 0 | 0 | | | | | 0 | 0 | 1 | 1 | X = B |
| 1 | 1 | 0 | 1 | | | | | 0 | 0 | 1 | 0 | X = A<B |
| 1 | 1 | 1 | 0 | | | | | 0 | 0 | 0 | 1 | X = AND (A, B) |
| 1 | 1 | 1 | 1 | | | | | 0 | 0 | 0 | 0 | X = 0 |

FIG. 33E

| Configuration Memory bit | | | | Input Select | | | | Input A,B or L,R | | | | Function of Y |
|---|---|---|---|---|---|---|---|---|---|---|---|---|
| C4 | C5 | C6 | C7 | S0=0 L→ | S1=0 R→ | S0=1 A→ | S1=1 B→ | 0 | 0 | 1 | 1 | |
| | | | | | | | | 0 | 1 | 0 | 1 | |
| | | | | | | | | Output Y | | | | |
| 0 | 0 | 0 | 0 | | | | | 1 | 1 | 1 | 1 | Y = 1 |
| 0 | 0 | 0 | 1 | | | | | 1 | 1 | 1 | 0 | Y = NAND (A, B) |
| 0 | 0 | 1 | 0 | | | | | 1 | 1 | 0 | 1 | Y = A ≧ B |
| 0 | 0 | 1 | 1 | | | | | 1 | 1 | 0 | 0 | Y = NOT (B) |
| 0 | 1 | 0 | 0 | | | | | 1 | 0 | 1 | 1 | Y = A ≦ B |
| 0 | 1 | 0 | 1 | | | | | 1 | 0 | 1 | 0 | Y = NOT (A) |
| 0 | 1 | 1 | 0 | | | | | 1 | 0 | 0 | 1 | Y = XNOR (A, B) |
| 0 | 1 | 1 | 1 | | | | | 1 | 0 | 0 | 0 | Y = NOR (A, B) |
| 1 | 0 | 0 | 0 | | | | | 0 | 1 | 1 | 1 | Y = OR (A, B) |
| 1 | 0 | 0 | 1 | | | | | 0 | 1 | 1 | 0 | Y = XOR (A, B) |
| 1 | 0 | 1 | 0 | | | | | 0 | 1 | 0 | 1 | Y = A |
| 1 | 0 | 1 | 1 | | | | | 0 | 1 | 0 | 0 | Y = A>B |
| 1 | 1 | 0 | 0 | | | | | 0 | 0 | 1 | 1 | Y = B |
| 1 | 1 | 0 | 1 | | | | | 0 | 0 | 1 | 0 | Y = A<B |
| 1 | 1 | 1 | 0 | | | | | 0 | 0 | 0 | 1 | Y = AND (A, B) |
| 1 | 1 | 1 | 1 | | | | | 0 | 0 | 0 | 0 | Y = 0 |

FIG. 36

| | | A → | 1 | 0 | 1 | 0 | OUTPUT X, Y |
|----|----|----|----|---|---|---|---|---|
| | | B → | 1 | 1 | 0 | 0 | |
| C0 | C1 | C2 | C3 | \multicolumn{4}{c|}{X̄, Ȳ} | |
| C0 | C1 | C2 | C3 | | | | | |
| 0 | 0 | 0 | 0 | 0 | 0 | 0 | 0 | 1 |
| 0 | 0 | 0 | 1 | 0 | 0 | 0 | 1 | OR(A, B) |
| 0 | 0 | 1 | 0 | 0 | 0 | 1 | 0 | A>=B |
| 0 | 0 | 1 | 1 | 0 | 0 | 1 | 1 | A |
| 0 | 1 | 0 | 0 | 0 | 1 | 0 | 0 | A<=B |
| 0 | 1 | 0 | 1 | 0 | 1 | 0 | 1 | B |
| 0 | 1 | 1 | 0 | 0 | 1 | 1 | 0 | EXNOR(A, B) |
| 0 | 1 | 1 | 1 | 0 | 1 | 1 | 1 | AND(A, b) |
| 1 | 0 | 0 | 0 | 1 | 0 | 0 | 0 | NAND(A, B) |
| 1 | 0 | 0 | 1 | 1 | 0 | 0 | 1 | EXOR(A, B) |
| 1 | 0 | 1 | 0 | 1 | 0 | 1 | 0 | INV(B) |
| 1 | 0 | 1 | 1 | 1 | 0 | 1 | 1 | A>B |
| 1 | 1 | 0 | 0 | 1 | 1 | 0 | 0 | INV(A) |
| 1 | 1 | 0 | 1 | 1 | 1 | 0 | 1 | A<B |
| 1 | 1 | 1 | 0 | 1 | 1 | 1 | 0 | NOR(A, B) |
| 1 | 1 | 1 | 1 | 1 | 1 | 1 | 1 | 0 |

FIG. 37
(a) 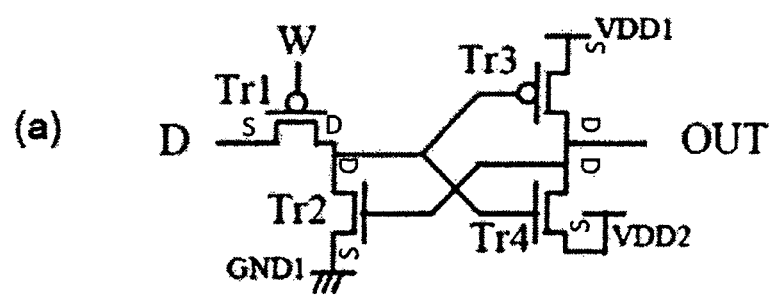
(b) 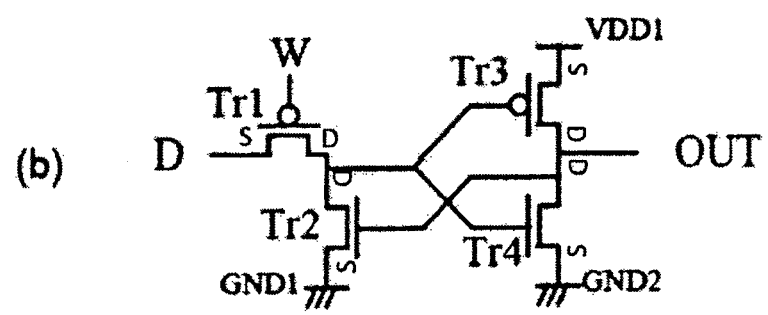

FIG. 38C

| Configuration Memory bit | | | | Input A,B | | | | Function of X |
|---|---|---|---|---|---|---|---|---|
| C0 | C1 | C2 | C3 | A → | 0 | 1 | 0 | 1 | |
| | | | | B → | 0 | 0 | 1 | 1 | |
| | | | | Output X | | | | |
| 0 | 0 | 0 | 0 | | 1 | 1 | 1 | 1 | X = 1 |
| 0 | 0 | 0 | 1 | | 1 | 1 | 1 | 0 | X = NAND (A, B) |
| 0 | 0 | 1 | 0 | | 1 | 1 | 0 | 1 | X = A ≧ B |
| 0 | 0 | 1 | 1 | | 1 | 1 | 0 | 0 | X = NOT (B) |
| 0 | 1 | 0 | 0 | | 1 | 0 | 1 | 1 | X = A ≦ B |
| 0 | 1 | 0 | 1 | | 1 | 0 | 1 | 0 | X = NOT (A) |
| 0 | 1 | 1 | 0 | | 1 | 0 | 0 | 1 | X = XNOR (A, B) |
| 0 | 1 | 1 | 1 | | 1 | 0 | 0 | 0 | X = NOR (A, B) |
| 1 | 0 | 0 | 0 | | 0 | 1 | 1 | 1 | X = OR (A, B) |
| 1 | 0 | 0 | 1 | | 0 | 1 | 1 | 0 | X = XOR (A, B) |
| 1 | 0 | 1 | 0 | | 0 | 1 | 0 | 1 | X = A |
| 1 | 0 | 1 | 1 | | 0 | 1 | 0 | 0 | X = A>B |
| 1 | 1 | 0 | 0 | | 0 | 0 | 1 | 1 | X = B |
| 1 | 1 | 0 | 1 | | 0 | 0 | 1 | 0 | X = A<B |
| 1 | 1 | 1 | 0 | | 0 | 0 | 0 | 1 | X = AND (A, B) |
| 1 | 1 | 1 | 1 | | 0 | 0 | 0 | 0 | X = 0 |

FIG. 38D

| Configuration Memory bit. | | | | Input A, B | | | | Function of Y |
|---|---|---|---|---|---|---|---|---|
| C4 | C5 | C6 | C7 | A→ 0 | 0 | 1 | 1 | |
| | | | | B→ 0 | 1 | 0 | 1 | |
| | | | | Output Y | | | | |
| 0 | 0 | 0 | 0 | 1 | 1 | 1 | 1 | Y = 1 |
| 0 | 0 | 0 | 1 | 1 | 1 | 1 | 0 | Y = NAND (A, B) |
| 0 | 0 | 1 | 0 | 1 | 1 | 0 | 1 | Y = A ≥ B |
| 0 | 0 | 1 | 1 | 1 | 1 | 0 | 0 | Y = NOT(B) |
| 0 | 1 | 0 | 0 | 1 | 0 | 1 | 1 | Y = A ≤ B |
| 0 | 1 | 0 | 1 | 1 | 0 | 1 | 0 | Y = NOT(A) |
| 0 | 1 | 1 | 0 | 1 | 0 | 0 | 1 | Y = XNOR(A, B) |
| 0 | 1 | 1 | 1 | 1 | 0 | 0 | 0 | Y = NOR(A, B) |
| 1 | 0 | 0 | 0 | 0 | 1 | 1 | 1 | Y = OR(A, B) |
| 1 | 0 | 0 | 1 | 0 | 1 | 1 | 0 | Y = XOR(A, B) |
| 1 | 0 | 1 | 0 | 0 | 1 | 0 | 1 | Y = A |
| 1 | 0 | 1 | 1 | 0 | 1 | 0 | 0 | Y = A>B |
| 1 | 1 | 0 | 0 | 0 | 0 | 1 | 1 | Y = B |
| 1 | 1 | 0 | 1 | 0 | 0 | 1 | 0 | Y = A<B |
| 1 | 1 | 1 | 0 | 0 | 0 | 0 | 1 | Y = AND(A, B) |
| 1 | 1 | 1 | 1 | 0 | 0 | 0 | 0 | Y = 0 |

FIG. 40

| C0 | C1 | C2 | C3 | B→ | 1 | 0 | 1 | 0 | |
|----|----|----|----|-----|---|---|---|---|---|
|    |    |    |    | A→ | 1 | 1 | 0 | 0 | |
| C0 | C1 | C2 | C3 |     | OUTPUT X, Y | | | | FUNCTION X, Y |
| 0 | 0 | 0 | 0 | | 0 | 0 | 0 | 0 | 0 |
| 0 | 0 | 0 | 1 | | 0 | 0 | 0 | 1 | NOR(A, B) |
| 0 | 0 | 1 | 0 | | 0 | 0 | 1 | 0 | A<B |
| 0 | 0 | 1 | 1 | | 0 | 0 | 1 | 1 | INV(A) |
| 0 | 1 | 0 | 0 | | 0 | 1 | 0 | 0 | A>B |
| 0 | 1 | 0 | 1 | | 0 | 1 | 0 | 1 | INV(B) |
| 0 | 1 | 1 | 0 | | 0 | 1 | 1 | 0 | EXOR(A, B) |
| 0 | 1 | 1 | 1 | | 0 | 1 | 1 | 1 | NAND(A, B) |
| 1 | 0 | 0 | 0 | | 1 | 0 | 0 | 0 | AND(A, b) |
| 1 | 0 | 0 | 1 | | 1 | 0 | 0 | 1 | EXNOR(A, B) |
| 1 | 0 | 1 | 0 | | 1 | 0 | 1 | 0 | B |
| 1 | 0 | 1 | 1 | | 1 | 0 | 1 | 1 | A<=B |
| 1 | 1 | 0 | 0 | | 1 | 1 | 0 | 0 | A |
| 1 | 1 | 0 | 1 | | 1 | 1 | 0 | 1 | A>=B |
| 1 | 1 | 1 | 0 | | 1 | 1 | 1 | 0 | OR(A, B) |
| 1 | 1 | 1 | 1 | | 1 | 1 | 1 | 1 | 1 |

| BP | RB | D | CK | Q | QB |
|----|----|---|----|----|----|
| 1 | X | 0 | X | 0 | 1 |
| 1 | X | 1 | X | 1 | 0 |
| 0 | 0 | X | X | 0 | 1 |
| 0 | 1 | 0 | L→H | 0 | 1 |
| 0 | 1 | 1 | L→H | 1 | 0 |
| 0 | 1 | X | H→L | Q | QB |

INTEGRATED CIRCUIT

CROSS REFERENCE TO RELATED APPLICATION

This present disclosure is a U.S. national stage application of PCT/JP2012/070108 filed on Aug. 7, 2012, and is based on Japanese Patent Application No. 2011-176820 filed on Aug. 12, 2011, the disclosures of which are incorporated herein by reference.

TECHNICAL FIELD

The present invention relates generally to an integrated circuit, and particularly to an integrated circuit capable of reconfiguring a logic, a reconfigurable processor having an instruction set capable of changing a function, and a compile process method. The present invention relates to an improved invention of the invention (referred to hereinafter as a basic invention) described in PCT/JP2011/053225, which was filed by the same applicant.

BACKGROUND ART

Conventionally, in a semiconductor integrated circuit, a high performance and a small chip area are realized by designing a dedicated LSI (Large Scale Integrated Circuit), and a low manufacturing cost is realized by mass production. However, the development is required for each individual application, and there is a tendency to increase the development cost. Additionally, it is not easy to change a function of a dedicated LSI. In general, when it is required to change the function, it is required to reconstruct part of or a whole of the design and the manufacturing process.

When the function in a FPGA (field programmable gate array) is changed, it is not necessary to re-execute the manufacturing process but it is necessary to re-execute the designing process after the RTL (Register Transfer Level) design. In particular, in the timing design, the length of a wiring channel for connecting between logic elements is unknown until the logic elements are laid out. In general, since a roundabout amount of the wiring channel path is large, the FPGA has a low operating frequency than the dedicated LSI and ASIC (Application Specific Integrated Circuit). Thus, there is a problem that the maximum operating frequency of the FPGA may vary every time when the FPGA is re-designed. Further, since a large channel region is necessary to connect between logic elements, a chip area of the FPGA is a few times or ten times as large as that of the dedicated LSI, and therefore, the cost reduction of the FPGA is difficult.

Software processes by a processor or a DSP (Digital Signal Processor) are flexible to the function change and have a high general versatility, so that mass production and low cost are generally possible. However, the software processes are generally bad with a bit-by-bit basis operation as compared with a product-sum operation and a register-by-register basis logical operation. Additionally, in complicated communication processing or advanced image processing, the software processes cannot provide sufficient performance as compared with a dedicated LSI. A typical approach for enhancing the performance is an increase in operating frequency. However, this poses a problem of increasing power consumption.

A DRP (Dynamic Reconfigurable Processor) is capable of coping with the function change and is expected to perform high speed processing, as compared with software processing by a typical processor. However, the number of logic reconfiguration elements in an existing product is about from 16 to 1024 and smaller than in FIPGA. This poses a flexibility problem. Additionally, some DRPs require a relatively large wiring channel region for connecting between the logic reconfiguration elements. In some cases, a large roundabout amount of the wiring for connecting with this wiring channel is required. Thus, a signal transmission delay being a critical path is large. The increase in the operating frequency is difficult as compared with a dedicated LSI. Moreover, a wiring channel region for connecting a logic reconfiguration element to a memory for the logic reconfiguration element is required. Thus, because of a large area, the cost reduction is difficult as compared with a dedicated LSI and an ASIC.

PRIOR ART LITERATURE

Patent Literature

Patent Literature 1: JP-2000-232162A
Patent Literature 2: JP-2000-138579A
Patent Literature 3: JP-H9-74351A
Patent Literature 4: JP-H5-74935A

SUMMARY OF THE INVENTION

Problem to be Solved by the Invention

Depending on type, conventional integrated circuits have the following disadvantages.

(1) A dedicated LSI can achieve high throughput but requires revision of design and semiconductor manufacturing process each time the function change is demanded.

(2) A FPGA does not require a semiconductor manufacturing process for each application but has a problem in operating frequency and cost.

(3) A DSP has general versatility and can flexibly cope with the function change but has problems in bit-by-bit basis operation efficiency, throughput and power consumption.

(4) A DRP can flexibly cope with the function change but has a problem in flexibility and operating frequency.

These have both advantages and disadvantages with respect to the logic changeability of logic element, the number of logic reconfiguration elements, the operating frequency, the chip area, the general versatility, the power consumption and the cost. Therefore, in accordance with application, development cost or business condition, the type of integrated circuit product should be appropriately selected.

The present invention is made in view of these problems and is provided to improve a conventional integrated circuit.

In particular, it is a first object to provide an integrated circuit that can minimize a wiring channel region for electrical connection between unit cells including logic reconfiguration elements (electrical connection between logic reconfigurable elements).

It is a second object to provide an integrated circuit that can flexibly provide a large scale combination circuit when unit cells including logic reconfigurable elements arranged in an array to constitute a leaf cell module.

It is a third object to provide an integrated circuit enabling efficient implementation of a circuit function when unit cells including logic reconfigurable elements arranged in an array to constitute a leaf cell module.

It is a fourth object to downsize a circuit scale of a memory element that determines a logic of a logic reconfiguration element.

Means for Solving Problem

For solving the above problem, an integrated circuit according to claim 1 comprises an array in which a plurality of unit cells each having a predetermined shape are arranged in a matrix, wherein:

each unit cell includes a logic reconfiguration element, a memory element for determining a logic of the logic reconfiguration element, a plurality of input terminals connected to the logic reconfiguration element, and a plurality of output terminals connected to the logic reconfiguration element;

in the unit cells of the matrix, the unit cells in each row are displaced by a predetermined pitch to constitute to the array electrical connections between the unit cells constituting the array have the following structures:

(1) an input terminal of one unit cell is electrically connected to an output terminal of a first adjacent unit cell that is arranged adjacent to the one unit cell in a column direction and that is displaced with respect to the one unit cell by the predetermined pitch in a row direction;

(2) another input terminal of the one unit cell is electrically connected to an output terminal of a second adjacent unit cell that is arranged adjacent to the one unit cell in the row direction; and (3) the connection defined in said (1) and the connection defined in said (2) are applied to the unit cells of the array other than said one unit cell.

According to the invention of claim 1 having these structures, in the array, the unit cells including the logic reconfiguration elements in each row are arranged by being displaced by a predetermined pitch. Further, the array is constructed such that: an input terminal of one unit cell is electrically connected to an output terminal of a first adjacent unit cell that is arranged adjacent to the one unit cell in a column direction and that is displaced with respect to the one unit cell by the predetermined pitch in a row direction; another input terminal of the one unit cell is electrically connected to an output terminal of a second adjacent unit cell that is arranged adjacent to the one unit cell in the row direction; and these connection manners are applied to the unit cells of the array other than said one unit cell. Therefore, it becomes possible to provide the integrated circuit that can minimize a wiring channel region for electrically connecting between the units cells each including the logic reconfiguration element (electrically connecting between the logic reconfiguration elements).

Further, the present invention of claim 2 provides that, in the integrated circuit of claim 1:

the integrated circuit comprises the integrated circuit comprises a plurality of the arrays;

the integrated circuit comprises an interface circuit electrically connecting the arrays; and the integrated circuit performs signal communication between the arrays via the interface circuit.

According to the invention of claim 2, the plurality of the arrays electrically connected with the interface circuit to perform the signal communication can be provided to the integrated circuit. Therefore, it becomes possible to provide a large scale integrated circuit that is easily expandable.

Further, the present invention of claim 3 provides that, in the integrated circuit of claim 2:

the interface circuit includes a memory element for storing a data outputted from the array, and has a signal bypass function to bypass a signal, which is inputted to an input terminal of the memory element when a predetermined signal is applied to a predetermined terminal of the memory element, to an output terminal of the memory element;

when the predetermined signal is applied to the predetermined terminal of the memory element, the interface circuit bypasses the signal communication between the arrays connected by the interface circuit; and, when not bypassing the signal communication, the interface circuit operates as a sequential circuit storing the data outputted from the array.

According to the invention of claim 3 having the above structures, when the predetermined signal is applied to the predetermined terminal of the memory element, the interface circuit bypasses the signal communication between the arrays connected by the interface circuit. When not bypassing the signal communication, the interface circuit operates as a sequential circuit storing the data outputted from the array. Therefore, when the unit cells each including the logic reconfiguration element are arranged in the array to constitute a leaf cell module, it becomes possible to provide an integrated circuit that can flexibly implement a large scale combination circuit.

Further, the present invention of claim 4 provides that, in the integrated circuit of any one of claims 1-3:

in the array, an output terminal of the unit cell is connected to an input terminal of arbitral another unit cell that is arranged in a next lower row and that is arranged in a row direction with respect to the unit cell.

According to the invention of claim 4, since an output terminal of the unit cell is connected to an input terminal of arbitral another unit cell that is arranged in a next lower row and that is arranged in a row direction with respect to the unit cell, it becomes possible to provide efficient implementation of a circuit function.

Further, the present invention of claim 5 provides that, in the integrated circuit of any one of claims 1-5:

the memory element for determining the logic of the logic reconfiguration element includes a first PMOS transistor, a second PMOS transistor, a first NMOS transistor and a second NMOS transistor, and has the following structures:

(1) a drain of the first PMOS transistor and a drain of the first NMOS transistor are connected to each other, and are connected to a gate of the second PMOS transistor and a gate of the second NMOS transistor;

(2) a drain of the second PMOS transistor and a drain of the second NMOS transistor are connected to each other, and are connected to a gate of the first NMOS transistor, and serve as an output terminal;

(3) a source of the first PMOS transistor serves as an input terminal of the logic configuration element for a logic configuration data;

(4) a source of the first NMOS transistor is connected to GND and a source of the second PMOS transistor is connected to a power source;

(5) a gate of the first PMOS transistor functions as a control gate of a data input;

(6) in an initial state, a source of the second NMOS transistor is connected to a power source level; and (7) after a hold data is fixed, an electric potential of the source of the second NMOS transistor transitions from the power source level to a GND level; and (8) the memory element is constructed according to said (1) to (7).

According to the invention of claim 5 having the above structures, because the memory element for determining the logic of the logic reconfiguration element is constructed using two PMOS transistors and two NMOS transistors as defined in claim 5, it becomes possible to downsize a circuit scale of the logic reconfiguration element.

Advantageous Effect of the Invention

According to the present invention, in the array, the unit cells each including the logic reconfiguration elements in each row are arranged by being displaced by a predetermined pitch. Further, the array is constructed such that: an input terminal of one unit cell is electrically connected to an output terminal of a first adjacent unit cell that is arranged adjacent to the one unit cell in a column direction and that is displaced with respect to the one unit cell by the predetermined pitch in a row direction; another input terminal of the one unit cell is electrically connected to an output terminal of a second adjacent unit cell that is arranged adjacent to the one unit cell in the row direction; and these connection manners are applied to the unit cells of the array other than said one unit cell. Therefore, it becomes possible to provide the integrated circuit that can minimize a wiring channel region for electrically connecting between the units cells each including the logic reconfiguration element (electrically connecting between the logic reconfiguration elements).

BRIEF DESCRIPTION OF THE DRAWINGS

FIG. 18 illustrates truth values of a logic element block of an embodiment based on the basic invention.

FIG. 33D illustrates truth values of FIG. 33C of the present invention.

FIG. 33E illustrates truth values of FIG. 33C of the present invention.

FIG. 36 illustrates truth values of FIG. 35 based on the present invention.

FIG. 37 is a diagram illustrating a transistor for providing the circuit of FIG. 35 based on the present invention.

FIG. 38C illustrates truth values corresponding to the circuit structures of FIGS. 38A and 38B.

FIG. 38D illustrates truth values corresponding to the circuit structures of FIGS. 38A and 38B.

FIG. 40 illustrates truth values corresponding to the circuit structures of FIG. 39.

MODES FOR CARRYING OUT THE INVENTION

1-1 Outline of Basic Invention

Figure 1:
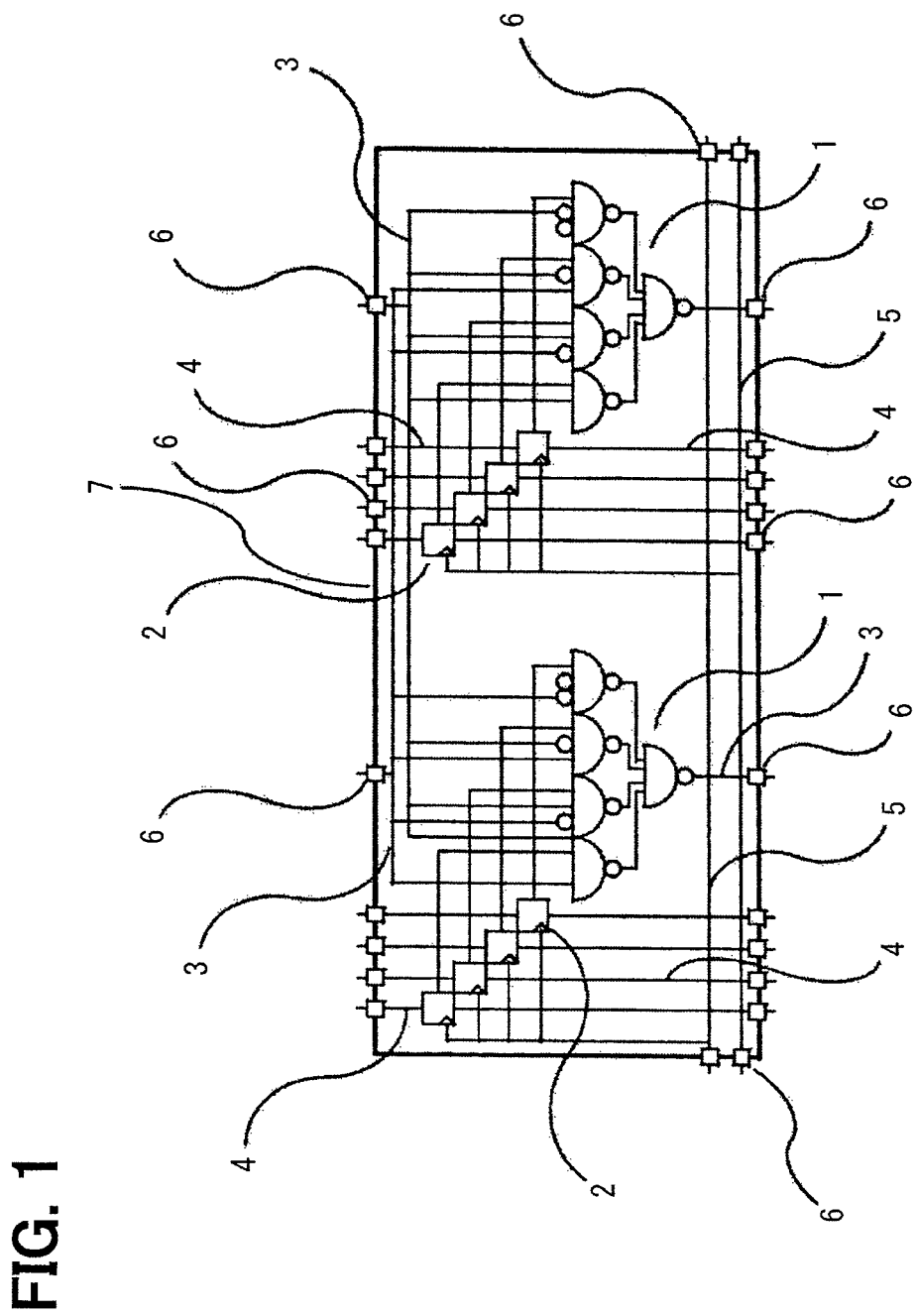
FIG. 1 illustrates a circuit of a leaf cell based on the basic invention.

An outline of a basic invention will be illustrated below. As to the wirings illustrated in the drawings, the crossing (cross) of two lines in a cross shape represents (describes) an absence of electrical connection. The crossing of two lines in a T-shape represents (describes) a presence of electrical connection.

As shown in FIG. 1, a structural unit of an integration circuit called a leaf cell (unit cell) 7 based on the basic invention comprises multiple logic reconfiguration elements 1, multiple memory elements 2, a logical data signal channel 3, a logic reconfiguration data channel 4, a control signal channel 5 of the memory elements 2 for logic reconfiguration, and an input/output terminal 6. The logic reconfiguration element 1 includes a circuit for product sum logic, sum product logic, ring sum logic or the like. The memory element 2 for logic configuration is configured as a memory element (memory element for determining a logic of the logic reconfiguration element 1) for defining a logic of the logic reconfiguration element 1. The memory element 2 may include a latch, a flip-flop, a SRAM, a DRAM, a flash memory or the like. Herein, the memory element 2 for logic configuration and the logic reconfiguration element 1 are collectively referred to as a logic element block. Manual design or CAD-tool sophisticated design increases the density and optimizes propagation delay of a logical data signal, electrical power consumption, and an area. When all logical data input signals are respectively inputted to all logic reconfiguration elements 1, a change and division of a signal path between the input terminal and the output terminal of the leaf cell 7 are executed. When the information in the memory element for the logic configuration is rewritten, the change of the logic of the logic reconfiguration element is executed.

Figure 2:
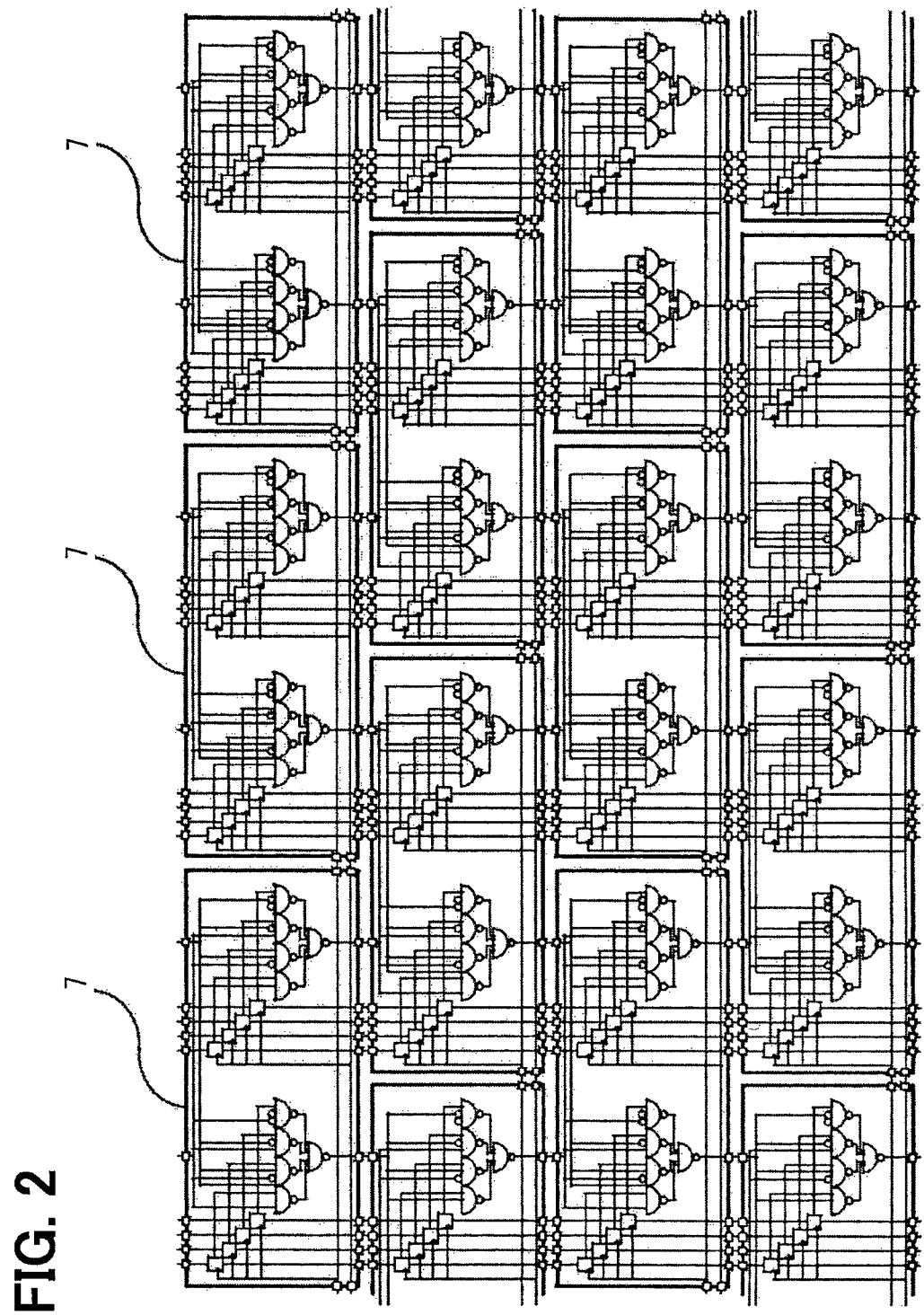
FIG. 2 illustrates a circuit of a leaf cell module in which multiple leaf cells are arranged regularly based on the basic invention.

As shown in FIG. 2 for example, multiple leaf cells 7, which are manually designed and are logically reconfigurable, are arranged in a predetermined regularity such as a brick lay (arranged in an array in which leaf cells 7 are displaced on a row-basis and arranged in a matrix), so that a transmission delay time between logical data signal terminals of the logic reconfigurable leaf cells 7 adjacent to each other in an up-down direction illustrated in the drawing is minimized, and that a distance between the data signal terminals of the memory elements for logic configuration is also minimized. The logic change and the signal path change or division are executable by rewriting the information in the memory elements for logic configuration in the leaf cells 7, which are arranged in the predetermined regularity such as a brick lay.

Figure 3:
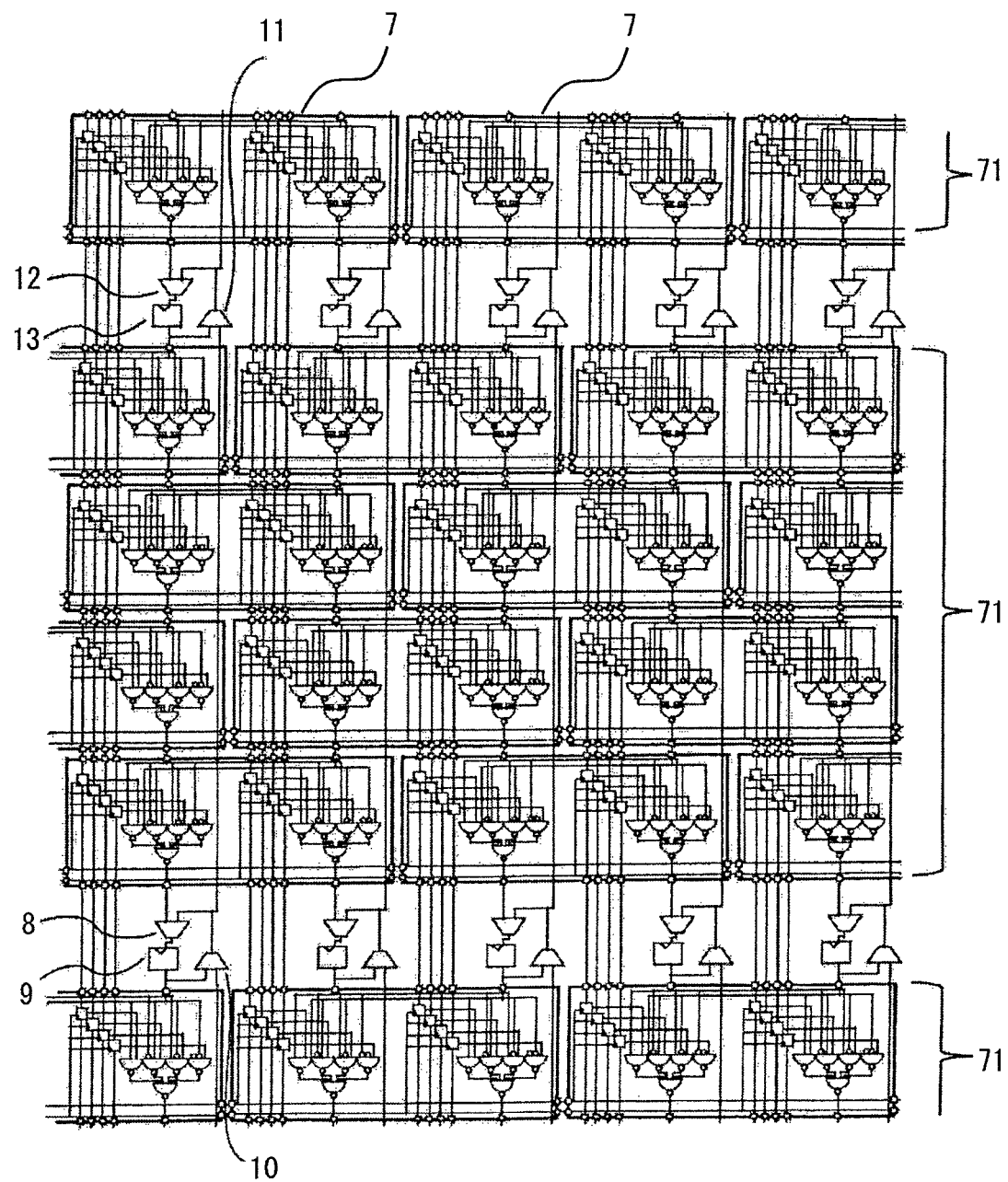
FIG. 3 illustrates multiple regularly-arranged leaf cells and a feedback circuit based on the basic invention.

In FIG. 3, for each logical data signal, the signal selector and the memory element such as the flip-flop circuit and the latch circuit are arranged on both an upstream side and a downstream side of the logic reconfigurable leaf cell module 71 (sub-array), which includes multiple logic reconfigurable leaf cells 7 arranged in the predetermined regularity. The logical data output signal of the leaf cell module 71 is input into a logical data input terminal of the memory element 9 such as the flip-flop circuit and the latch circuit via the logical data signal selector 8. The logical data output signal of the memory element 9 such as the flip-flop circuit and the latch circuit is feedback to a previous feedback signal selector 11 via a feedback signal selector 10. Further, the logical data output signal is feedback to the logical data input terminal of the previous memory element 13 such as the flip-flop circuit and the latch circuit via the previous logical data signal selector 12. The memory element 13 functions as a sequential circuit for realizing a logic circuit and stores an output signal of the logical data signal selector 12.

The feedback circuit (interface circuit of the leaf cell module) is constructed by the feedback signal selector 11, the logical data signal selector 12, and the memory element 13 (sequential circuit) such as a flip-flop circuit or the latch circuit. Additionally, multiple lead cell modules 7 are provided by the leaf cells 7 disposed (arranged) in the upper direction and the low direction of this feedback circuit, so that the multiple lead cell modules 7 are configured as a sub-array. As a result, the storing of the logical data signal and the feedback of the logical data signal are executed in a scalable manner on a leaf cell basis.

That is, because multiple sub-arrays 71 are electrically connected by the interface circuit to provide an integrated circuit performing signal communications, it is possible to realize a large-scale integrated circuit that is easily extensible. In FIG. 3, four rows of the sub-array 71 are provided. Alternatively, more than for four rows of the sub-array 71 may be provided between the interface circuits. The memory capacity for storing the logical data signal can be arbitrarily set according to a ratio between the logic reconfigurable leaf cells arranged in the predetermined regularity and the memory elements such as the flip-flop circuit and the latch circuit.

The integrated circuit based on the basic invention can simultaneously reconfigure the signal path and the logic by rewriting the information of the memory element for logic configuration. Because of this, a test circuit can be reconfigured without using a dedicated test circuit, and a self test of a circuit can be executed by reconfiguring a self diagnosis circuit. When a failure is detected based on a result of the circuit test, the reconfiguration for a signal path for bypassing a failure circuit is executed by rewriting the information of the memory element 2 for logic configuration. Thus, even if the failure portion exists, the circuit functions normally.

Figure 4:
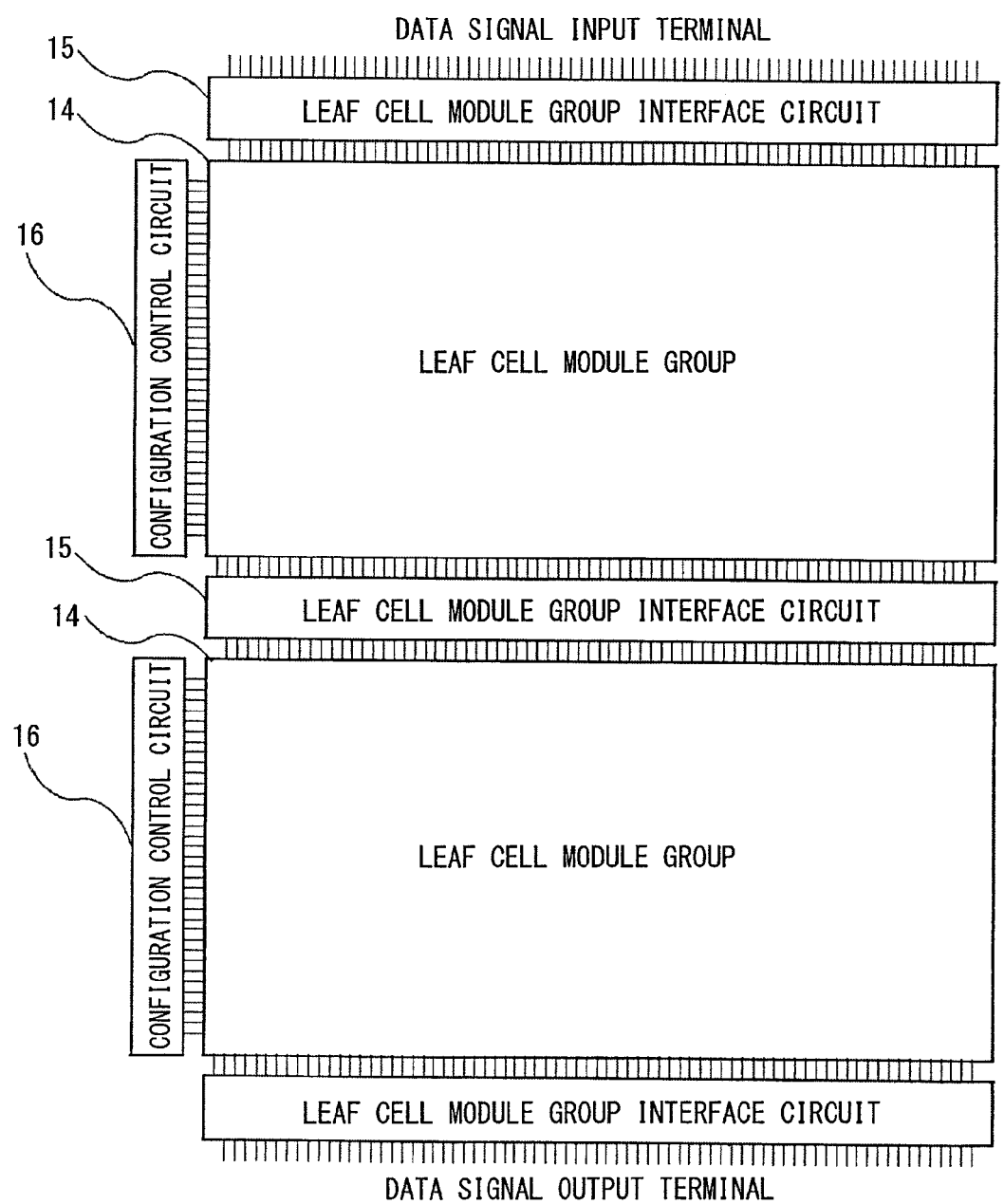
FIG. 4 illustrates leaf cell modules combined via an interface circuit based on the basic invention.

Multiple logic reconfigurable leaf cell module groups 14, each of which is provided by multiple logic reconfigurable leaf cells 7 arranged in the regularity are successively coupled with each other via the leaf cell module group interface circuit 15. One example method for expanding a function will be illustrated. FIG. 4 is an example of a complex module in a case where two logic reconfigurable leaf cell module groups 14 are coupled with each other. The leaf cell module group 14 is a circuit corresponding to the leaf cell module 71 and the feedback circuit (the interface circuit of the leaf cell module) of FIG. 3. Each logic reconfigurable leaf cell module group 14 is coupled with the logic configuration control circuit 16. The control circuit 165 performs control of writing, storing and deleting the information about logic configuration in the configuration memory element of the leaf cell 7. Further, since the configuration memory elements are structurally and separately arranged in the leaf cell module group 14, the signal channel region between the logic configuration control circuit 16 and the leaf cell module group 14 can be smaller than in conventional FPGA and DRP.

Figure 5:
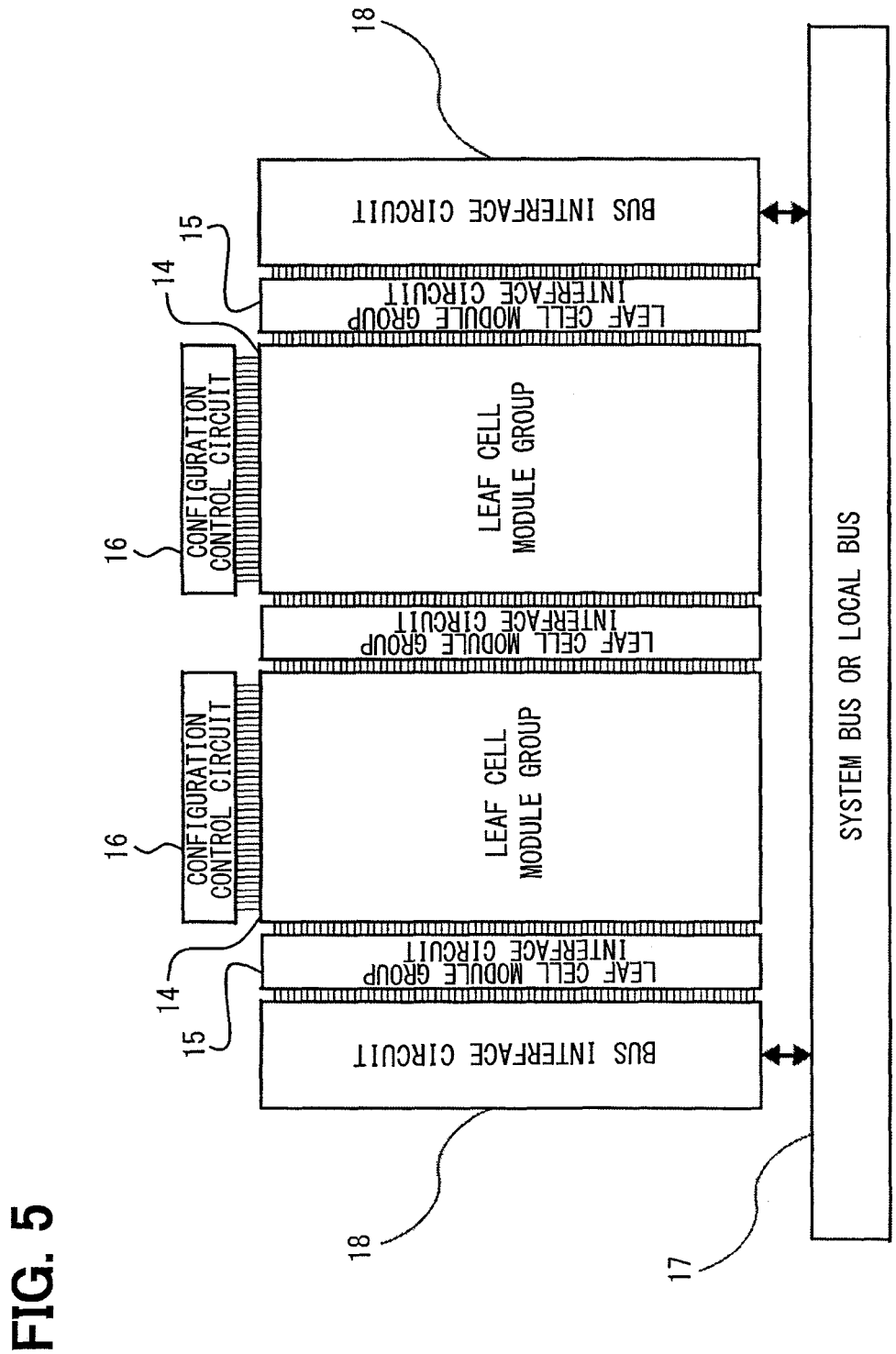
FIG. 5 illustrates an integrated circuit in which a leaf cell module is connected to a bus.

One or multiple logic reconfigurable leaf cell module groups 14 can be connected to the system bus or the local bus 17 via the bus interface circuit 18 and the leaf cell module group interface circuit 15. FIG. 5 shows an example of a circuit configuration, in which a complex module is provided by two logic reconfigurable leaf cell module groups 14 and connected to the bus.

Figure 6:
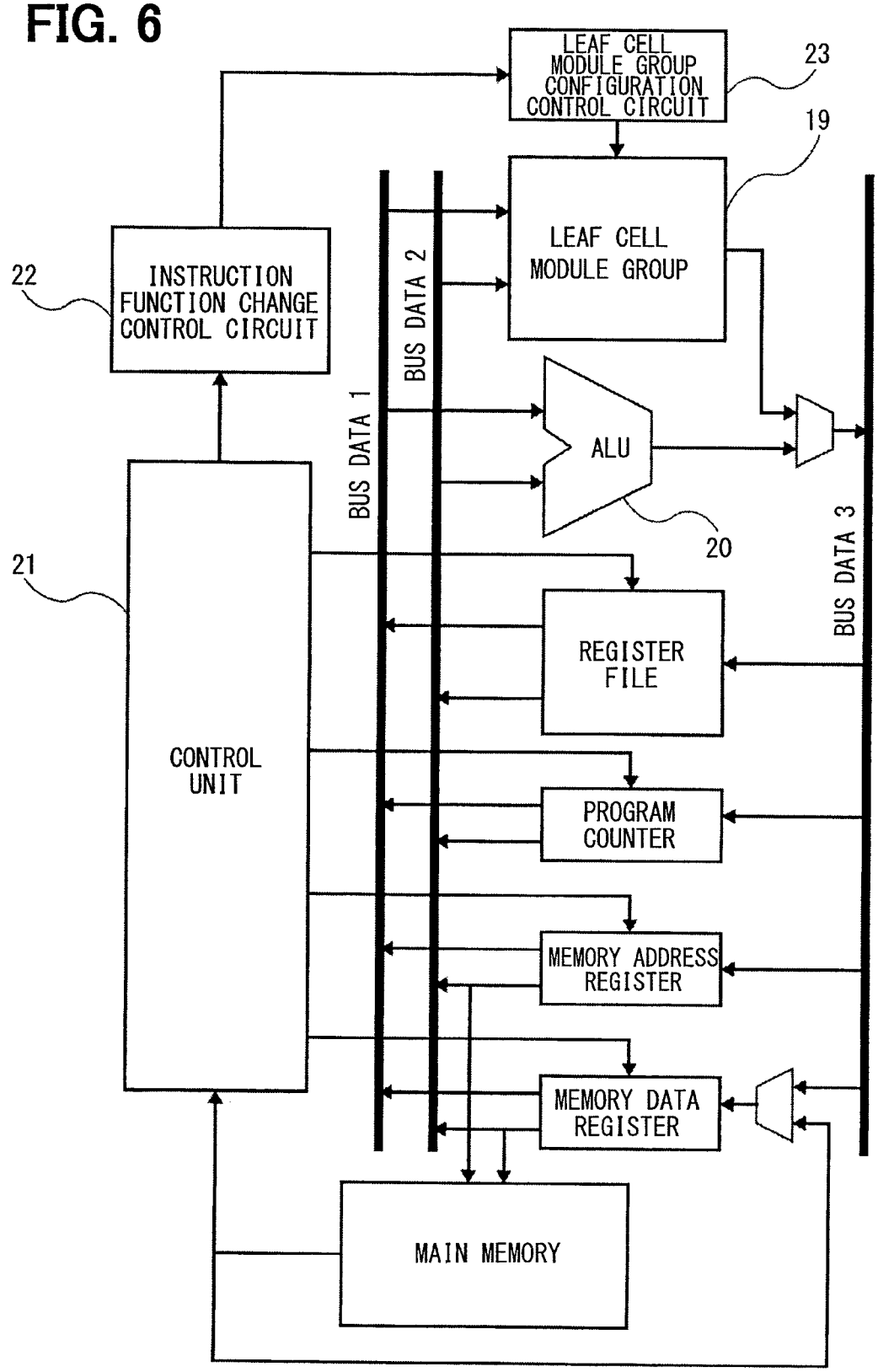
FIG. 6 illustrates architecture of a reconfigurable processor based on the basic invention.

The logic reconfigurable leaf cell module group 19 arranged in the predetermined regularity is applicable to a processor. FIG. 6 shows an example of architecture of a reconfigurable processor, in which the logic reconfigurable leaf cell module 19 is inserted into the data bus of the instruction execution processing circuit of the processor and the information of the memory element 2 for logic configuration arranged in each leaf cell is rewritten, so that a function of an instruction set is changeable. This is a processor architecture having both of the instruction executed by the ALU (Arithmetic Logic Unit) 20 and the instruction set whose function is changeable by the leaf cell module group 14. In this example of the architecture, the instruction function change control circuit 22 generates the function change information and the timing information about the function change in accordance with the instruction decoded by the control unit 21 when it is the function changeable instruction. In accordance with the information, the leaf cell module configuration control circuit 23 reconfigures the logic function of the leaf cell module group 14. Further, a normal instruction, which does not provide function change, is executed by the ALU 20 as usual.

Figure 7:
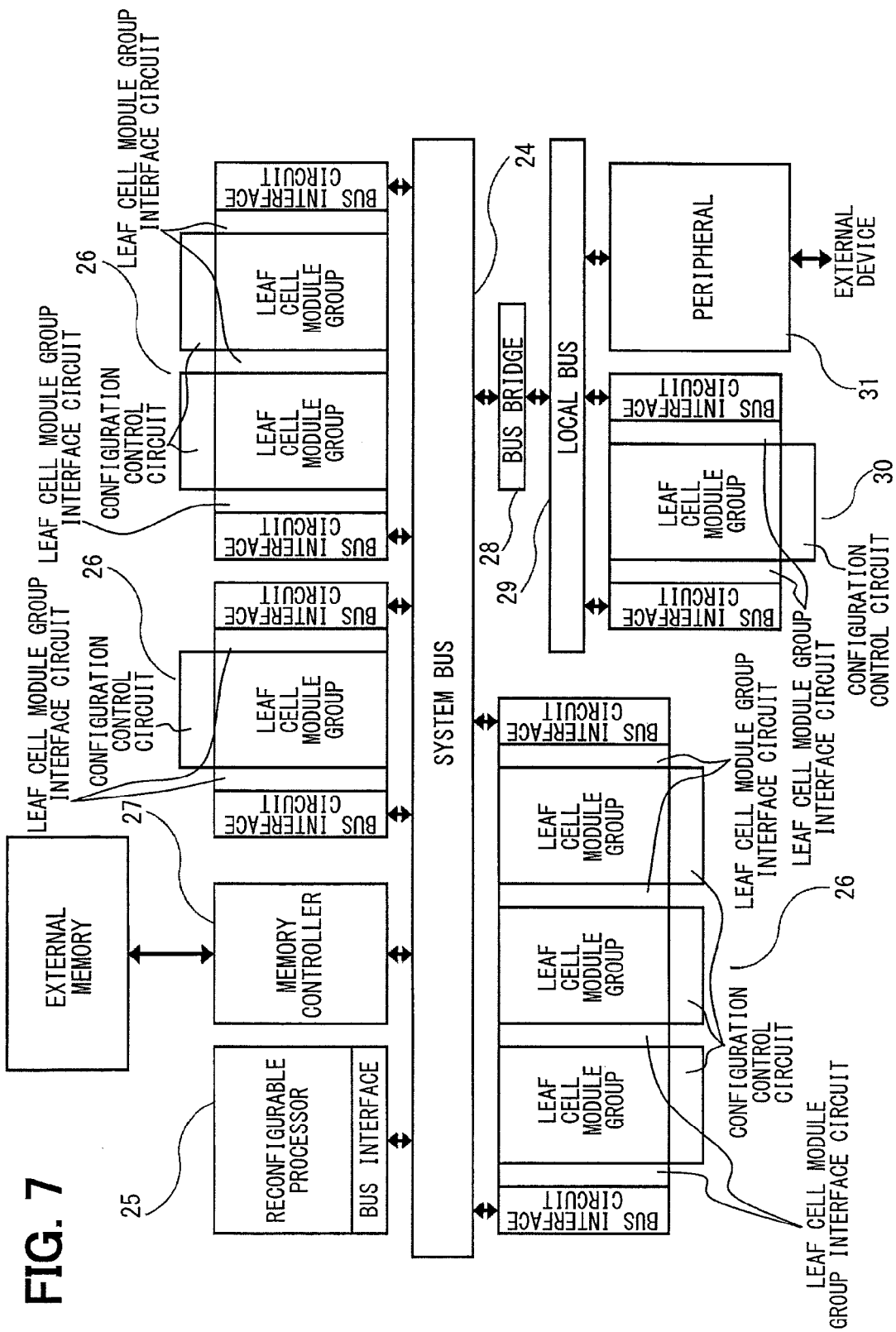
FIG. 7 illustrates an integrated circuit in which a reconfigurable processor and a leaf cell module are connected to a bus.

One or multiple logic reconfigurable leaf cell module groups 14 arranged in the predetermined regularity based on the basic invention is connectable to the system bus or the local bus via the bus interface circuit. One or multiple configurable processors having the function changeable instruction set is connectable to the system bus or the local bus via the bus interface circuit. FIG. 7 shows an example of a system configuration, in which the system bus 24 is connected to the reconfigurable processor 25 having the function changeable instruction set, three complex leaf cell modules 26 and the memory controller 27, and further, the local bus 29 is connected to the logic reconfigurable leaf cell module 30 and the peripheral circuit 31 via a bus bridge 28.

Figure 8:
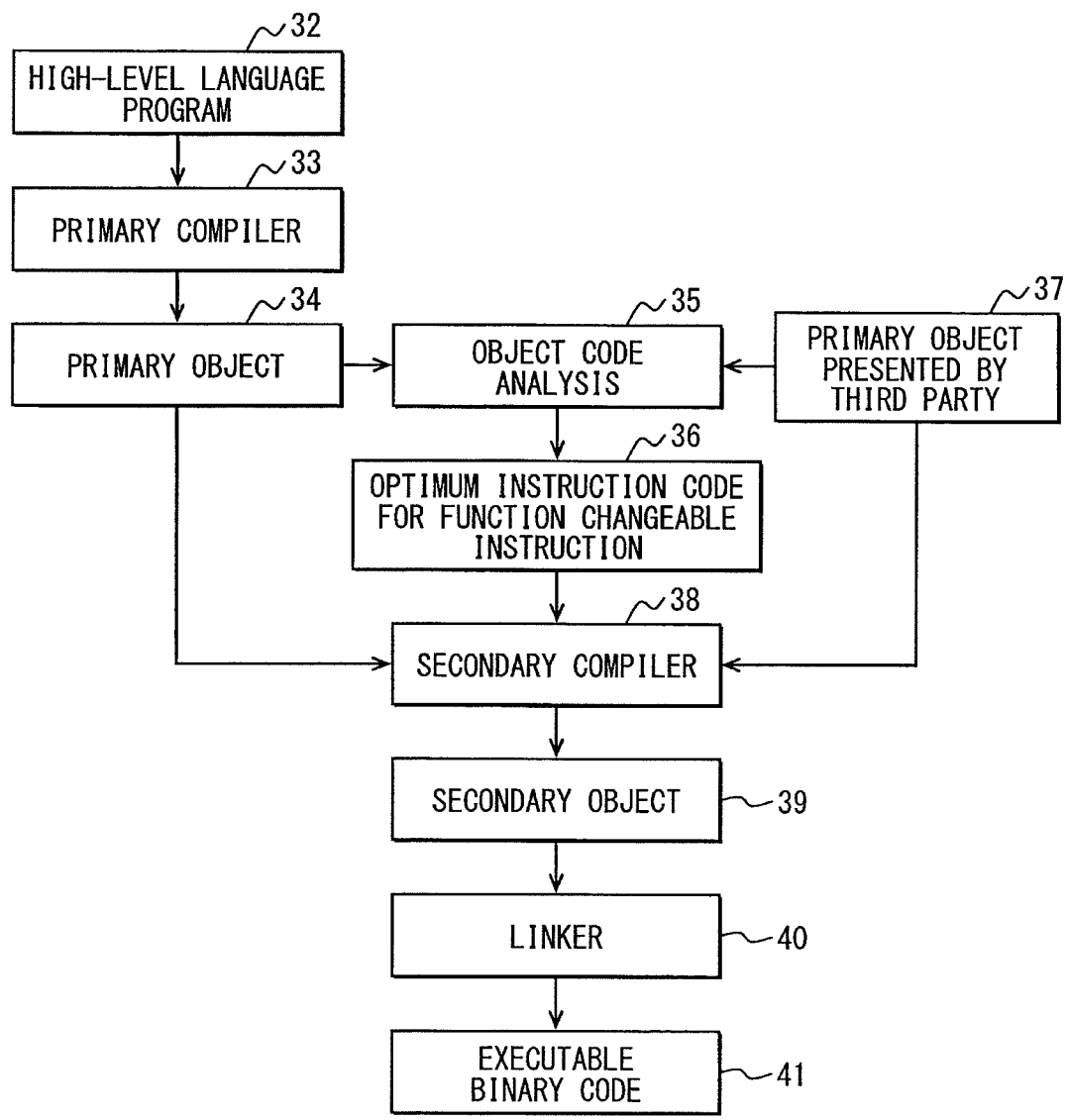
FIG. 8 illustrates a processing flow of a reconfigurable processor based on the basic invention.

FIG. 8 is a flowchart of a compile method of a processor having the function changeable instruction set. A source program code programmed with a high-level computer language 32 such as a C++ computer language and a JAVA language (registered trade mark) is complied by a primary compiler 33, which uses only an instruction set defined as a default of a normal instruction set of the reconfigurable processor or a function changeable instruction set. Thus, a primary object 34 is generated. An object code analysis process 35 is performed to analyze: information about appearance frequency, a function, a combination, an appearance order, and the like of the object codes appeared in the primary object; information about each register of the configurable processor; information about stack; information about a register file; information about a program counter; and information about a pipeline status and the like, so that an optimum instruction code 36 of the function changeable instruction is generated. Alternatively, it is possible to utilize a third party primary object 37 as an input of the object code analysis. By the secondary compiler 38, the optimum instruction code 36 with the optimally-changed function and the primary object 34 or the third party primary object 37 are replaced with an optimum object code having a small number of steps, so that in the optimum object code, the optimum instruction code 36 is used and the function is optimally defined. Further, the secondary compiler 38 executes a relocation of an address, such as a relative jump address, an absolute jump address and a reference data address, corresponding to the address of a code deleted in the replacing process. Thus, the secondary compiler 38 generates a secondary object 39. Finally, the linker 40 links the secondary object 39, so that the executable binary code 41 is generated. Here, the generated secondary object is characterized in that the secondary object has the smaller number of steps in the object code than the primary object. Thus, the throughput of the processor is improved.

Figure 9:
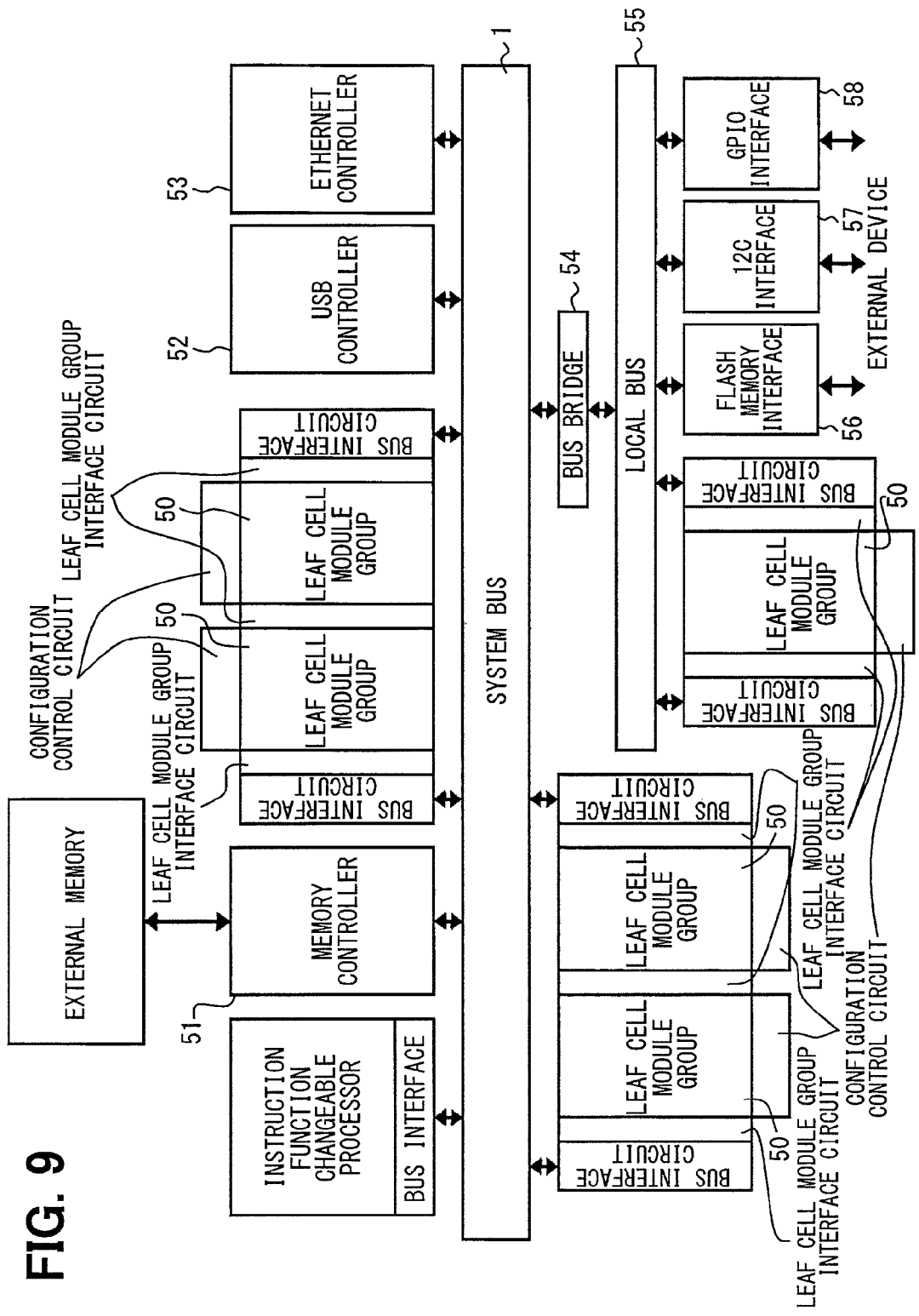
FIG. 9 illustrates a concrete example of an integrated circuit based on the basic invention.

FIG. 9 shows an example of a concrete SoC (System on Chip) based on o the basic invention. In this example, the system bus is connected to one reconfigurable processor having the one function changeable instruction set, two logic configurable leaf cell module groups 50, the memory controller 51, the USB controller 52, and the Ethernet (registered trade mark) controller 53. Further, the logic reconfigurable leaf cell module, the flash memory interface 56 as the peripheral circuit, the I2C interface 57, and the GPIO interface 58 are integrated with the local bus 55 via the bus bridge 54.

1-2 Description of Basic Invention in View of Another Aspect

The basic invention will be explained below in view of another aspect.

The integrated circuit based on the basic invention is an integrated circuit having an array, in which unit cells having a predetermined shape are arranged in a matrix. The unit cell includes a first input terminal, a second input terminal, first and second output terminals, a first logic element block, and a second logic element block. The first input terminal is supplied with a first signal. The second input terminal is supplied with a second signal. The first and second output terminals are disposed at positions opposing the first and second input terminals, respectively. The first logic element block receives the first signal and the second signal, and in accordance with a first configuration information, outputs one of the following signal to the first output terminal: a signal concerning a logic calculation result of the first signal and the second signal; the first signal; a reverse signal of the first signal; the second signal; or a reverse signal of the second signal. The second logic element block receives the first signal and the second signal, and in accordance with a first configuration information, outputs one of the following signals to the second output terminal: a signal concerning a logic calculation result of the first signal and the second signal; the first signal; a reverse signal of the first signal; or the second signal; a reverse signal of the second signal.

It may be preferable that the unit cell further include a first memory element group for storing the first configuration information and a second memory element group for storing the second configuration information.

The first memory element group and the second memory element group are provided by multiple flip-flop circuits. In these flip-flop circuits, it may be preferable to form in a column direction a data wiring group for supplying the first configuration information and the second configuration information. Further, in these flip-flop circuits, it may be preferable to form in a row direction a control signal wiring for latching the first configuration information and the second configuration information.

Preferably, the first logic element block may include four three-input logic gates, and a four-input logic gate, in which the outputs from three-input logic gates are input. The first configuration information, the first signal or the reverse signal of the first signal, and the second signal or the reverse signal of the second signal are input into each three-input logic gate. Preferably, the second logic element block may include four three-input logic gates, and a four-input logic gate, in which the outputs from three-input logic gates are input. The second configuration information, the first signal or the reverse signal of the first signal, and the second signal or the reverse signal of the second signal are input into each three-input logic gate.

Preferably, in the array, the unit cells in a first row may be arranged at predetermined pitches, and the unit cells in a second row adjacent to the first row are arranged at the predetermined pitches and displaced by a half of the pitch with respect to the first row. Thus, the unit cells are arranged in such a manner that the second output terminal of the unit cell in the first row is connected to the first input terminal of the unit cell in the second row, and the first output terminal of the unit cell in the first row is connected to the second input terminal of the unit cell in the second row.

Preferably, in the array, the unit cells may be arranged in N rows. The unit cells in an odd number row (i.e., a first row, a third row, . . . , and a (N−1)-th row) are arranged at predetermined pitches, and the unit cells in an even number row (i.e., a second row, a fourth row, . . . , and N-th row) are arranged at the predetermined pitches and displaced by a half of the pitch. Thus, the unit cells are arranged in such a manner that the second output terminal of the unit cell in the odd number row is connected to the first input terminal of the unit cell in the even number row, and the first output terminal of the unit cell in the odd number row is connected to the second input terminal of the unit cell in the even number row, so that the array has a sub-array. A latch circuit row provided by a latch circuit for latching the output of each unit cell in the N-th row is disposed on one end of the sub-array.

Preferably, the array further may include a feedback wiring for returning the output of the latch circuit to the first input terminal or the second input terminal of the unit cell in the first row.

In the array, the unit cells are arranged in M rows. Further, preferably, the integrated circuit may include: a bus for transferring a data; a first bus interface circuit formed along a first side of the array, and sending the data supplied from the bus to one of or both of the first input terminal and the second input terminal of the unit cell in the first row of the array; and a second bus interface circuit sending the data supplied from one of or both of the first output terminal and the second output terminal of the unit cell in the M-th row of the array to the bus.

Preferably, the integrated circuit may further include a functional block coupled with the bus and having a predetermined function.

The array has the unit cells, which are arranged in M rows. Further, preferably, the integrated circuit may include a first data bus, a second data bus, and a third data bus, which transmit data. The first data bus and the second data bus are used for inputting data. The circuit may further include a logical operation circuit for outputting a logical operation result to the third data bus. One of or both of the first input terminal and the second input terminal of the unit cell in the first row of the array are coupled with the first data bus or the second data bus. One of or both of the first output terminal and the second output terminal of the unit cell in the M-th row of the array are coupled with the third data bus.

Preferably, the integrated circuit may further include a control circuit for reconfiguring the first configuration information and the second configuration information dynamically.

Further, in order to achieve the above object, the basic invention further provides a method of using the integrated circuit.

In the method of using the above described integrated circuit, preferably, the first configuration information may be configured in such a manner that the first logic element block supplies the second signal or the reverse signal of the second signal to the first output terminal, or the second logic element block supplies the first signal or the reverse signal of the first signal to the second output terminal. Thus, the first logic element block or the second logic element block provides substantially the same operation as the wiring arranged along an oblique direction. In the method of using the above described integrated circuit, preferably, the first configuration information and the second configuration information may be reconfigured dynamically.

In the method of using the above described integrated circuit, preferably, the first configuration information and the second configuration information may be configured in such a manner that a failure cell is detected by testing the operation of the unit cell, and the unit cell specified as the failure cell based on the detection is bypassed.

Figures 10, 11, 12:
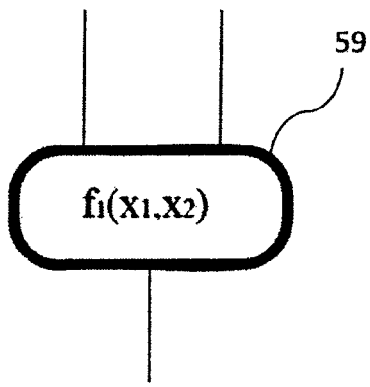
FIG. 10 illustrates a logical expression for illustrating a principle based on the basic invention.
FIG. 11 is a concept diagram of a logic reconfiguration element based on the basic invention.
FIG. 12 is a diagram illustrating a unit cell using two logical expression of FIG. 10.

1-3 Explanation on Mathematical Basis of Basic Invention and Principle of Basic Invention In Boolean algebra, all of logical operations are realized by selecting appropriate $S_0$, $S_1$, $S_2$ and $S_3$ in the logic equation defined in FIG. 10.

FIG. 11 illustrates a model 59 (conceptual diagram) of the logic reconfiguration element, which is logically reconfigurable. In FIG. 11, when receiving the input signal $x_1$ (Input $x_1$) and the input signal $x_2$ (Input $x_2$), the logic reconfiguration element outputs a signal $f_1(x_1, x_2)$ to output any logical operation result. By selecting $S_0=0$, $S_1=1$, $S_2=0$ and $S_3=1$, the logic reconfiguration element provides the output signal $f_1(x_1, x_2)=x_2$. When this selection is performed, the input signal $x_2$ is linked to the output signal, i.e., the output signal $f_1(x_1, x_2)$ as if the input signal $x_2$ is a wiring. In other words, by appropriately selecting $S_0$, $S_1$, $S_2$, and $S_3$, the logic reconfiguration element can function as a wiring.

FIG. 12 shows the unit cell, which outputs two output signals according to two input signals with using two logic equations in FIG. 10. By appropriately selecting $S_{00}$, $S_{01}$, $S_{02}$, $S_{03}$, $S_{10}$, $S_{11}$, $S_{12}$, $S_{13}$, it is possible to realize all of combinations of logical operations.

Figure 13:
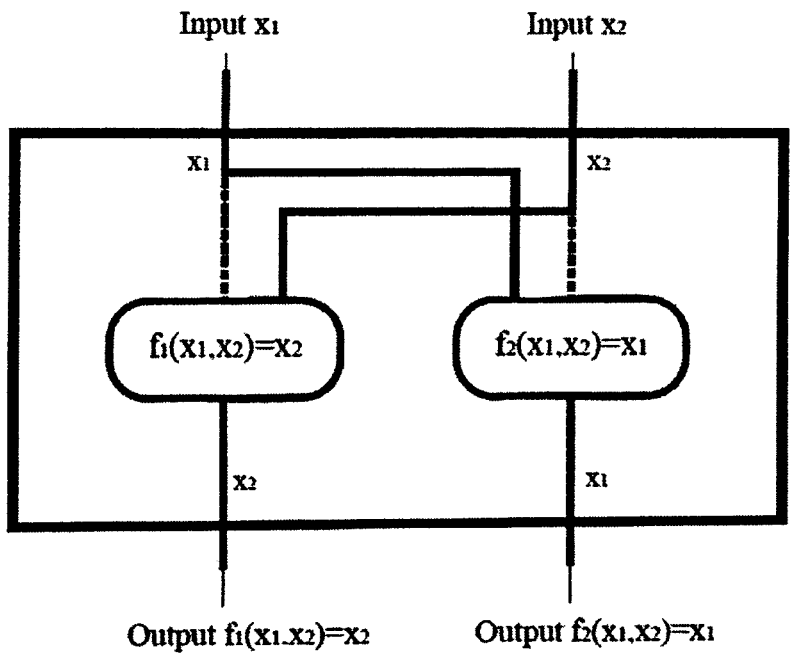
FIG. 13 is a diagram illustrating operation of a unit cell.

As shown in FIG. 13, the unit cell can provide the logical operation for outputting the output signal $f_1(x_1, x_2)$ and the output signal $f_2(x_1, x_2)$ with using two logic reconfiguration elements when the input signal $x_1$ (Input $x_1$) and the input signal $x_2$ (Input $x_2$) are received. Here, when $S_{00}=0$, $S_{01}=1$, $S_{02}=0$, and $S_{03}=1$ are selected, and $S_{10}=0$, $S_{11}=0$, $S_{12}=1$, and $S_{13}=1$ are selected, the output signal $f_1(x_1, x_2)=x_2$ and the output signal $f_2(x_1, x_2)=x_1$ are obtained. When these selections are performed, the input signal $x_2$ is linked to the output signal, i.e., the output signal $f_1(x_1, x_2)$ as if the input signal $x_2$ is a wiring, and the input signal $x_1$ is linked to the output signal, i.e., the output signal $f_2(x_1, x_2)$ as if the input signal $x_1$ is a wiring. In other words, when $S_{00}$, $S_{01}$, $S_{02}$, $S_{03}$, $S_{10}$, $S_{11}$, $S_{12}$, and $S_{13}$ are appropriately selected, the two logic reconfiguration elements can function as cross wirings.

Figure 14:
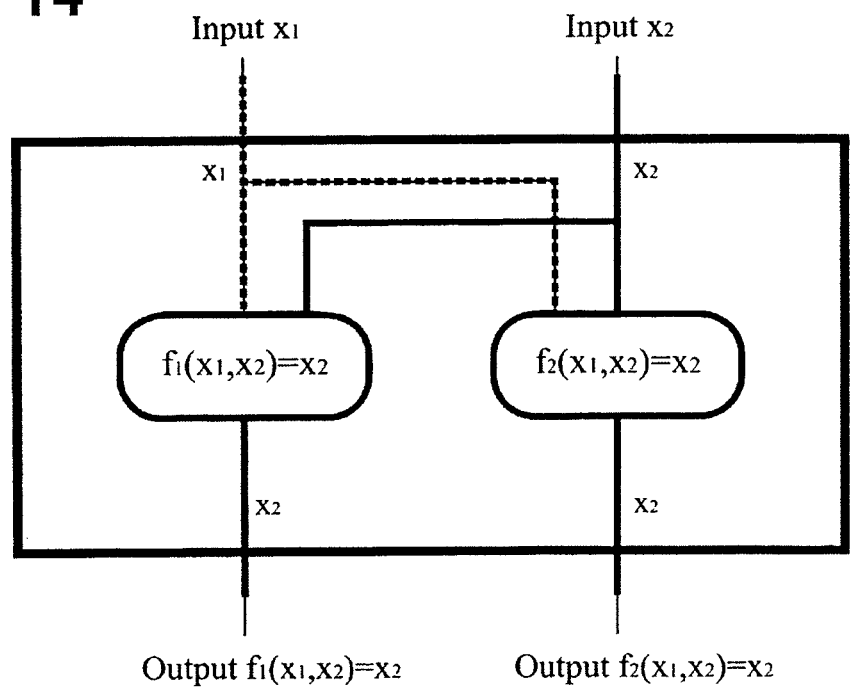
FIG. 14 is a diagram illustrating operation of a unit cell.

FIG. 14 shows an example for obtaining the output signal $f_1(x_1, x_2)=x_2$ and the output signal $f_2(x_1, x_2)=x_1$ with using two logic reconfiguration elements. That is, the unit cells can be provided with a branch function of outputting an output signal $f_2(x_1, x_2)=x_2$ in response to an input signal $x_2$ (Input $x_1$) and outputting an output signal $f_1(x_1, x_2)=x_2$ in response to an input signal $x_2$ (Input $x_2$). This logic can be provided by selecting $S_{00}=0$, $S_{01}=1$, $S_{02}=0$, $S_{03}=1$ and selecting $S_{10}=1$, $S_{11}=1$, $S_{12}=0$, $S_{13}=0$. In other words, by appropriately selecting $S_{00}$, $S_{01}$, $S_{02}$, $S_{03}$, $S_{10}$, $S_{11}$, $S_{12}$, $S_{13}$, the two logic reconfiguration elements can function as a branch wiring of the input signal $x_2$.

Figure 15:
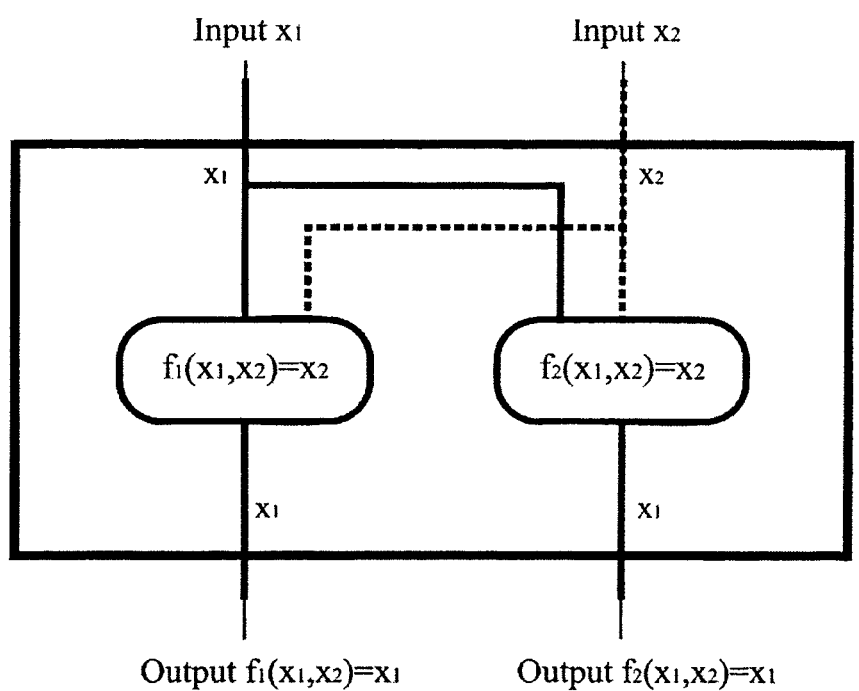
FIG. 15 is a diagram illustrating operation of a unit cell.

FIG. 15 shows an example for obtaining the output signal $f_1(x_1, x_2)=x_1$ and the output signal $f_2(x_1, x_2)=x_1$ with using two logic reconfiguration elements. That is, the unit cells can be provided with a branch function of outputting an output signal $f_2(x_1, x_2)=x_1$ in response to an input signal $x_1$ (Input $x_1$) and outputting an output signal $f_1(x_1, x_2)=x_1$ in response to an input signal $x_1$ (Input $x_2$). This logic can be provided by selecting $S_{00}=0$, $S_{01}=0$, $S_{02}=1$, $S_{03}=1$ and selecting $S_{10}=0$, $S_{11}=0$, $S_{12}=1$, $S_{13}=1$. In other words, by appropriately selecting $S_{00}$, $S_{01}$, $S_{02}$, $S_{03}$, $S_{10}$, $S_{11}$, $S_{12}$, $S_{13}$, the two logic reconfiguration elements can function as a branch wiring of the input signal $x_1$.

Figure 16:
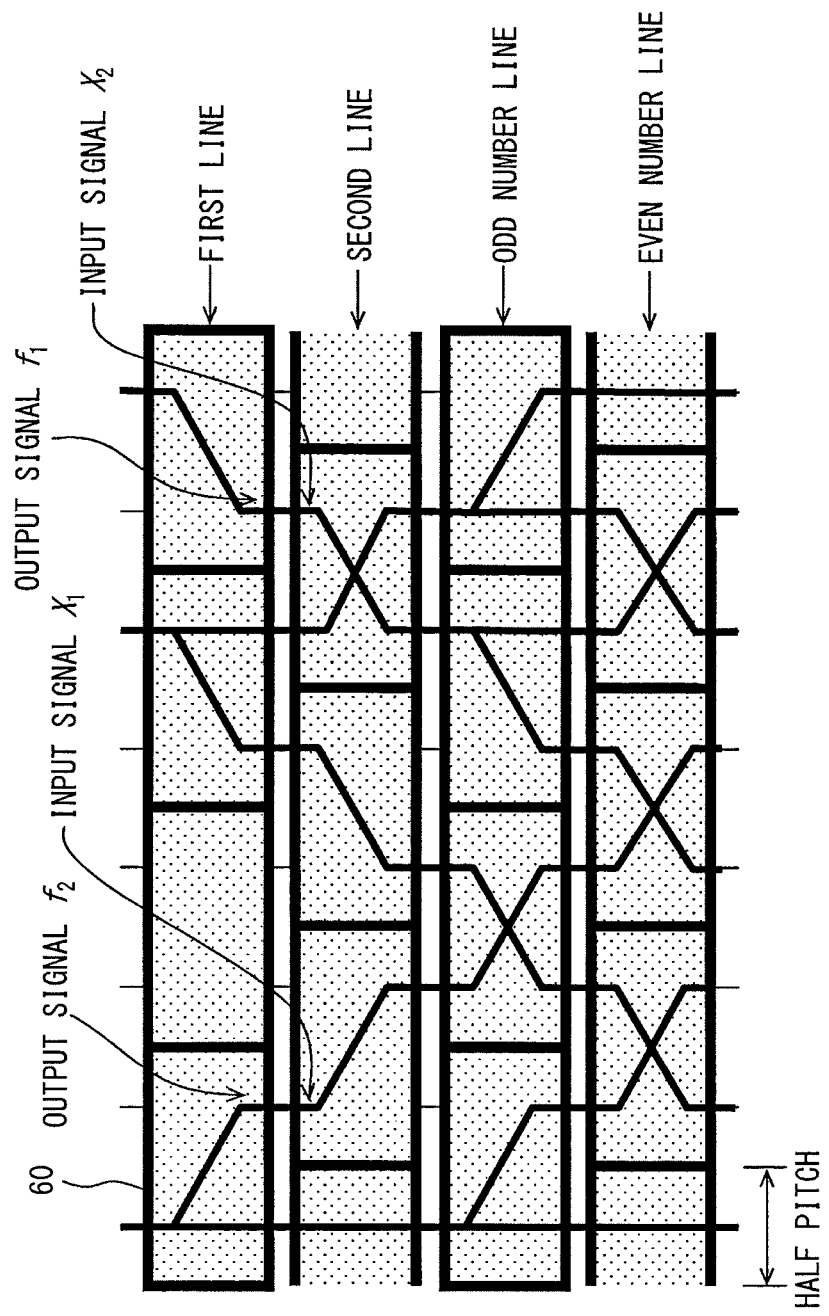
FIG. 16 is a diagram illustrating an array and its function based on the basic invention.

FIG. 16 shows an example in which the unit cells (leaf cells) 60 illustrated in FIG. 12 and FIG. 13 are packed in an array. In this array, the unit cells in the first row and the odd-number-th row are arranged at predetermined pitches (the same pitch) and the unit cells in the second row and the even-number-th row are arranged at the predetermined pitches (the same pitch) by being displaced by half of the pitch.

The output signals $f_2(x_1,x_2)$ of the unit cells in the first row and the odd-number-th row are connected to the input signals $x_1$ of the unit cells in the second row and the even-number-th row, and the output signals $f_1(x_1,x_2)$ of the unit cells in the first row and the odd-number-th row are connected to the input signals $x_2$ of the unit cells in the second row and the even-number-th row.

By configuring in the above way and by appropriately selecting $S_{00}$, $S_{01}$, $S_{02}$, $S_{03}$, $S_{10}$, $S_{11}$, $S_{12}$, $S_{13}$ of the unit cells, the unit cells can function as cross wirings (FIG. 13), a branch wiring (FIG. 14, FIG. 15), a diagonal wiring and the like, so that a signal can be transmitted in a diagonal direction. As a result, a wiring region between unit cells, which is needed in FPGA and the like, can be eliminated. The down sizing can be achieved.

Embodiments 2-1 Configuration of Logic Element Block

Figure 17:
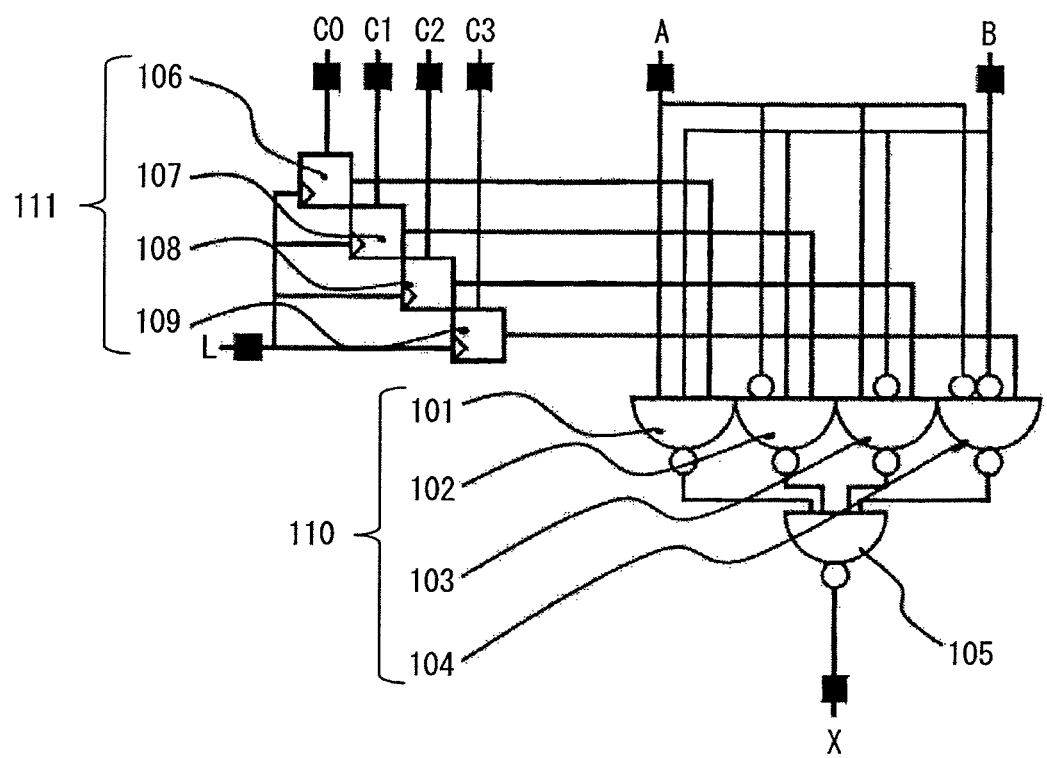
FIG. 17 is a gate level circuit diagram illustrating a logic element block of an embodiment based on the basic invention.

FIG. 17 is a diagram illustrating a gate level circuit structure (i.e., the logic element block) of the above-described logic reconfiguration element and the above-described memory element group. The memory element group stores configuration information for configuring a function of the logic reconfiguration element.

The logic reconfiguration element 110 has four 3-input NAND gates 101, 102, 103 and 104. The logic reconfiguration element 110 further has a four-input NAND gate 105 to which all outputs of the four 3-input NAND gates are inputted.

A logical expression for an output of the logic reconfiguration element 110 is shown in FIG. 17. A terminal X is supplied with an output X based on a logical operation on signals $c_0$, $c_1$, $c_2$, $c_3$, a, b supplied to terminals $C_0$, $C_1$, $C_2$, $C_3$, a terminal A and a terminal B. The signals $c_0$, $c_1$, $c_2$, $c_3$, the signal a, and the signal b correspond to $S_0$, $S_1$, $S_2$, $S_3$, Input $x_1$, and Input $x_2$ illustrated in FIGS. 10-15, respectively.

A group of memory elements 111 (memory elements for determining a logic of the logic reconfiguration element 110) has four flip-flops 106, 107, 108 and 109. At a timing when the control signal supplied to the terminal L transitions from 1 (high level) to 0 (low level), the $c_0$, $c_1$, $c_2$ and $c_3$ (configuration information) being data of the terminals $c_0$, $c_1$, $c_2$ and $c_3$ are fed into the four flip-flops 106, 107, 108 and 109, respectively. The fed data $c_0$, $c_1$, $c_2$ and $c_3$ are transmitted to the logic reconfiguration element 110.

FIG. 18 is a chart illustrating how the logic reconfiguration element performs a logical operation and outputs what data to the output terminal X depending on what combination of the configuration information $c_0$, $c_1$, $c_2$, $c_3$. When the setting information is 0000, the output is always 0. When the setting information is 1000, the output is logical AND between a and b. When the setting information is 0100, the output is logical AND between not a and b. When the setting information is 1100, the output is b (function as a wiring). When the setting information is 0010, the output is a logical AND between a and not b. When the setting information is 1010, the output is a (function as a wiring). When the setting information is 0110, the output is logical XOR between a and b. When the setting information is 1110, the output is logical OR between a and b. When the setting information is 0001, the output is logical NOR between a and b. When the setting information is 0001, the output is logical NOR between a and b. When the setting information is 0101, the output is not a. When the setting information is 1101, the output is logical OR between not a and b. When the setting information is 0011, the output is not b. When the setting information is 1011, the output is logical OR between a and not b. When the setting information is 0111, the output is logical NAND between a and b. When the setting information is 1111, the outout is always 1.

2-2 Unit Cell Structure

Figure 19:
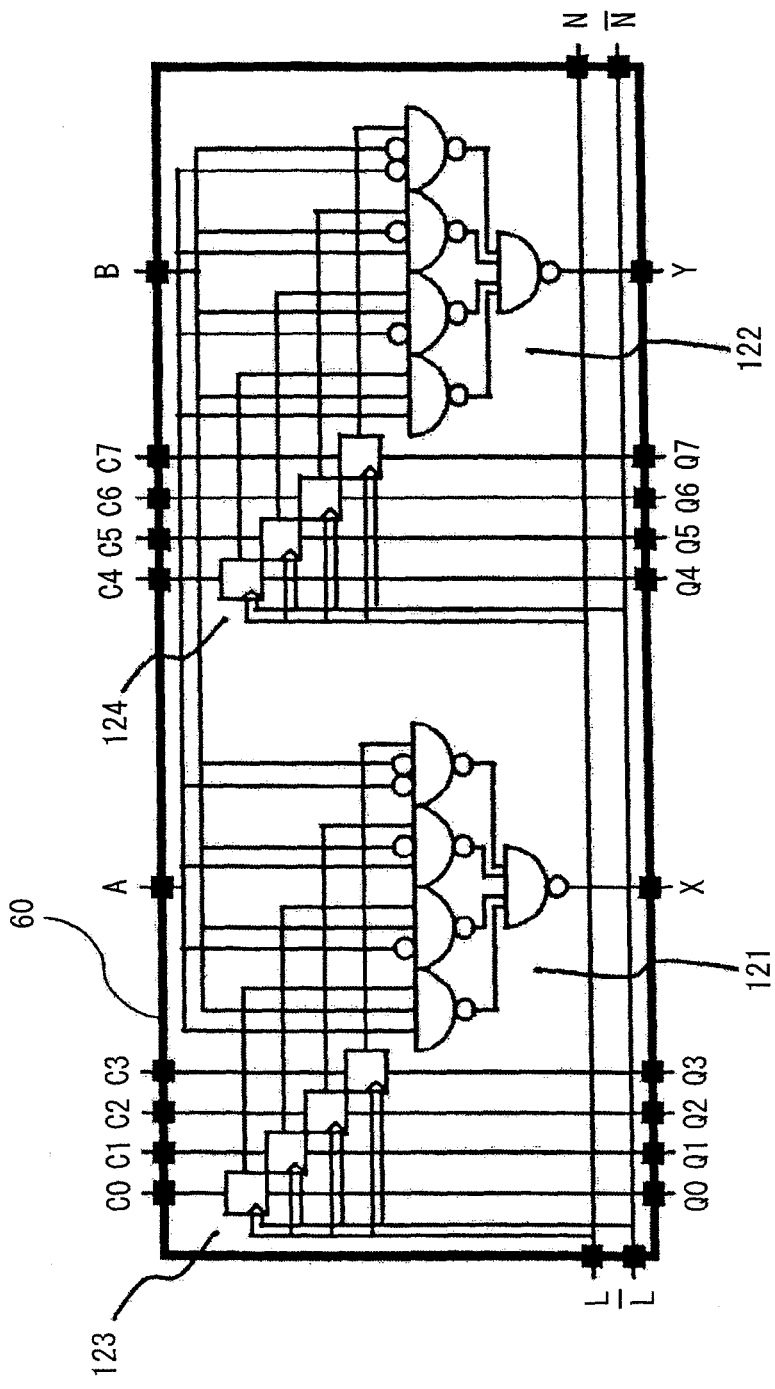
FIG. 19 is a gate level circuit diagram illustrating a unit cell of an embodiment based on the basic invention.

FIG. 19 is a gate level circuit diagram of a unit cell (leaf cell) 60.

The unit cell 60 has two logic reconfiguration elements 121 and 122 and memory element groups 123 and 124 (memory elements for determining logics of the logic reconfiguration elements 121 and 122).

Each logic reconfiguration element 121, 122 has four 3-input NAND gates which are similar to those illustrated in FIG. 17, and a four-input NAND gate 105 to which all outputs of the four 3-input NAND gates are inputted.

The logic reconfiguration element 121 supplies a terminal X with an output X based on a logical operation on signals $c_0$, $c_1$, $c_2$, $c_3$, a, b, which are supplied to terminals $C_0$, $C_1$, $C_2$, $C_3$, a terminal A and a terminal B.

The memory element group 123 has four flip-flops. In timing when the control signal supplied to the terminal L transitions from 1 (high level) to 0 (low level) and the control signal supplied to the terminal /L transitions from 0 to 1, the $c_0$, c1, $c_2$ and $c_3$ (configuration information) being data of the terminals $C_0$, $C_1$, $C_2$ and $C_3$ are fed into the four flip-flops 106, 107, 108 and 109, respectively. The fed data $c_0$, $c_1$, $c_2$ and $c_3$ are transmitted to the logic reconfiguration element 121.

The logic reconfiguration element 122 supplies a terminal Y with an output y based on a logical operation on signals $c_4$, $c_5$, $c_6$, $c_7$, a, b, which are supplied to terminals $C_4$, $C_5$, $C_6$, $C_7$, a terminal A and a terminal B.

The memory element group 124 has four flip-flops. In timing when the control signal supplied to the terminal L transitions from 1 (high level) to 0 (low level) and the control signal supplied to the terminal /L transitions from 0 to 1, the $c_4$, $c_5$, $c_6$ and $c_7$ (configuration information) being data of the terminals $C_4$, $C_5$, $C_6$ and $C_7$ are fed into the four flip-flops, respectively (in this regard, differs from the circuit of FIG. 1). The fed data $c_4$, $c_5$, $c_6$ and $c_7$ are transmitted to the logic reconfiguration element 122.

The terminals $C_0$, $C_1$, $C_2$, $C_3$ are connected to the terminals $Q_0$, $Q_1$, $Q_2$, $Q_3$ through wirings which penetrate the unit cell 60 from up to down. These terminals $Q_0$, $Q_1$, $Q_2$, $Q_3$ are connected to the terminals $C_4$, $C_5$, $C_6$, $C_7$ of the unit cell 60 in a next row not shown.

The terminals $C_4$, $C_5$, $C_6$, $C_7$ are connected to the terminals $Q_0$, $Q_1$, $Q_2$, $Q_3$ through wirings penetrating the unit cell 60 from up to down. These terminals $Q_4$, $Q_5$, $Q_6$, $Q_7$ are connected to the terminals $C_0$, $C_1$, $C_2$, $C_3$ of the unit cell 60 in a next row not shown.

The terminal L and the terminal /L, respectively, are connected to a terminal N and a terminal /N via wirings penetrating the unit cell 60 from left to right. These terminal N and terminal /N, respectively, are connected to a terminal L and a terminal /L in an adjacent unit cell, not shown, on a right side in the same row A layout of the unit cell 60 is appropriately rectangular with a longer side in a lateral direction. Along the upper side of the rectangle, the terminals $C_0$, $C_1$, $C_2$, $C_3$, A, $C_4$, $C_5$, $C_6$, $C_7$, B are arranged. Along the lower side, the terminals $Q_0$, $Q_1$, $Q_2$, $Q_3$, X, $Q_4$, $Q_5$, $Q_6$, $Q_7$, Y are arranged. Along the left side, the terminals L and /L are arranged. Along the right side, the terminal N and /N are arranged.

Figure 20:
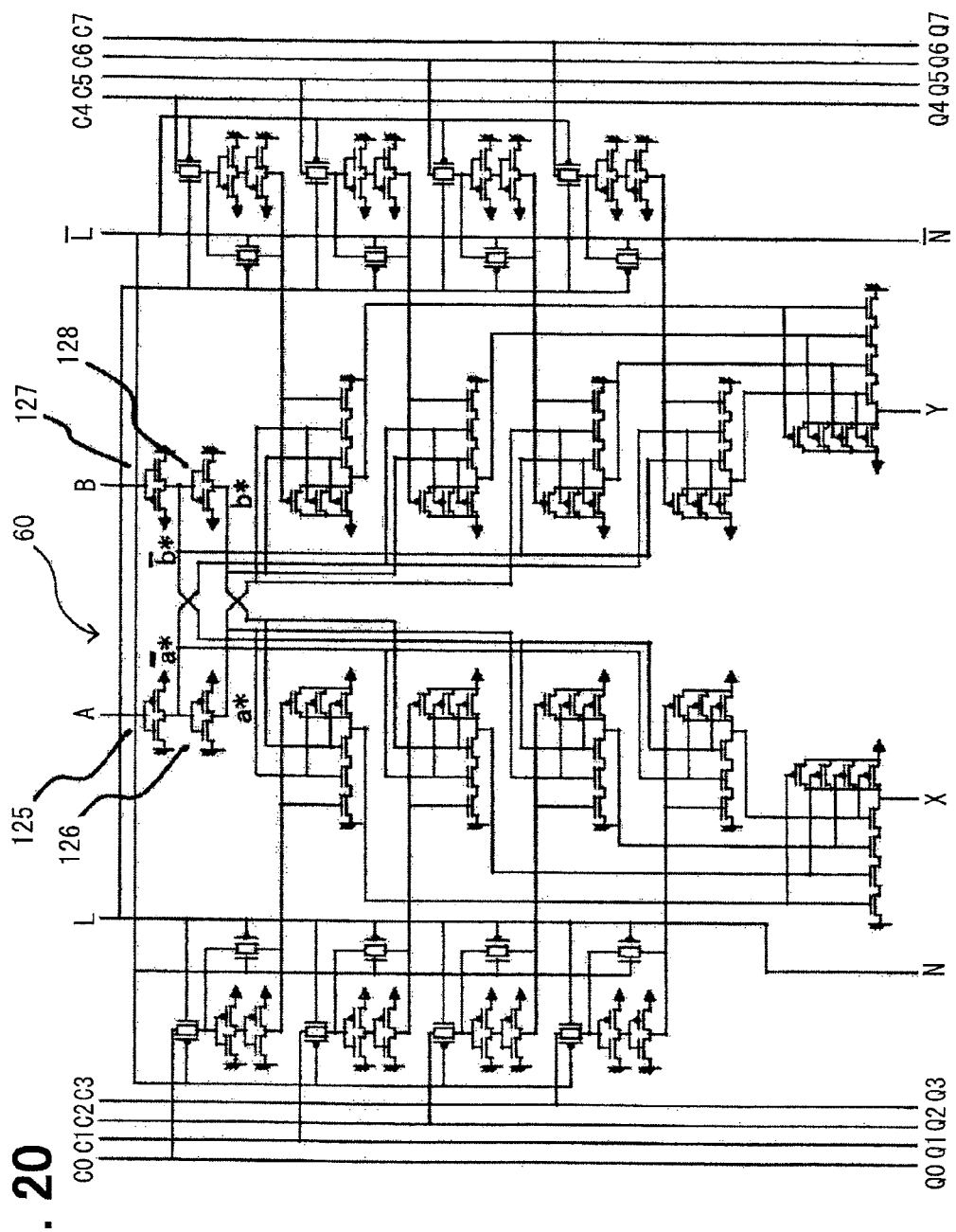
FIG. 20 is a transistor level circuit diagram illustrating a unit cell of an embodiment based on the basic invention.

FIG. 20 is a circuit diagram illustrating the unit cell 60 of FIG. 19 at a transistor level. The terminal A is connected to an inverter 125 and an inverter 126. The terminal B is connected to an inverter 127 and an inverter 128. The inverter 125 generates a signal /a*, which is a reversed signal of a signal a supplied to the terminal A. The inverter 126 generates a signal a*, which has the same phase as the signal a and is an amplified signal of the signal a. The inverter 127 generates a signal /b*, which is a reversed signal of a signal b supplied to the terminal B. The inverter 128 generates a signal a*, which has the same phase as the signal b and is an amplified signal of the signal b. The signals /a*, a*, /b*, b* are selectively inputted to many 3-input NAND gates.

2-3 Array Structure

Figure 21:
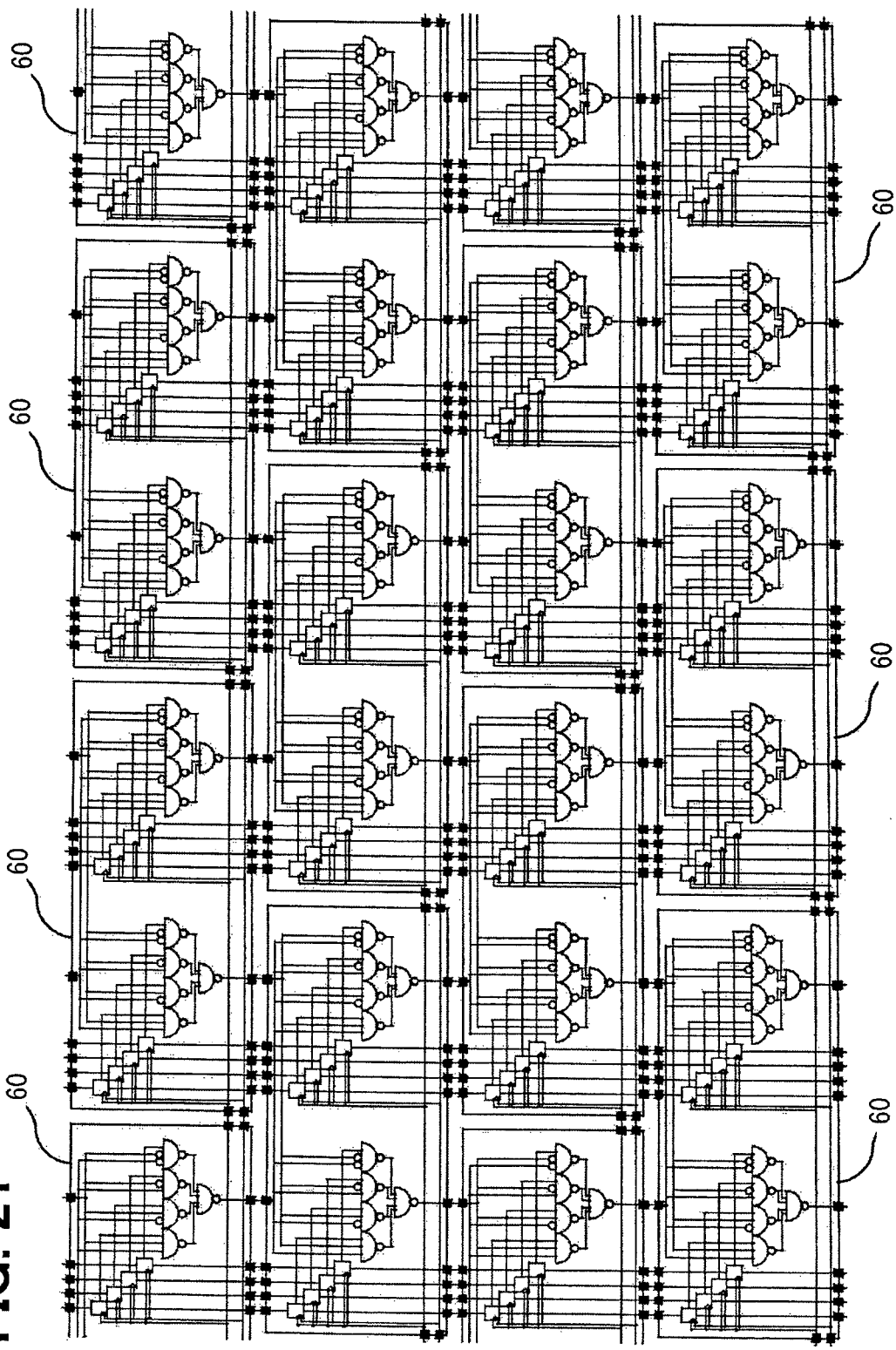
FIG. 21 is a gate level circuit diagram illustrating an array of an embodiment based on the basic invention.

FIG. 21 is a gate level circuit diagram of the array, in which the unit cells in FIG. 20 are arranged in a matrix while shifting the cells by a half of a pitch on a row-basis, as shown in FIG. 16. This structure provides a large variety of combination logic circuits. Since the wiring in the oblique direction is realized by the logic element block, a wiring region and a connection region such as ones provided in a conventional art can be eliminated or minimized, so that a small reconfigurable circuit can be obtained. In the present disclosure, the minimization of the wiring region and the connection region refers to making a particular wiring shortest in order to provide a circuit structure (integrated circuit) that does not a relatively large wiring region to connect between the logic reconfiguration elements, where the particular wiring is a wiring needed to arrange the unit cells 60 adjacent to each other and connects their terminals.

Figure 22:
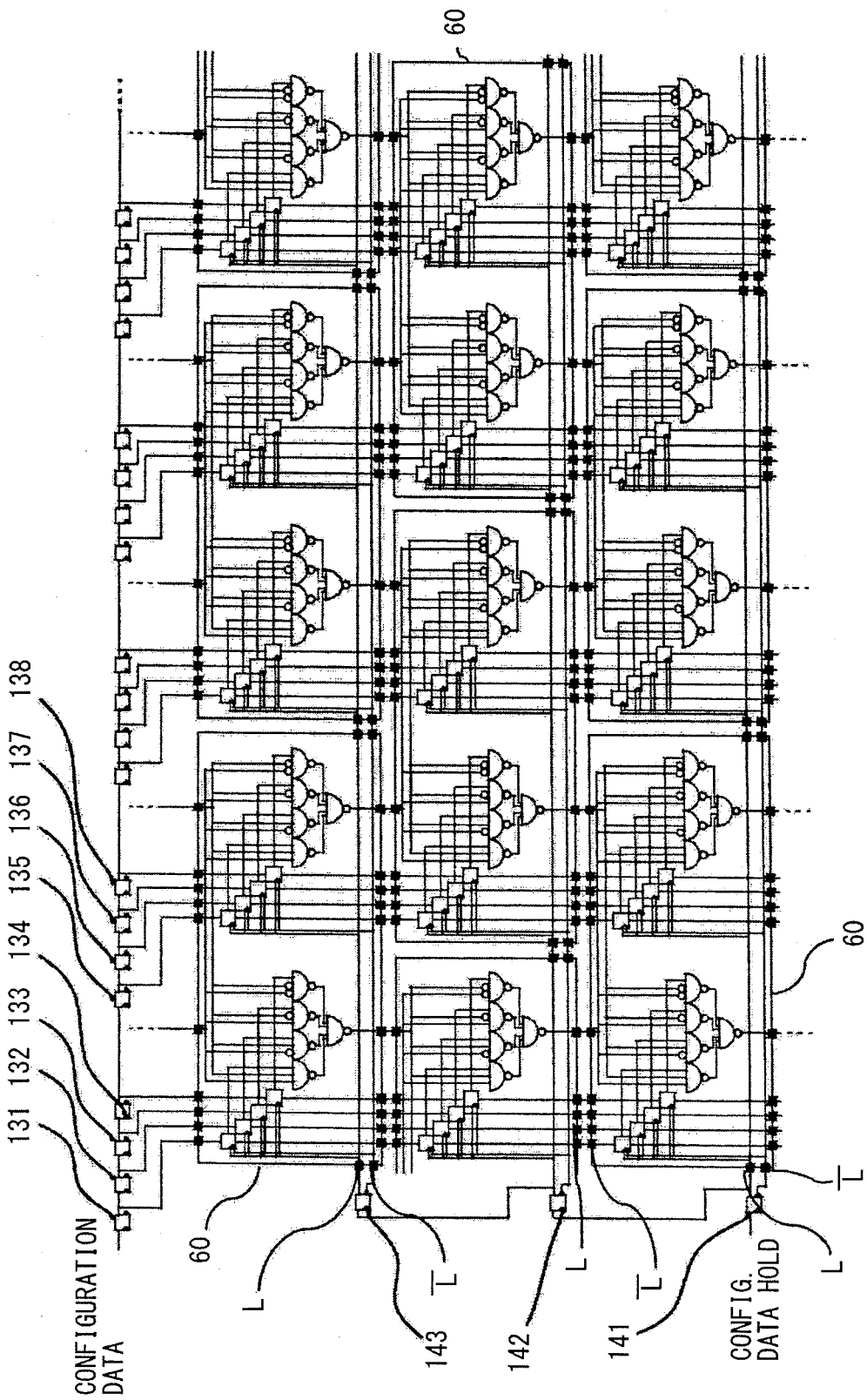
FIG. 22 is a gate level circuit diagram illustrating an array of an embodiment based on the basic invention.

FIG. 22 illustrates a circuit for supplying each unit cell 60 with the configuration information $c_0$, c1, $c_2$, $c_3$, $c_4$, $c_5$, $c_6$, $c_7$ for determining logic of the logic reconfiguration element.

Flip-flops corresponding to the terminals $C_0$, $C_1$, $C_2$, $C_3$, $C_4$, $C_5$, $C_6$, $C_7$ are formed. These flip-flop circuits 131-138 provide a shift register. The configuration information of the logic reconfiguration element is supplied from the left end CD (i.e., configuration data) terminal serially. The data shift is performed by toggling the control signal to be supplied to the clock signal terminal not shown in the drawings. The data shift is performed by toggling (repeating supplying a clock signal from 0 to 1 and from 1 to 0) the control signal supplied to the clock signal terminal not shown.

Further, flip-flop circuits 141, 142, 143 . . . are formed to correspond to the terminals L, /L in each row. These flip-flop circuits 141, 142, 143 . . . provide shift registers. From the left end CDH (configuration date hold) terminal, a configuration data hold signal is transferred to the flip-flop circuits 141, 142, 143 . . . in turn from down to up. Thereby, first, the logic of the unit cell 60 in the bottom row in the leaf cell module illustrated in the drawing is configured. Next, the logic of the unit cell 60 in the second row from the bottom is configured. Then, the logic of the unit cell 60 in the next upper row is configured. This operation is performed for all rows of the unit cells 60 arranged in the leaf cell module (FIG. 22 illustrates only three rows). This operation will be more specifically described below. In the circuit structure of FIG. 22, the shift registers 141, 142, 143 . . . are set or reset first, so that the latch circuits (memory elements) of all logic element bocks become a through-state. Next, the configuration information is serially inputted from the CD terminal to the shift registers 131, 132, 133, 134, 135, 136, 137, 138 . . . to shift these shift registers 131, 132, 133, 134, 135, 136, 137, 138, so that the configuration information is set in the logic configuration memories in each row Then, by applying the data hold signal (1 or 0) to the CDH terminal, the logic of the row of the unit cell illustrated as the bottom row in the drawing is configured. Then, by again inputting the clock signal to the shift registers 141, 142, 143 . . . , the cycle number corresponding to the number of shift registers, the configuration information for the unit cells 60 in the next upper row is set. This operation for configuring the logic of the unit cells 60 in the row is repeatedly performed after the latch circuits of all logic element blocks are placed in the through-state as described above. Thereby, the logic of the logic reconfiguration element is determined on a row-by-row-basis from the illustrated bottom row to the upper low to finally fix the logics of all logic reconfiguration elements. In this way, the reconfiguration of the logic elements is performed. The operation for fixing the logics of all logic reconfiguration elements can be performed in such a manner that by changing a shift direction of a sequential circuit of the configuration circuit of FIG. 22, the logic of the logic reconfiguration element is determined on a row-by-row-basis from the top row to the lower row to finally fix the logics of all logic reconfiguration elements 2-4 Modifications of Unit Cell and Array FIG. 23 is a gate level circuit diagram of a unit cell (leaf cell) 61 of a modification.

A difference from the circuit in FIG. 19 is that the terminals for supplying the signals $c_0$, c1, $c_2$, $c_3$ include the terminals $C_0$, $/C_0$, $C_1$, $/C_1$, $C_2$, $/C_2$, $C_3$, $/C_3$, so that a complementary signal is supplied. Further, the terminals for supplying the signals $c_4$, $c_5$, $c_6$, $c_7$ include the terminals $C_4$, $/C_4$, $C_5$, $/C_5$, $C_6$, $/C_6$, $C_7/C_7$, so that a complementary signal is supplied.

Figure 23:
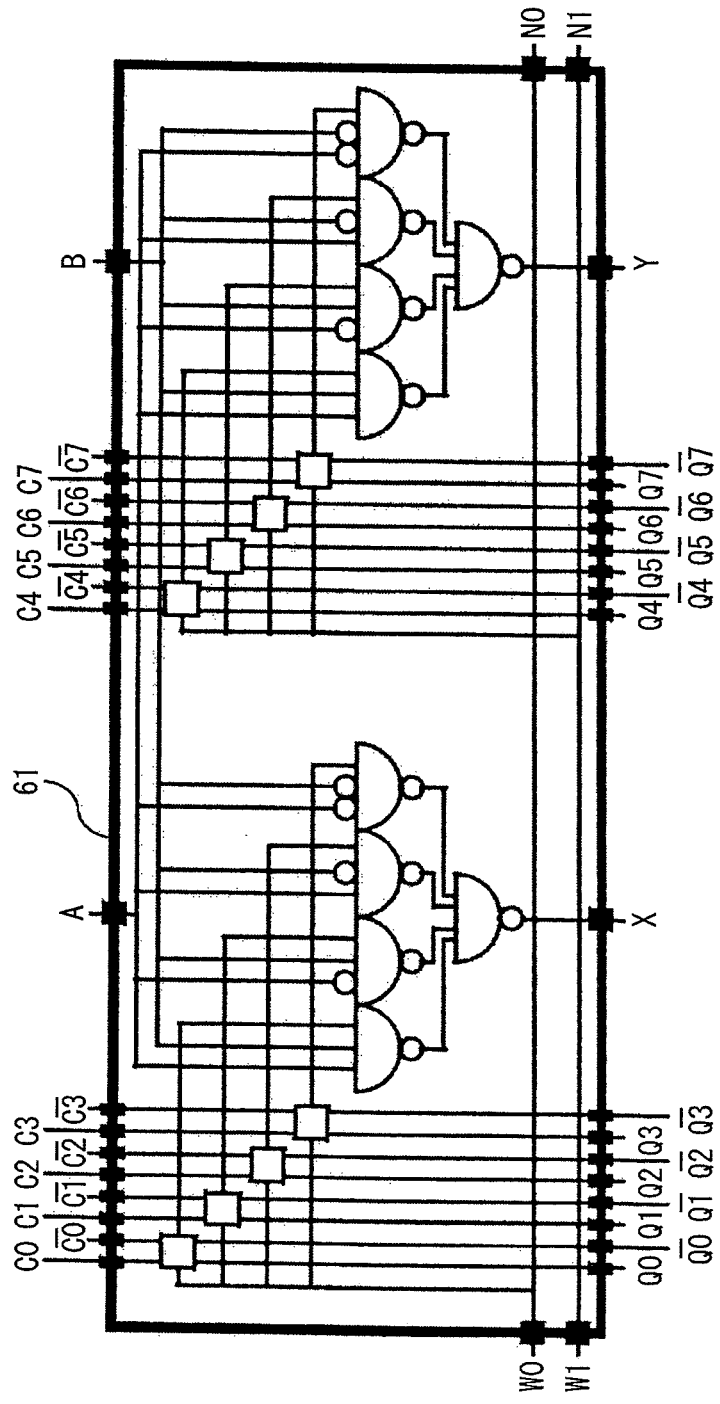
FIG. 23 is a gate level circuit diagram illustrating a unit cell of a modification based on the basic invention.
Figure 24:
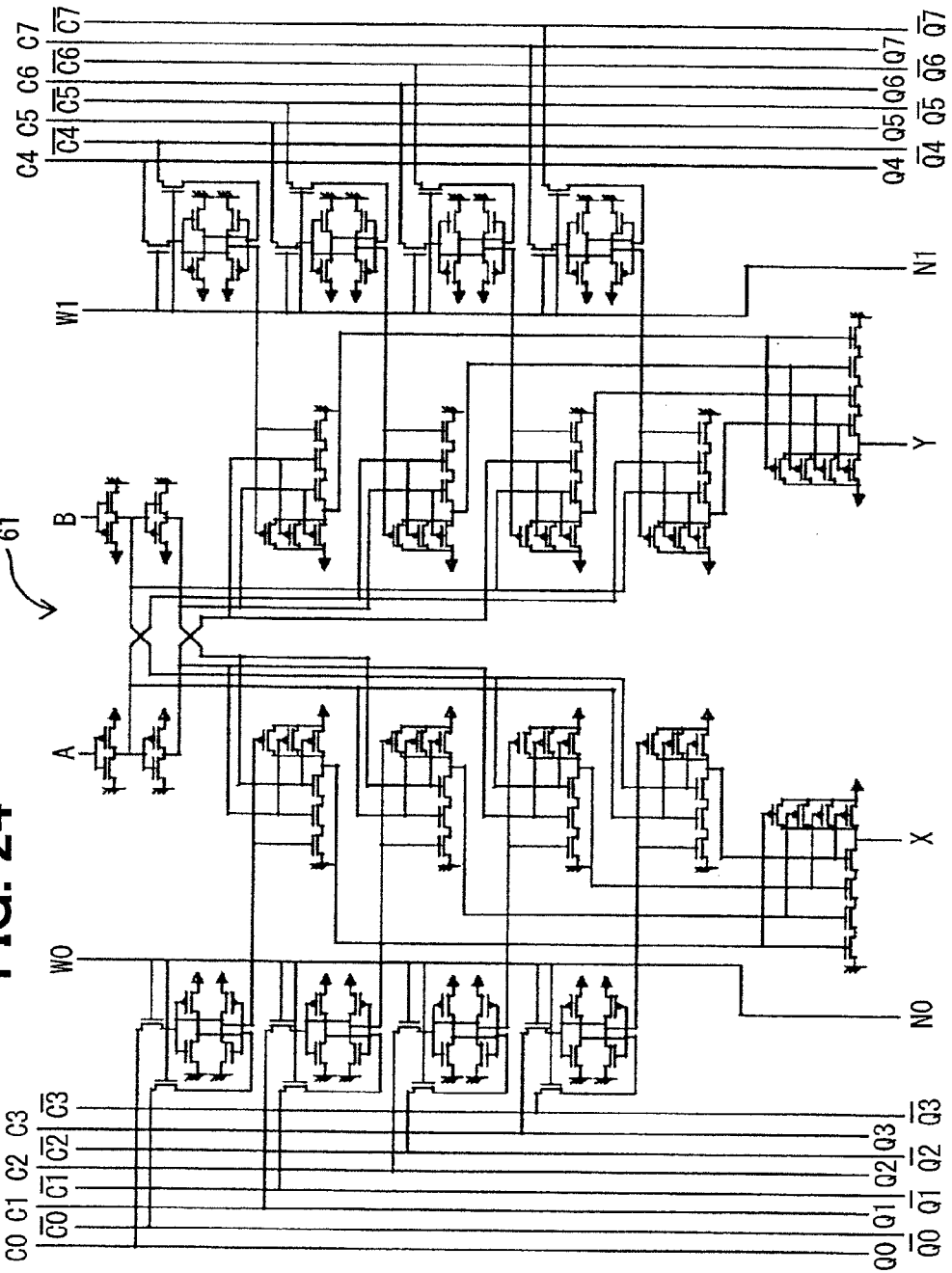
FIG. 24 is a transistor level circuit diagram illustrating a unit cell of a modification based on the basic invention.

FIG. 24 is a circuit diagram illustrating the unit cell 61 of FIG. 23 at a transistor level. When the configuration information is supplied with using the complementary signal, the number of transistors (Tr) in the flip-flop circuit is reduced.

Figure 25:
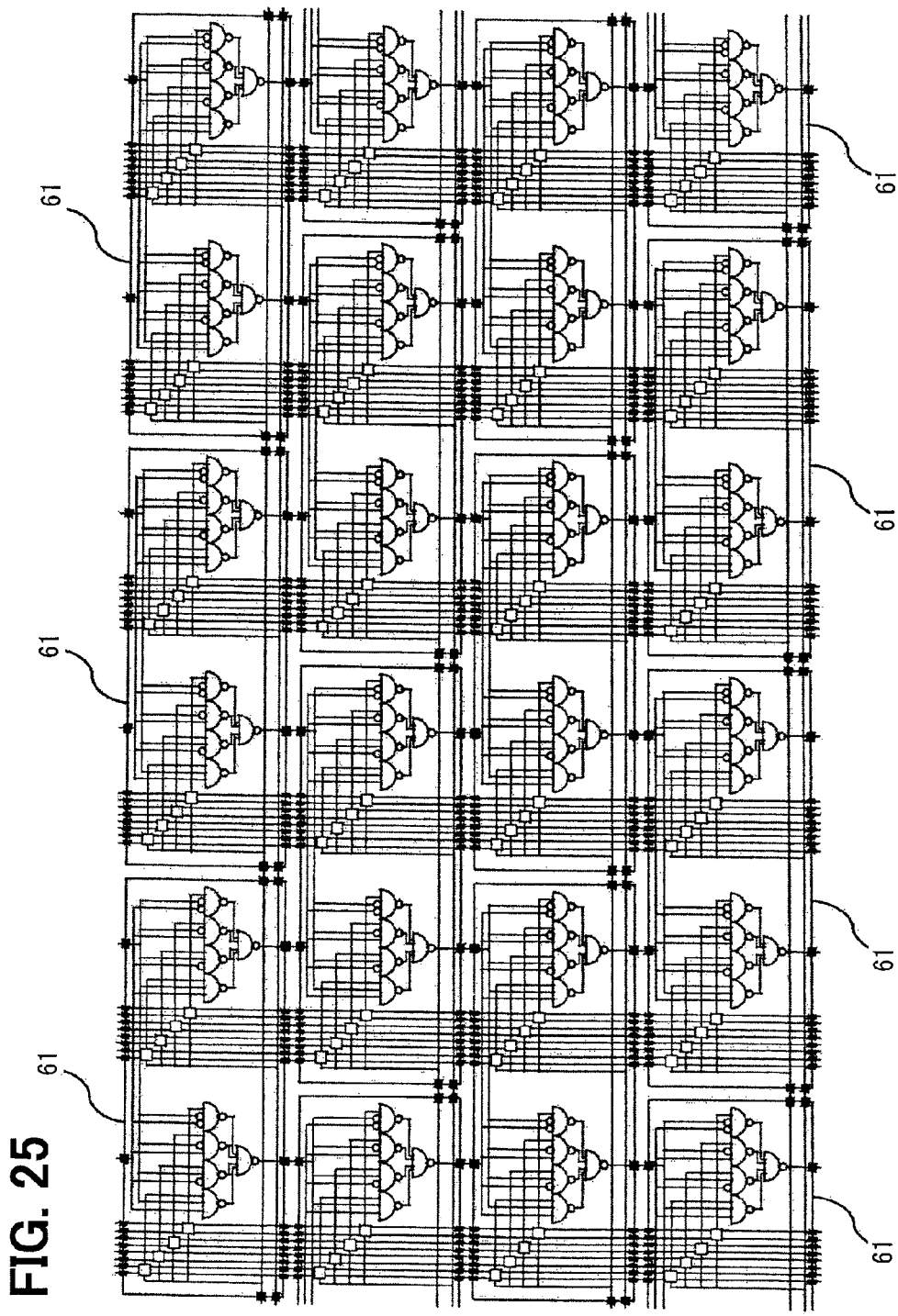
FIG. 25 is a gate level circuit diagram illustrating an array of a modification based on the basic invention.

FIG. 25 is a transistor level circuit diagram of the array, in which the unit cells 61 of FIG. 23 are arranged in a matrix while shifting the unit cells by a half of the pitch in an row-basis.

Figure 26:
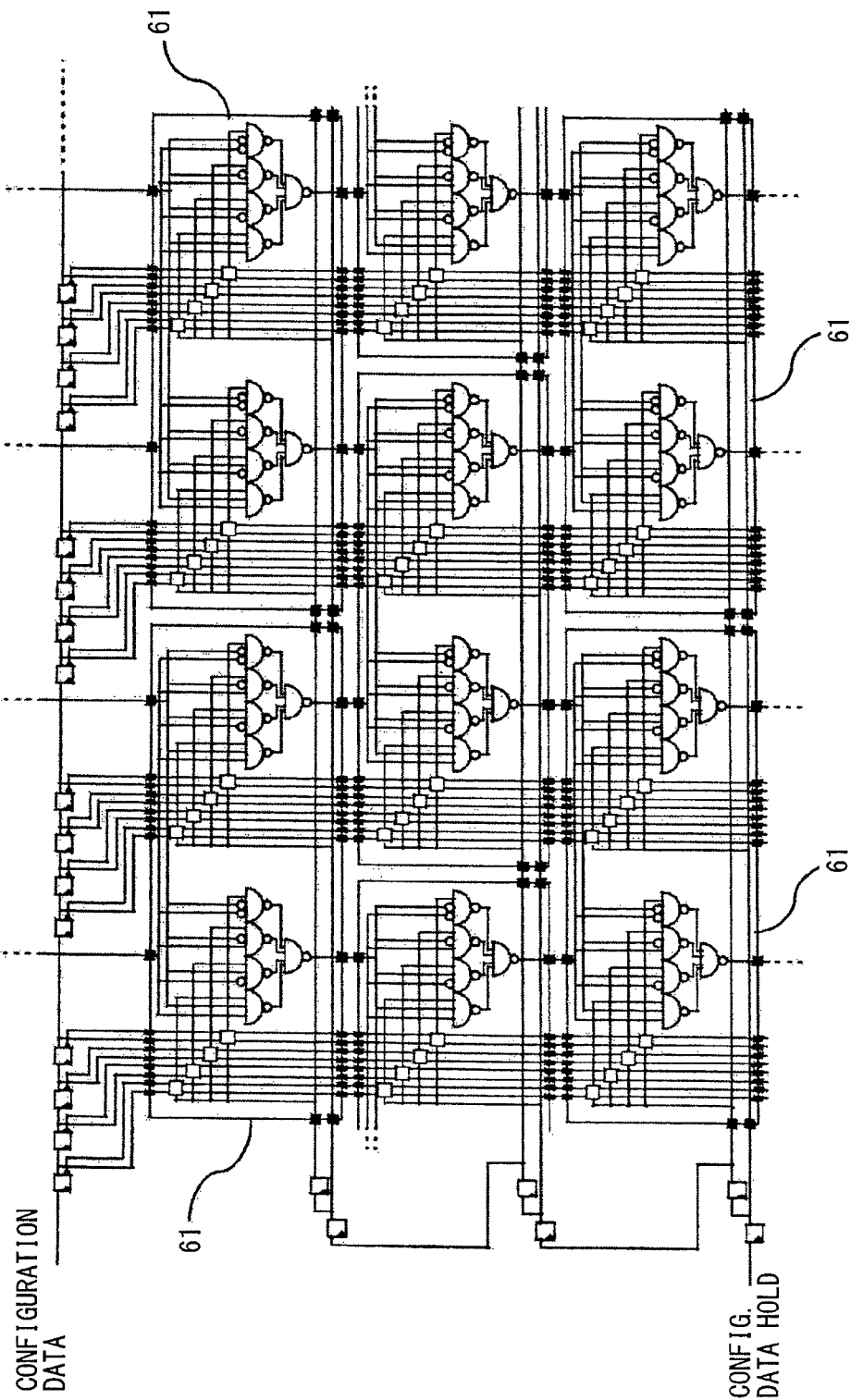
FIG. 26 is a gate level circuit diagram illustrating an array of a modification based on the basic invention.

FIG. 26 illustrates a gate level circuit for supplying the configuration information $c_0$, $/c_0$, $c_1$, $/c_2$, $c_3$, $/c_3$, $c_4$, $/c_4$, $C_5$, $/c_5$, $c_6$, $/c_6$, $C_7$, $/c_7$ to each unit cell 61 of FIG. 23. The complementary outputs of the flip-flop circuits are supplied, respectively.

Figure 27:
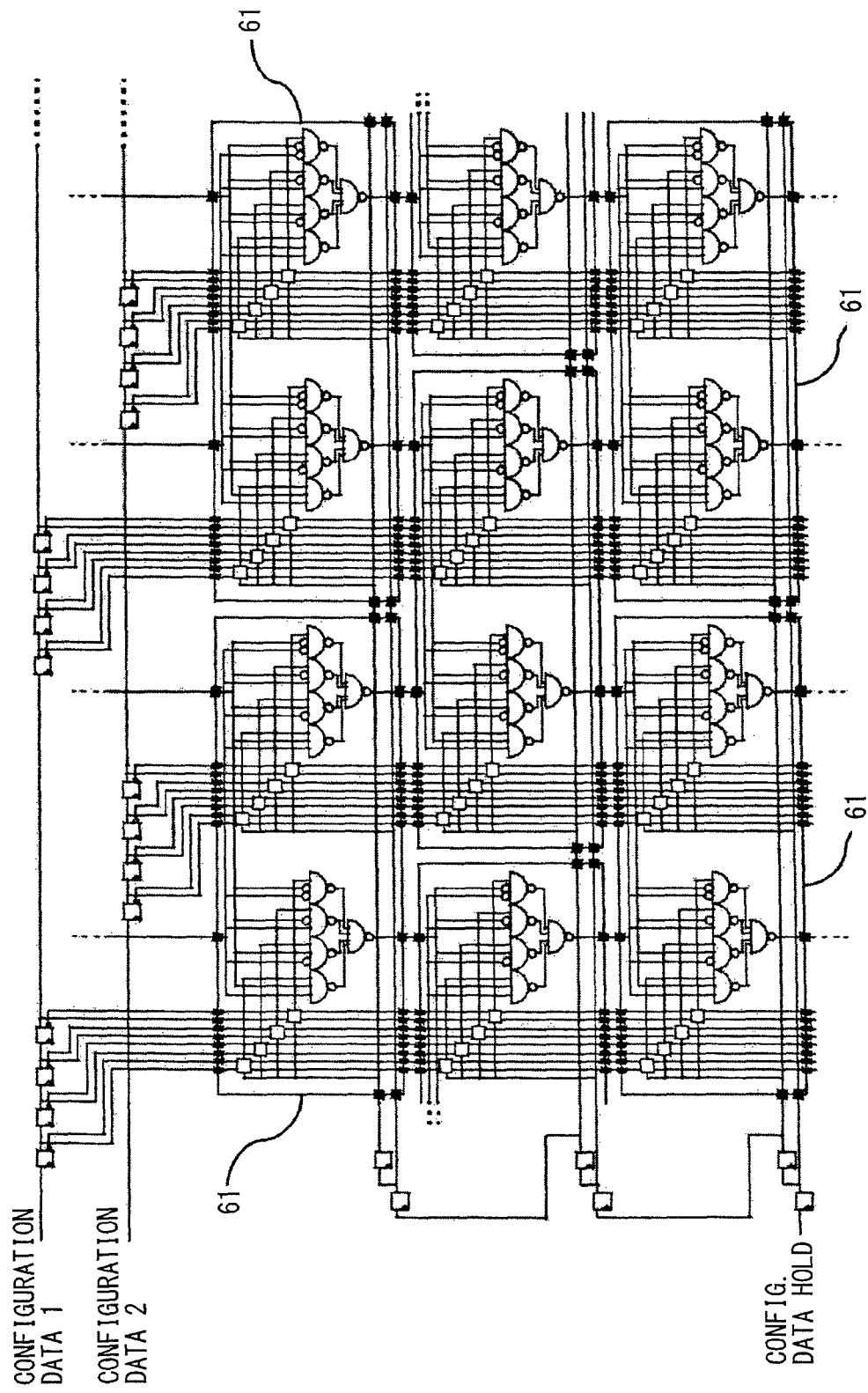
FIG. 27 is a gate level circuit diagram illustrating an array of a modification based on the basic invention.

FIG. 27 illustrates, at a gate level, another circuit for supplying the setting information $c_0$, $/c_0$, $c_1$, $/c_1$, $c_2$, $/c_2$, $c_3$, $/c_3$, $c_4$, $/c_4$, $c_5$, $/c_5$, $c_6$, $/c_6$, $c_7$, $/c_7$ to each unit cell 61 of FIG. 23. The configuration data Configuration Data is divided into a line (Configuration Data1) for configuring the left side memory element group in the unit cell 61 and a line (Configuration Data2) for configuring the right side memory element group in the unit cell 61. Because of this structure, the configuration information can be updated quickly.

2-5 Feedback Circuit

As explained in FIG. 3, the array may include multiple sub-arrays arranged in a column direction, and the feedback circuit can be inserted between the sub-arrays.

Figure 28:
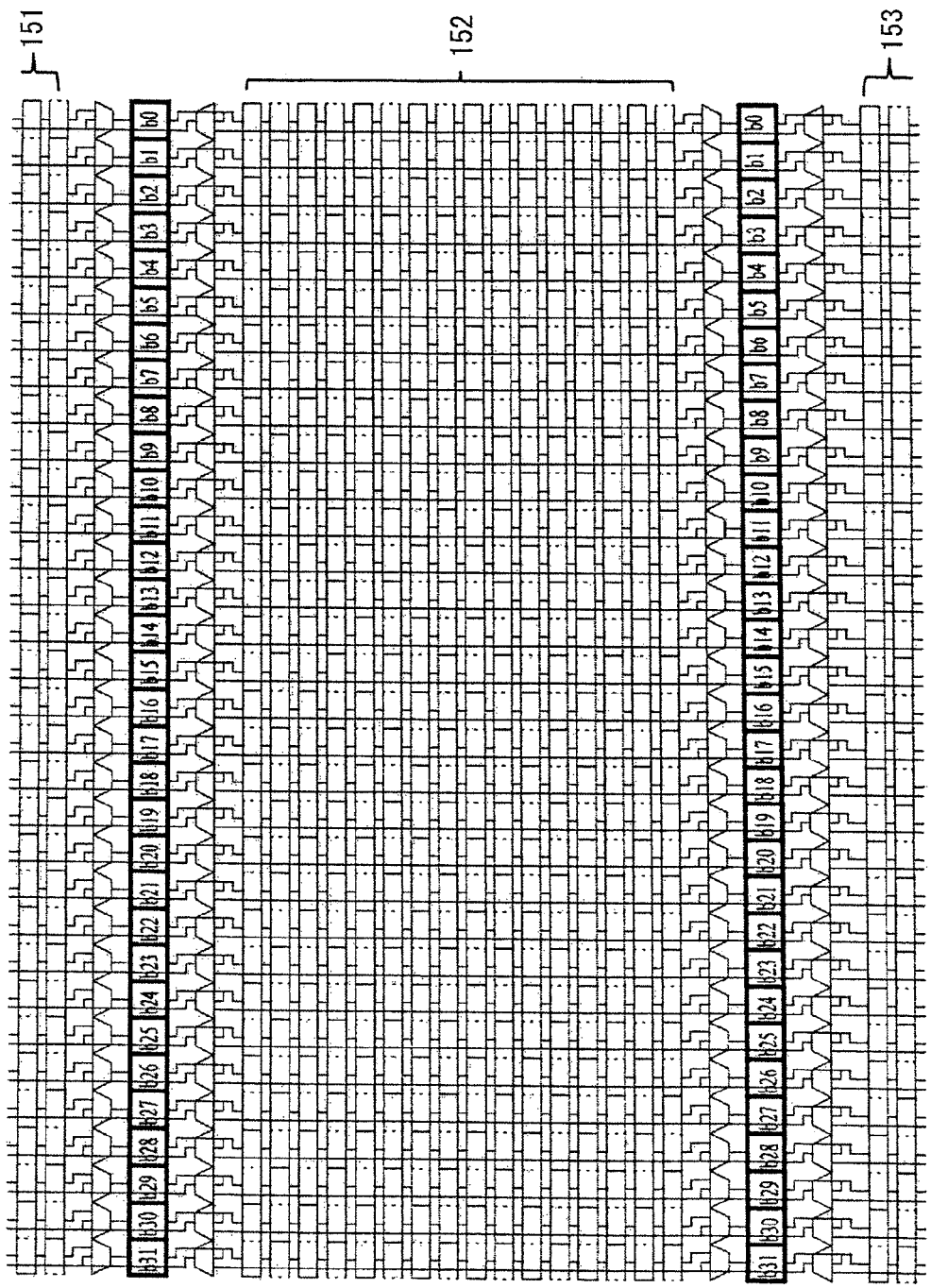
FIG. 28 is a layout diagram illustrating an array and a sub-array of an embodiment based on the basic invention.

FIG. 28 shows an example of the array, in which the feedback circuits b00 to b31 are inserted.

The array as a whole includes the sub-arrays 151, 152, 153, and the sub-array of this example includes the unit cells in sixteen rows (part of the sub-arrays 151, 153 is omitted in FIG. 28). The number of feedback circuits b00 to b31 is two times as large as the total number of logic element blocks contained in one row of unit cells (the number of elements in the unit cell of FIG. 28 is two). The feedback circuits are connected to the output terminals X and the output terminals Y of the unit cells in the last rows of the sub-arrays 151, 152. The structure of the feedback circuit is the same as that explained in FIG. 3. The feedback circuit includes a flip-flop circuit 13 (memory element), a logical data signal selector 12 on a previous step, and a feedback signal selector 11. Further, in the feedback circuit, there are an element group for storing the configuration information and signal lines for sending the configuration information.

Figure 29:
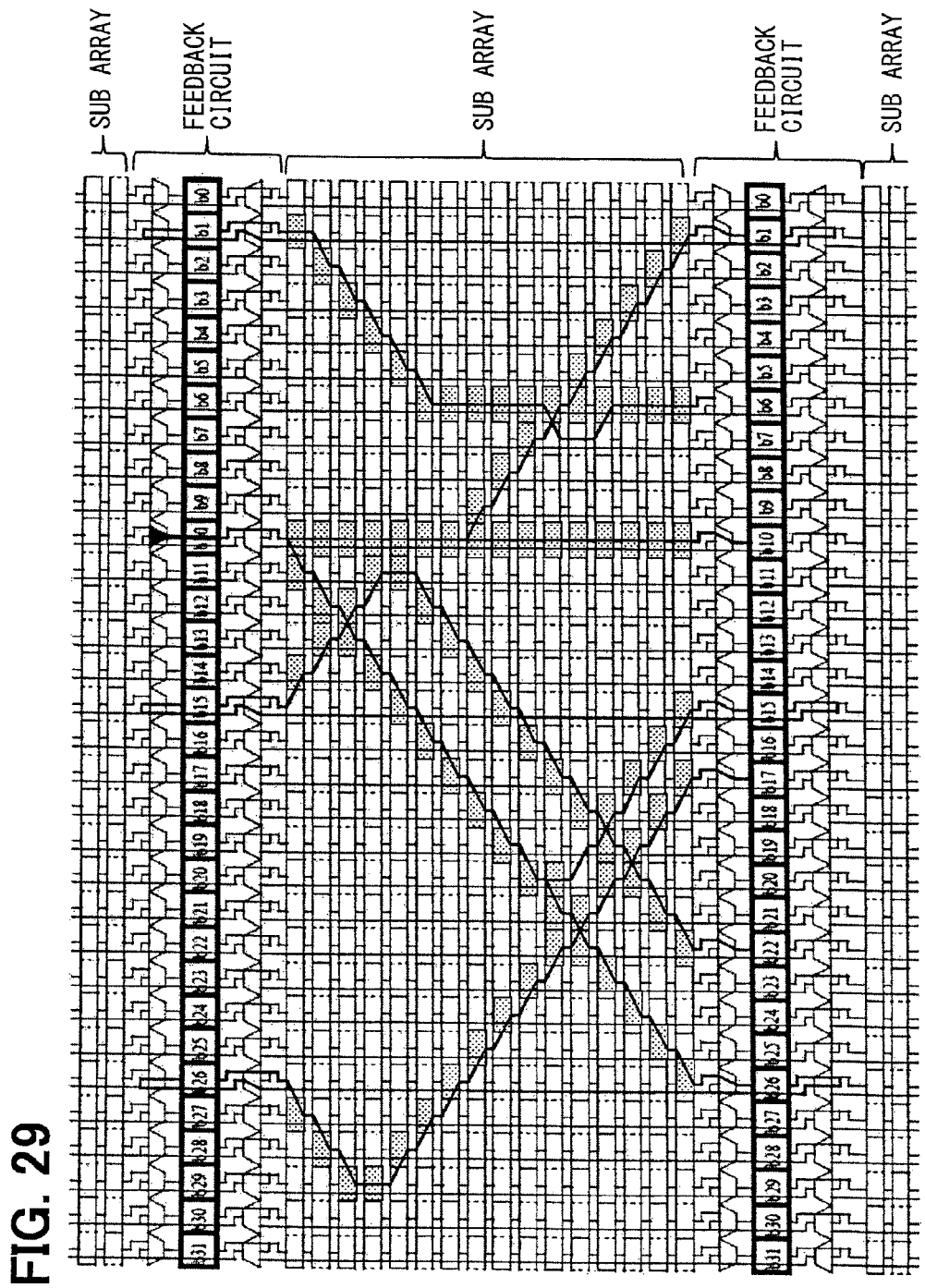
FIG. 29 illustrates an example of using an embodiment based on the basic invention.

FIG. 29 shows an example of a circuit, in which the unit cells 7, 60, 61 function as a vertical wiring, an oblique wiring, a dividing wiring and the like, and the feedback circuits are also utilized.

Figure 30:
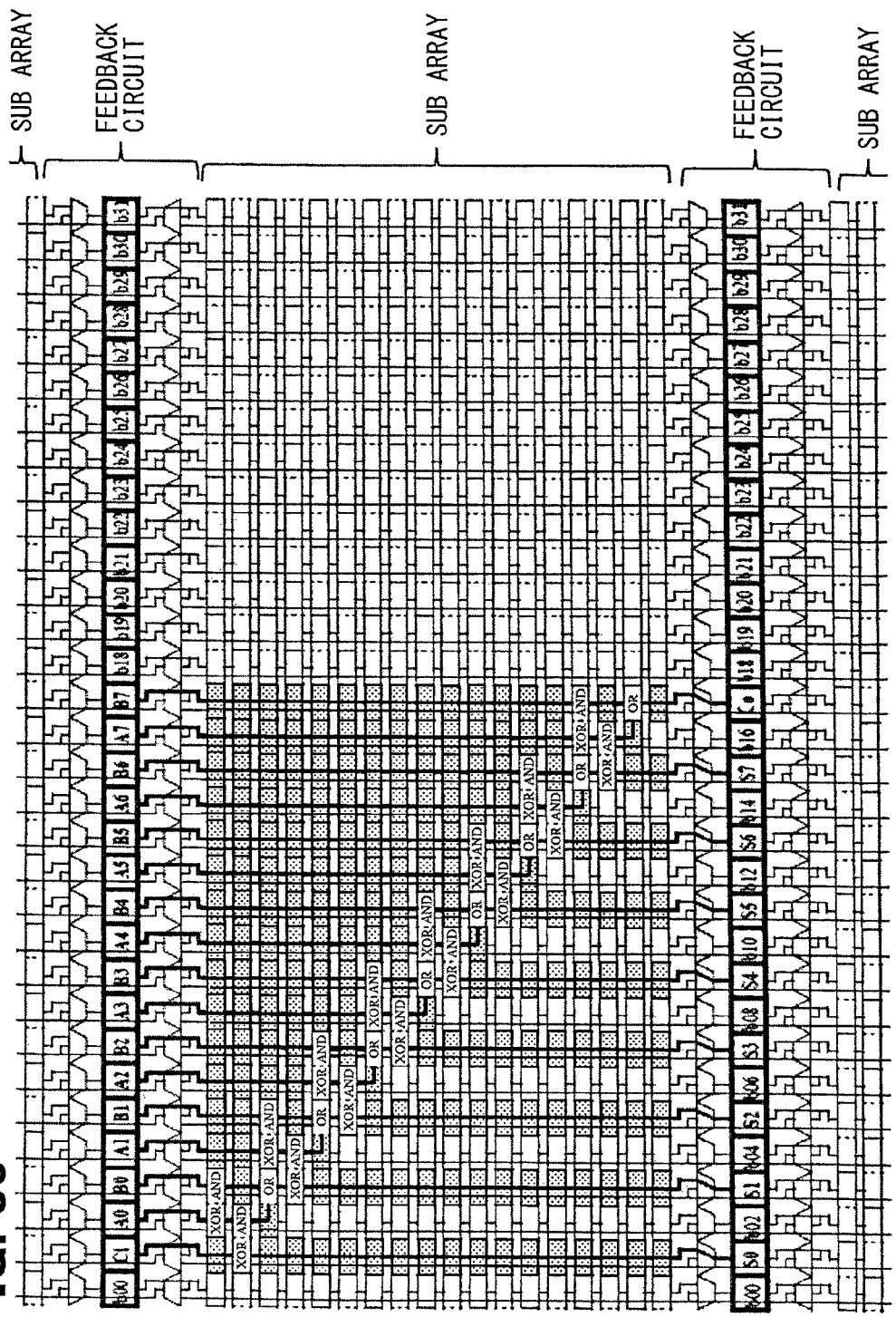
FIG. 30 illustrates an example of using an embodiment based on the basic invention.

FIG. 30 shows an example of an adder with a 8-bit carry, in which the unit cells 7, 60, 61 function as a vertical wiring, XOR (exclusive or), AND (logical product), OR (logical sum) and the like, and the feedback circuit is also utilized.

Figure 31:
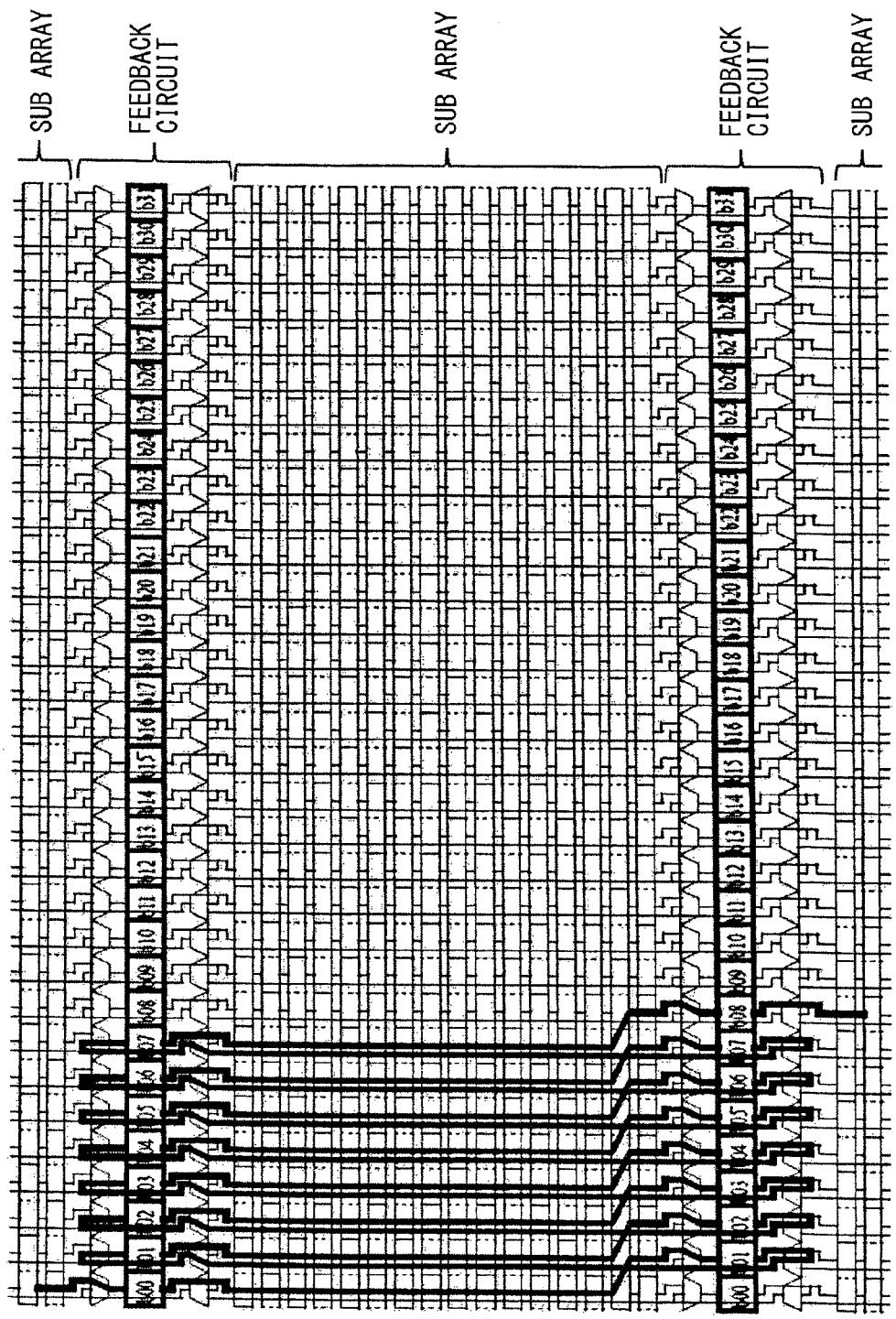
FIG. 31 illustrates an example of using an embodiment based on the basic invention.

FIG. 31 shows an example of a shift register, in which the unit cells 7, 60, 61 function as a vertical wiring and an oblique wiring, and the feedback circuit is also utilized. In the unit cells of the sub-array in FIGS. 29, 30, 31, a thick solid line passing through the sub-array and reaching the feedback circuits on upper and lower sides of the sub-array represents a path of wiring in a circuit.

2-6 System Using Unit Cell (Leaf Cell)

The system using the leaf cell explained in FIGS. 4 to 9 is similarly used in the present embodiment.

2-7 Test for Unit Cell

Preferably, the above described array using the unit cells 7, 60, 61 may be used as follows.

First, in the below-described way, it is checked whether all of the unit cells function.

All of patterns or degenerate patterns (i.e., a subset of patterns enabling detection of substantially all patterns) of each configuration information $c_0$, c1, $c_2$, c3, c4, c5, c6, c7 are supplied to each unit cell 7, 60, 61 to check the operation of each unit cell 7, 60, 61 is checked.

When the operation is different from an expected operation, the failure cell is specified based on the relationship between the above pattern and the output. This provides a failure cell specifying routine.

Actually, when the circuit generation is performed, the configuration information is set, so that the unit cell 7, 60, 61 identified as the failure cell is bypassed. When the setting information is set, it is possible to utilize the cell array even if the cell array includes the failure cell.

3-1 Example Using Three-Input or Four-Input Logic Element Block

Figure 32:
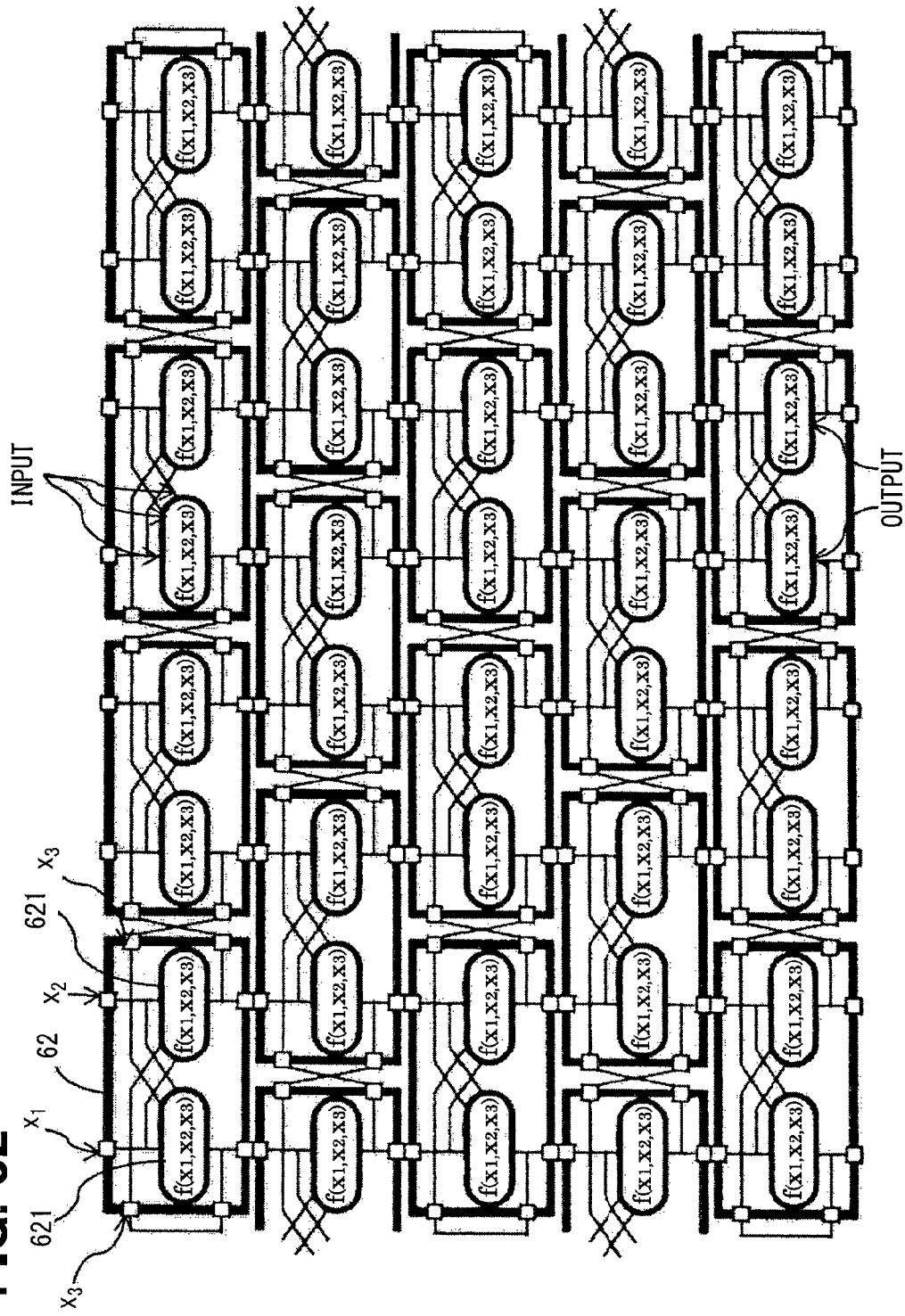
FIG. 32 is a diagram illustrating an embodiment of the present invention (modification based on the basic invention).

FIG. 32 illustrates an embodiment of the present invention, which may be a modification based on the basic invention. The above-described content based on the basic invention can be applied to the below present invention, as long as its nature permits.

In the examples illustrated up to FIG. 31, the unit cell is constructed by combining two two-input logic element blocks. Further, a data inputted from one side (the adjacently disposed unit cell on an upper side in FIGS. 2, 3, 16, 21, 22, 25-31) is processed by a logical operation, and its result is outputted to another unit cell (the adjacently disposed unit cell on an lower side in FIGS. 2, 3, 16, 21, 22, 25-31). Specifically, the unit cells are arranged regularly, so that the unit cells are eclectically connectable with each other without routing a wiring for a low-to-up connection. Thus, the examples shown up to FIG. 31 enables eclectically connection between the unit cells using a minimum wiring on the basis of a technical idea that the unit cells are adjacently disposed and the vertically-adjacent unit cells are directly connected.

By contrast, in the embodiment of the present invention illustrated in FIG. 32, the unit cell 62 is constructed by combining two three-input logic element blocks 621. Specifically, as illustrated in the drawing, one logic element block 621 in the unit cell 62 performs a logical operation on three input signals, two of which are two inputs from the upper adjacent unit cell 62 and the other of which is an input from the left or right adjacent unit cell 62 (or the logic element block 621 in the unit cell 62 plays a role of a wiring). A result of the logical operation is outputted to a low side, a right side or a left side of the unit cell 62. That is, by regularly arranging the unit cells, it is possible to electrically connect between the upper unit cell and the lower unit cell and between the left unit cell and the right unit cell, without wastefully routing a wiring. The example shown in FIG. 32 (the same in circuit examples of FIG. 33 and subsequent drawings) enables direct electrical connection between the unit cells through a minimum wiring, on a basis of a technical idea that the unit cells are adjacently disposed in a lower/upper direction and a left-fright direction and that these unit cells in the lower/upper direction and the left-/right direction are directly connected.

The rectangular unit cells 62 are arranged in a matrix while shifting the unit cells 62 by a half of the pitch on a row basis. The unit cell 62 is supplied with the signal $x_1$ and the signal $x_2$ from the unit cell 62 in the previous adjacent row (a upper side row in the drawing) and supplied with the signal $x_3$ from the adjacent unit cell 62 belonging to the same row (if the unit cells are present on both right side and left side of the unit cell 62, the unit cell 62 is supplied with the signals $x_3$ from both the right side and left side). By receiving these signals, the unit cell 62 supplies an reversed or un-reversed signal of one of the signals or a result of the logical operation according to the logic configuration information to the unit cell 62 in the latter adjacent row (a lower side row in the drawing) or the adjacent unit cell 62 in the same row (left or right in the drawing). As described above, in the embodiment of the present invention, the unit cell can receive a signal from and output a signal to not only the unit cells in upper and low directions but also in left and right directions (matrix direction). This realizes a high density logic circuit, as compared with the example that uses the two-input logic element blocks.

Figure 33A:
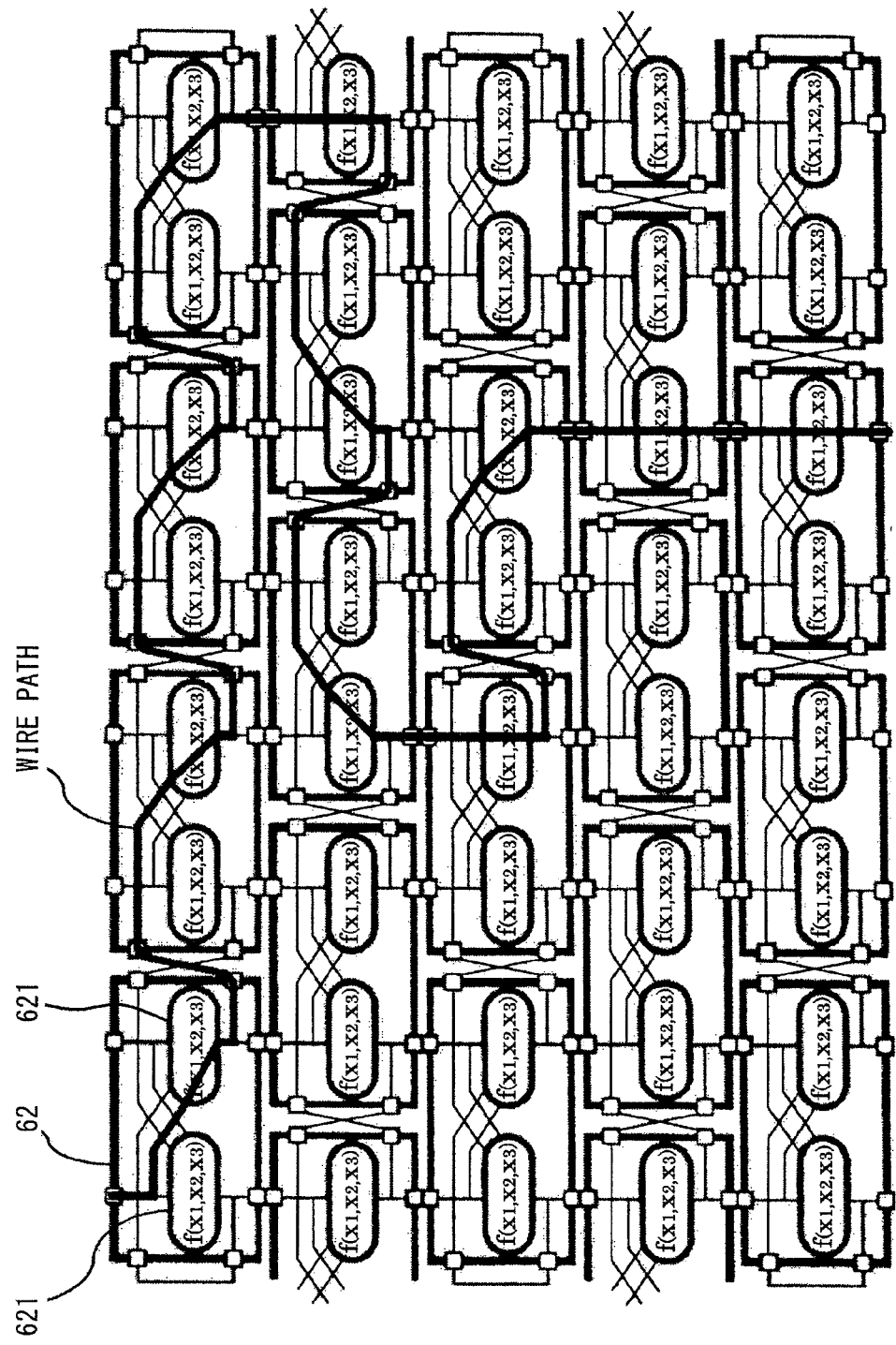
FIG. 33A illustrates an exemplary form of using the embodiment illustrated in FIG. 32.

FIG. 33A illustrates a usage form of the embodiment illustrated in FIG. 32. As can be seen from this usage form, the unit cells 62 can be connected not only in an upper/lower direction (column direction) but also in a left/right direction (row direction). As a result, it becomes possible to supply a logical operation result in a left/right direction and implement a wiring in the left/right direction. In FIG. 33A, the thick solid line passing through the logic element blocks 621 in the unit cells represents a wiring path.

Figure 33B:
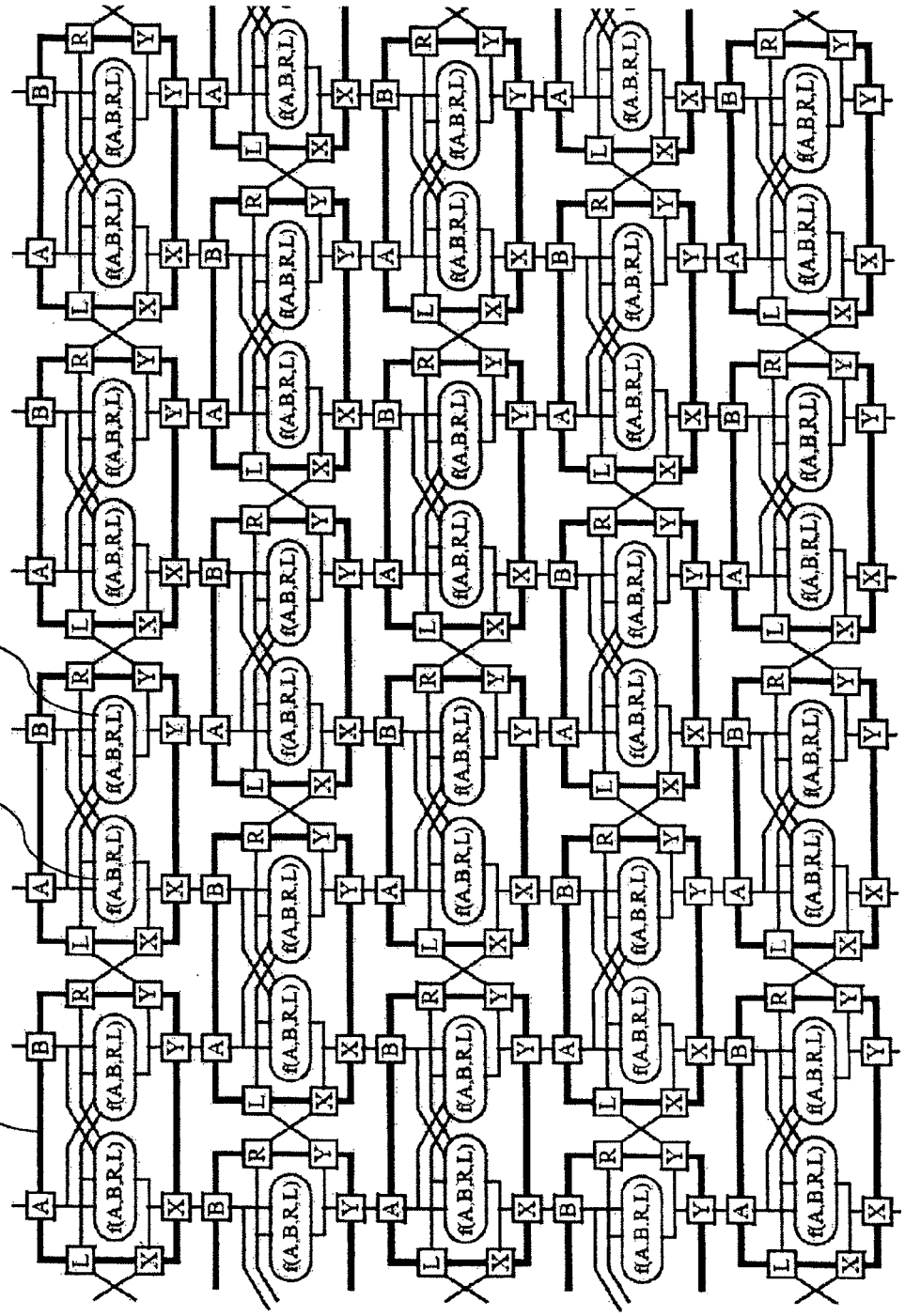
FIG. 33B illustrates a modification of an embodiment of the present invention.

FIG. 33B illustrates a modification of the embodiment of the present invention.

In the example of FIG. 33B, the unit cell 63 is constructed by combining two four-input logic element blocks. In this regard, not all of the four inputs A, B, L(left), R(right) are used for the logical operation. One of A and L is selected as the input, and one of B and R is selected as the input. The selected inputs are used as $x_1$ and $x_2$ in FIG. 11 (logic reconfiguration element model) to implement the logic or the wiring. It is noted that because a wiring is determined by design depending on a circuit to be configured, a wiring path is omitted in FIG. 33B.

The rectangular unit cells 63 are arranged in a matrix while displacing the unit cells 62 by a half of the pitch on a row-basis. The unit cell 63 includes a logic element block 631 providing an output in the x direction and a logic element block 632 in the y direction as illustrated in the drawing. The unit cell 63 is supplied with the signals for A and B from the unit cells 63 in the previous adjacent row (an upper side row in the drawing) and supplied with the signals from L and R from the adjacent unit cells 62 belonging to the same row (a left side and a right side in the drawing). The logic element block 631 selects the signal A or L in accordance with x-side selection information. To the unit cell 63 in the latter adjacent row (a low side row in the drawing) or the unit cell in the same row (a left/right side in the drawing), the logic element block 631 supplies a reversed or un-reversed signal of one of the signals or a result of the logical operation between A or L and B or R according to x-side configuration information. The logic element block 632 selects the signal A or R in accordance with y-side selection information. To the unit cell 63 in the latter adjacent row (a low side row in the drawing) or the unit cell in the same row (a left/right side in the drawing), the logic element block 631 supplies a reversed or un-reversed signal of one of the signals or a result of the logical operation between B or R and A or L according to y-side configuration information.

Figure 33C:
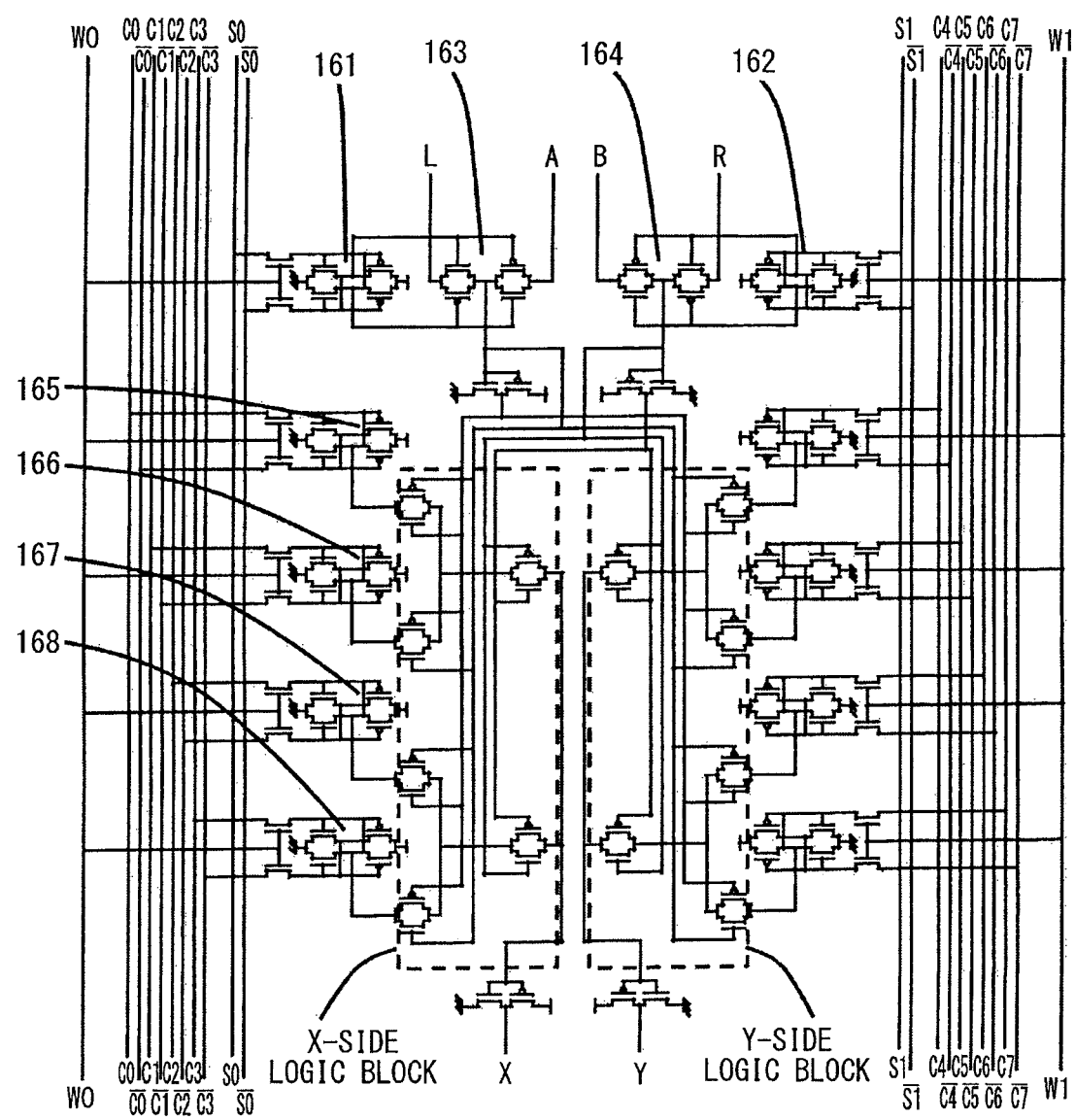
FIG. 33C illustrates in detail a circuit of a unit cell illustrated in the embodiment of FIG. 33B.

FIG. 33C is a transistor level circuit diagram of the unit cell 63 illustrated in FIG. 33B. Although a portion for implementing a logical operation is equivalent to that in the below-illustrated FIG. 38B, flip-flop circuits 161, 162 storing the selection configuration information for selecting A or L and selecting B or R are added. For the flip-flop circuits 161, 162, the configuration information is supplied from signal lines $S_0$, $/S_0$, $S_1$, $/S_1$. Further, in accordance with the configuration information (information for selecting A or L and B or R) stored in the flip-flop circuits 161, 162, a pair of complementary transfer gates 163, 164 operates. In this way, the selection of A or L and the selection of B or R are performed.

Each of an x-side logic element block and a Y-side logic element block constitutes a logical operation circuit by combining multiple transfer gates. Specifically, the x-side logic element block are provided with multiple transfer gates which, in accordance with the signal A or L and the signal B or R, select four flip-flops 165 to 168 storing the configuration information, FIGS. 33D and 33E are diagram illustrating truth values of the circuit of FIG. 33C. When $S_0$ is 0, L is selected as the input. When $S_0$ is 1, A is selected as the input. When $S_1$ is 0, R is selected as the input. When $S_1$ is 1, B is selected as the input. The logical operation or the wiring implementation based on the input selected in this way are the same as those in FIG. 38C described below.

In the below, technical effects of the four-input two-output unit cell illustrated in FIG. 33B are illustrated in comparison to the two-input two-output unit cell illustrated in FIG. 11 to FIG. 22.

Figure 33F:
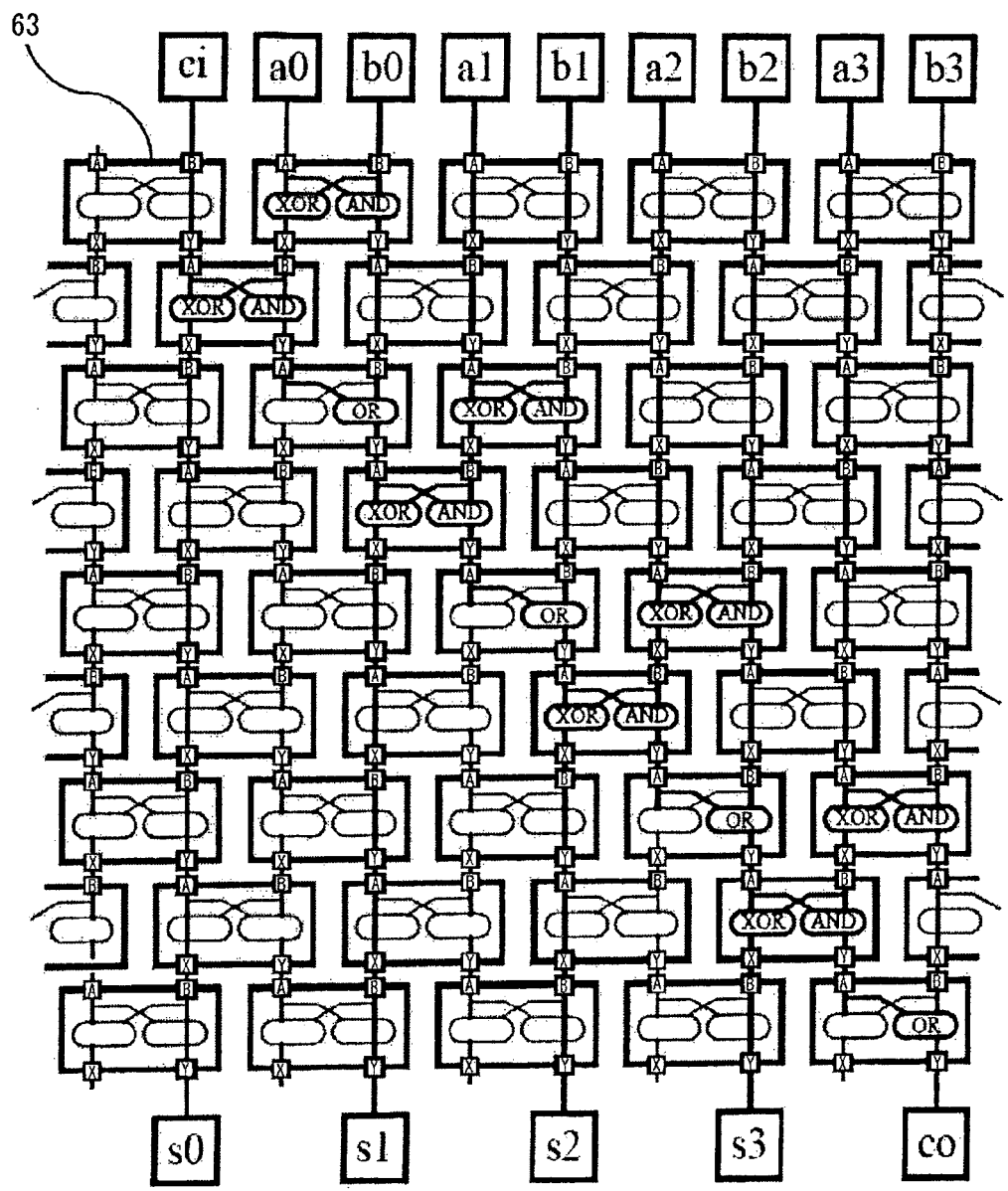
FIG. 33F illustrates a logic mapping based on the basic invention.

FIG. 33F is an example of a logic mapping based on the basic invention, and illustrates 4-bit ripple carry adder which is provided by an interconnection module of the two-input two-output unit cells. The total number of unit cells used is 45, and the total number of logic element blocks is 90 (one cell has two logic element blocks), and a rate of use of the logic element block is 72.2%, and a rate of use of the logic element block as a logic element is 22.2%, and a rate of use of the logic element block as a wiring is 50.0%. In FIG. 33F, a thick solid line passing through the unit cells 63 represents a wiring path.

Figure 33G:
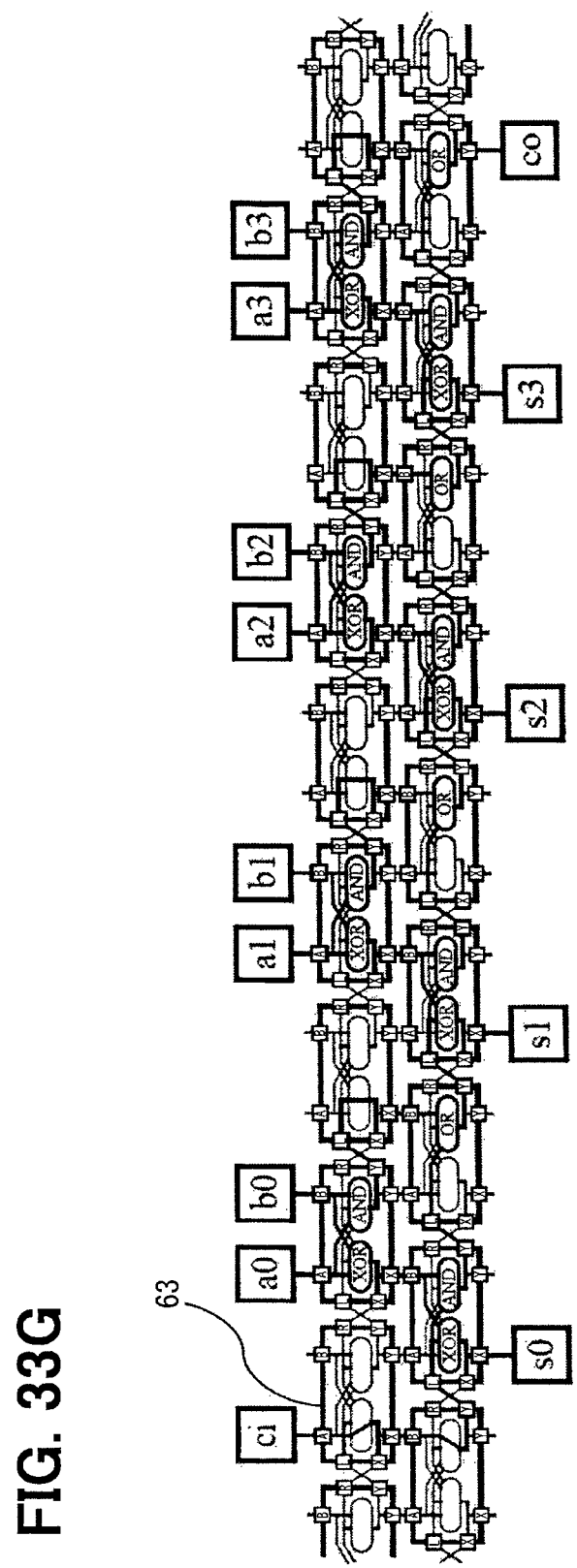
FIG. 33G illustrates a logic mapping corresponding to a circuit structure of FIG. 33B based on the present invention.

FIG. 33G is an example of a logic mapping of the circuit structure of FIG. 33B, and illustrates a 4-bit ripple carry adder which is provided by an interconnection module of the four-input two-output unit cells. In FIG. 33G, a thick solid line passing through the unit cells 63 represents a wiring path. The circuit structure of FIG. 33G is configured, so that a signal communication can be preformed further in a left/right direction (lateral direction, row direction), while FIG. 33F illustrates a wiring connection of the unit cells in an upper/lower direction (vertical direction, column direction). In FIG. 33G, the total number of unit cells 63 used is 18, and the total number of logic element blocks is 36, and a rate of use of the logic element block is 83.3%, and a rate of use of the logic element block as a logic element is 55.6%, and a rate of use of the logic element block as a wiring is 27.8%. Therefore, the using of the four-input two-output unit cells improves the rate of use of the logic element block and reduces the rate of use as a wiring, and thus enables an efficient logic mapping compared with the circuit structure of FIG. 33F. An increase in area of the four-input two-output unit cell is no more than 25%. Thus, in the example of the 4-bit ripple carry adder, the change from the two-input two-output unit cell illustrated in the circuit structure of FIG. 33F to the four-input two-output unit cell illustrated in the circuit structure of FIG. 33G reduces a mounting area to half. As a result, an efficient layout can be provided.

Although the above illustration is given based on a comparison between the two-input two-output unit cell and the four-input two-output unit cell, these may be mixingly mounted. For example, the two-input two-output unit cells may be arranged in the odd-number-th row and the four-input two-output unit cells may be arranged in the even-number-th row. Alternatively, multiple rows of two-input two-output unit cells may be alternately arranged with multiple rows of four-input two-output unit cells.

Additionally, although the unit cells are arranged in a matrix while shifting the unit cells on a row-basis by the half of the pitch in the above embodiments and modifications on assumption of using the same rectangular unit cells, this half pitch arrangement may be modified. The pitch described herein refers to a row direction displacement between the unit cells in the even-number-th row and the unit cells in the odd-number-th row when the unit cells are arranged and packed.

For example, the same rectangular unit cells may be arranged by shifting the unit cells on a row-basis by one-third of the pitch or one-fourth of the pitch. Additionally, the unit cells may be arranged at not regular intervals. For example, the unit cells may be arranged at a combination of the half of the pitch and the one-third of the pitch.

Multiple unit cells that have different logic element blocks and that are different in total number of logic element blocks may be used and adjacently arranged. In this case, depending on a manner of adjacently arranging, multiple magnitude pitches are present. In short, the present invention is applicable to any circuits along as multiple unit cells are be arranged in an array (upper/lower and left/right directions, row and column directions) in a regular manner (the unit cells are arranged according to a certain arrangement rule in upper/lower and left/right direction, i.e., row and column directions) and a circuit structure can eliminate and minimize a dedicated wiring channel for eclectically connecting the unit cells.

It may be difficult to directly connect input/output terminals to connect the unit cells in actually manufacturing a product based on the present invention. In this case, by minimizing a wiring and closely arranging the unit cells to connect the unit cells, it is possible to manufacture a product based on the present invention. In the present invention, this case can refer to the above-described minimization of a wiring channel.

In all the above-described embodiments, two logic element blocks are constructed in the unit cell. Alternatively, three or more logic element blocks may be constructed in the unit cell. In this case, the number of inputs and outputs may be variably determined by designs. When the leaf cells are constructed by adjacently arranging the unit cells including the unit cells having these logic element blocks (i.e., adjacently arranging the unit cells including the unit cells different in the number of unit cells from each other), the pitches with different magnitudes necessarily exist.

3-2 Logic Cell Compiler Example

Figure 34:
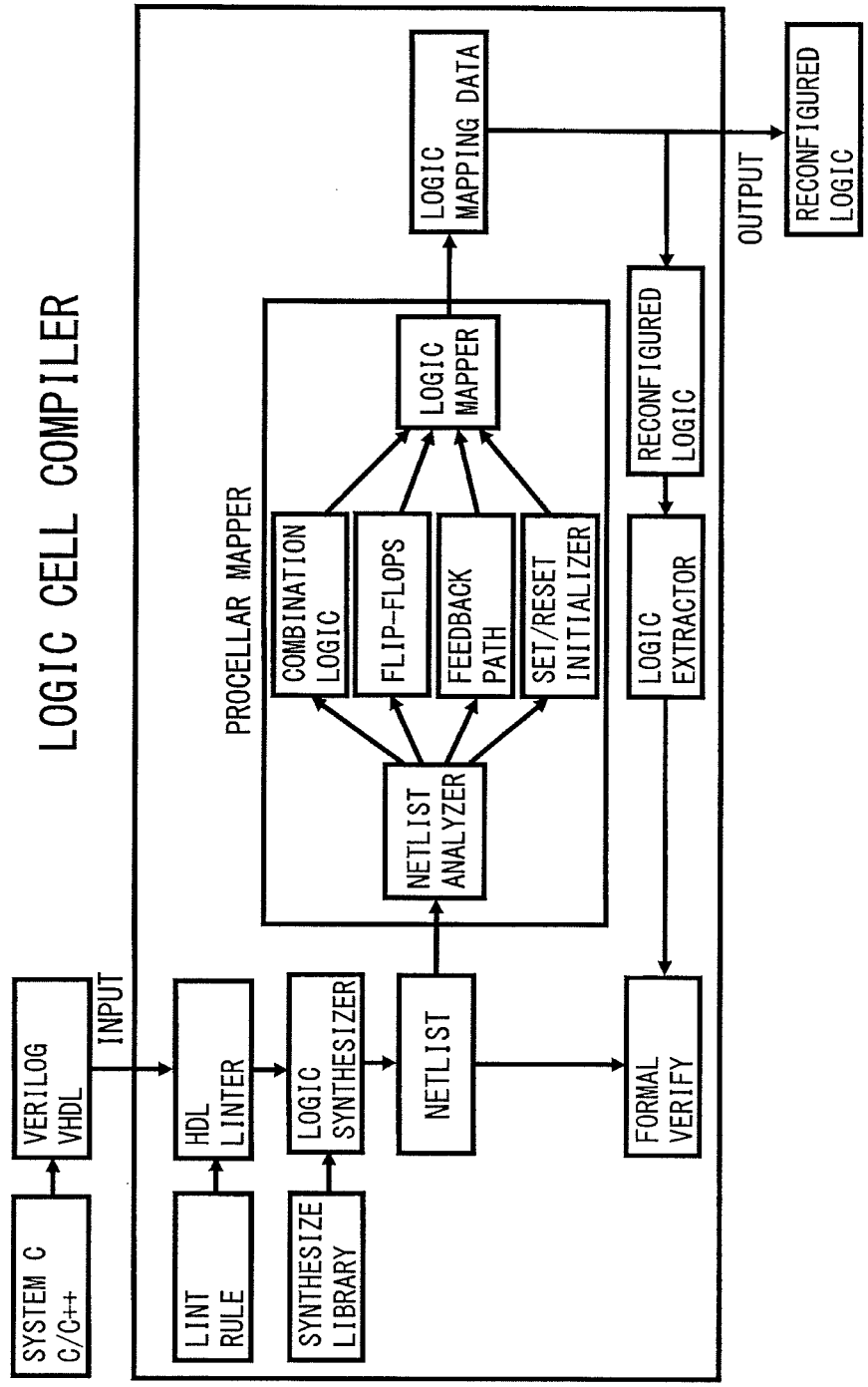
FIG. 34 illustrates a processing flow of a logic cell compiler based on the present invention.

FIG. 34 illustrates a processing flow of a logic cell compiler based on the present invention. An input of data designed by a designer with language such as Verilog VHDL and the like (a data designed with SystemC, C, C++ or the like may be converted) is received and a netlist is generated. This netlist is analyzed with a netlist analyzer and decomposed into a combination logic, a flip-flop, a feedback path, a set/reset initializer and the like and these are integrated with a logic mapper. A logic mapping data obtained in this way corresponds to the logic configuration information of the logic reconfiguration circuit based on the present invention and is supplied (logic mapping based on the present invention) to the logic reconfiguration element such as a latch circuit or the like (the memory element for determining a logic of the logic reconfiguration element).

3-3 Unit Cell Modification Example

Figure 35:
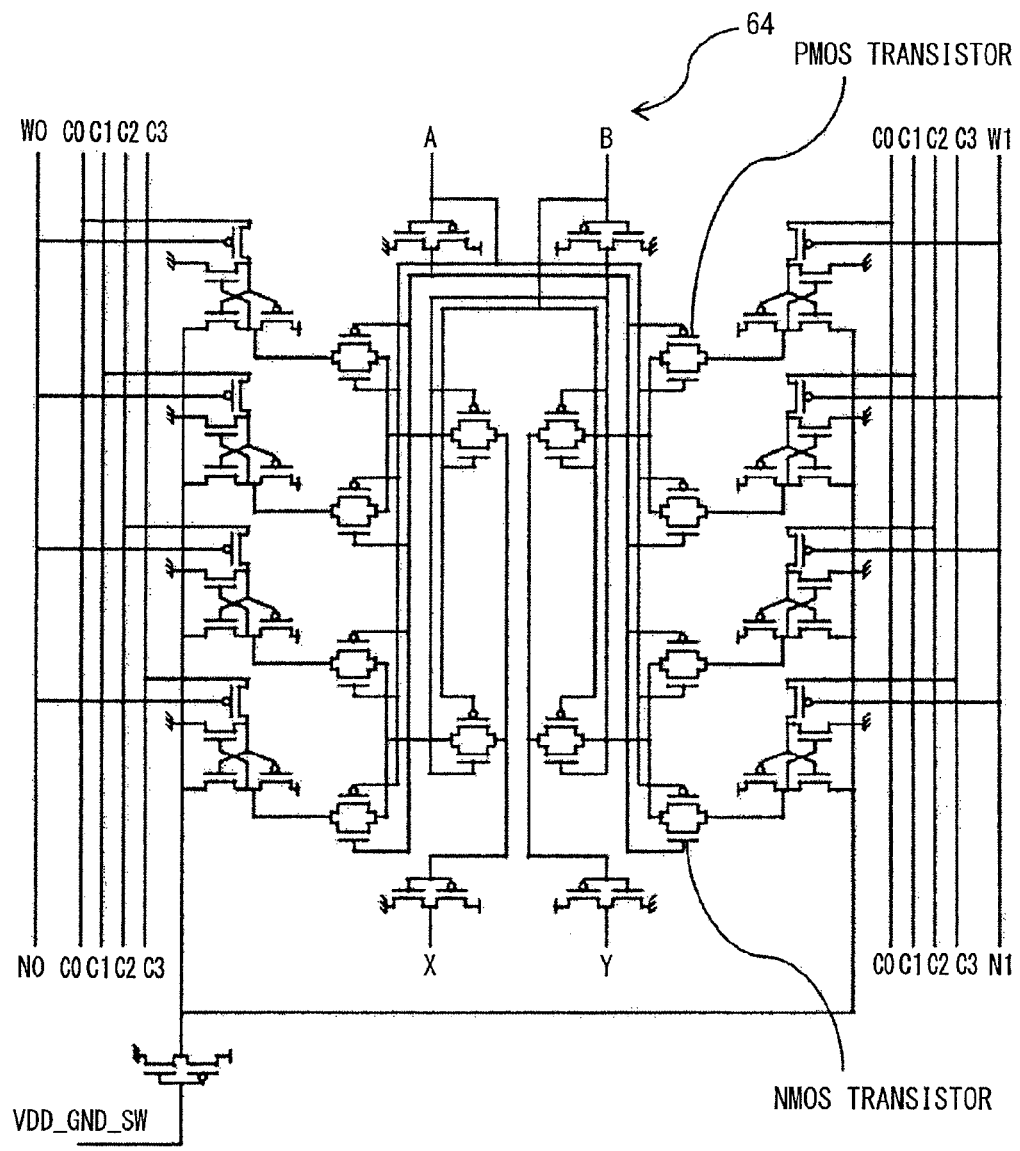
FIG. 35 is a circuit diagram having a smaller number of transistors than the circuits of FIGS. 20 and 24.

FIG. 35 is a circuit diagram of a unit cell 64 based on the present invention, which is smaller in the number of transistors than the circuits of FIGS. 20 and 24. In the circuit of FIG. 20, the logic is implemented using the transistors of multiple NANDs. The circuit 35 of FIG. 35 has the remarkably small total number of transistors by using multiple transfer gates (transfer gates: a circuit structure in which a PMOS transistor and an NMOS transistor are connected in parallel). FIG. 36 illustrates truth values of logical operations implemented by the circuit of FIG. 35.

In the circuit of FIG. 20, the inverters are continuously connected as two stages to constitute the flip-flop, which is controlled using the two transfer gates to provide the memory element for storing the configuration information. In the circuit of FIG. 35, two PMOS transistors and two NMOS transistors constitute the memory element. The operation of the circuit of FIG. 35 is provided using the circuit including transistors (Tr) shown in FIG. 37 (constituting a SRAM with four transistors Tr1, Tr2, Tr3, Tr4 constitute SRAM).

FIG. 37(*a*), (*b*) is a drawing illustrating transistors for providing the circuit of FIG. 35. FIG. 37(*a*), (*b*) concretely illustrates the memory element for determining a logic of the logic reconfiguration element.

In FIG. 37(*a*), (*b*), a drain of a first PMOS transistor (Tr1) and a drain of a first NMOS transistor (Tr2) are connected to each other, and these drains are connected to a gate of a second PMOS transistor (Tr3) and a gate of a second NMOS transistor (Tr4). Additionally, a drain of the second PMOS transistor (Tr3) and a drain of the second NMOS transistor (Tr4) are connected to each other, and these drains are connected to a gate of the first PMOS transistor (Tr1) and a gate of the first NMOS transistor (Tr2) to provide an output terminal. Further, a source of the first PMOS transistor (Tr1) acts as an input terminal of the logic reconfiguration element for the logic reconfiguration data. The source of the first PMOS transistor (Tr1) is connected to GND, and a source of the second PMOS transistor (Tr3) is connected to the power source. The gate of the first PMOS transistor (Tr1) functions as a control gate (W) for data input. In an initial state, a source of the second NMOS transistor (Tr4) is connected to a power source level. After fixing the hold data, an electrical potential of the source of the second NMOS transistor (Tr4) transitions from the power source level to the GND level. The memory element is realized by this connection structure of the four MOS transistors.

FIG. 37(*a*) illustrates a state before storing a data. The source (control signal terminal 2) of the Tr4 is connected to VDD2 (power source voltage level). W (control signal terminal 1) corresponds to 0 (low level). D corresponds to a reversed data of a data latched at OUT (0 is provided when 1 is outputted to OUT in the latched state, and 1 is provided when 0 is outputted to OUT in the latched state). VDD1 corresponds to 1 (high level, i.e., level of power source voltage) and GND1 corresponds to 0.

Subsequently, as shown in FIG. 37(*b*), the source of the Tr4 (control signal terminal 2) is changed from VDD2 to GND2 (ground voltage GND level, i.e., low level 0). As a result, an inversed output of D is outputted from OUT. Thereafter, when W is 0, the input is interrupted. In this state, the latch operation is completed. It is noted that, in order to keep outputting 0 to OUT, it is necessary to keep the gate of Tr4 at 1. By keeping D at 1 after completing the latch operation, a sub-threshold-leak current supplied from D (source) to the opposite node (drain) generates in Tr1, so that the electric potential of the gate is kept at 1. In this way, not just the data of 1 but the data of 0 continues to be outputted to OUT. It is noted that the data is outputted to D from the beginning in the above example. Alternatively, 0 may be supplied to D1 first and then the reversed data of the configuration data may be supplied, and thereafter, W is changed from 0 to 1. Additionally, in the above example, both Tr1 and Tr3 are PMOSs and both Tr2 and Tr4 are NMOSs. Alternatively their polarities may be all reversed and the polarity of the inputted data D may be reversed. In this case, the same operation is expected.

As described, because the memory for configuring the logic reconfiguration element can be constructed using the SRAM having the four transistors Tr, it is possible to downsize a circuit scale of the memory element determining a logic of the logic reconfiguration element.

3-4 Further Modification of Unit Cell

Figure 38A:
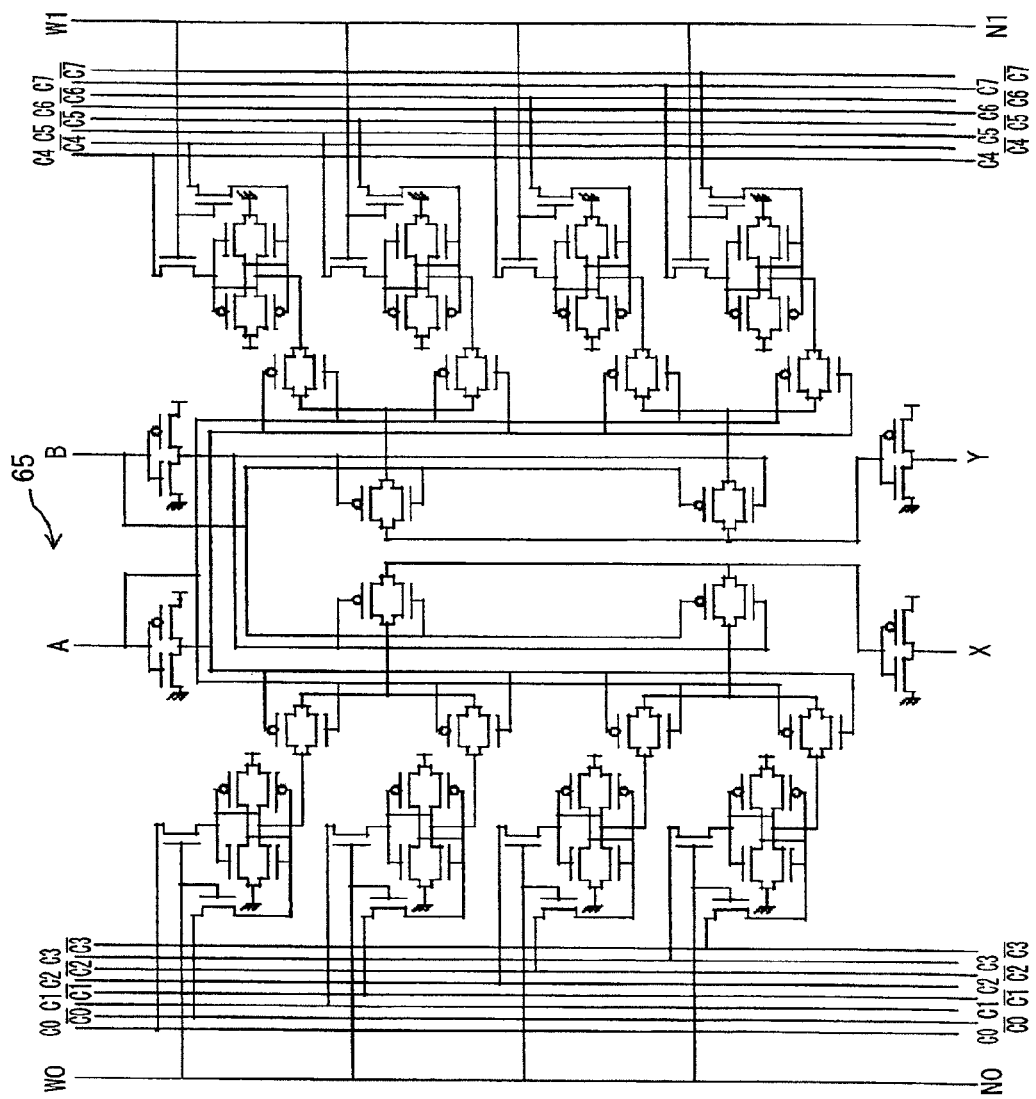
FIG. 38A is a circuit diagram illustrating a modification based on the present invention.

FIG. 38A is a transistor level circuit diagram (detailed circuit diagram) of a unit cell 65 based on the present invention. This example uses the SRAM circuit storing the logic configuration information similar to that shown in FIG. 24, and uses the circuit of the logical operation portion similar to that shown in FIG. 35. The truth vales are the same as those shown in FIG. 36.

Figure 38B:
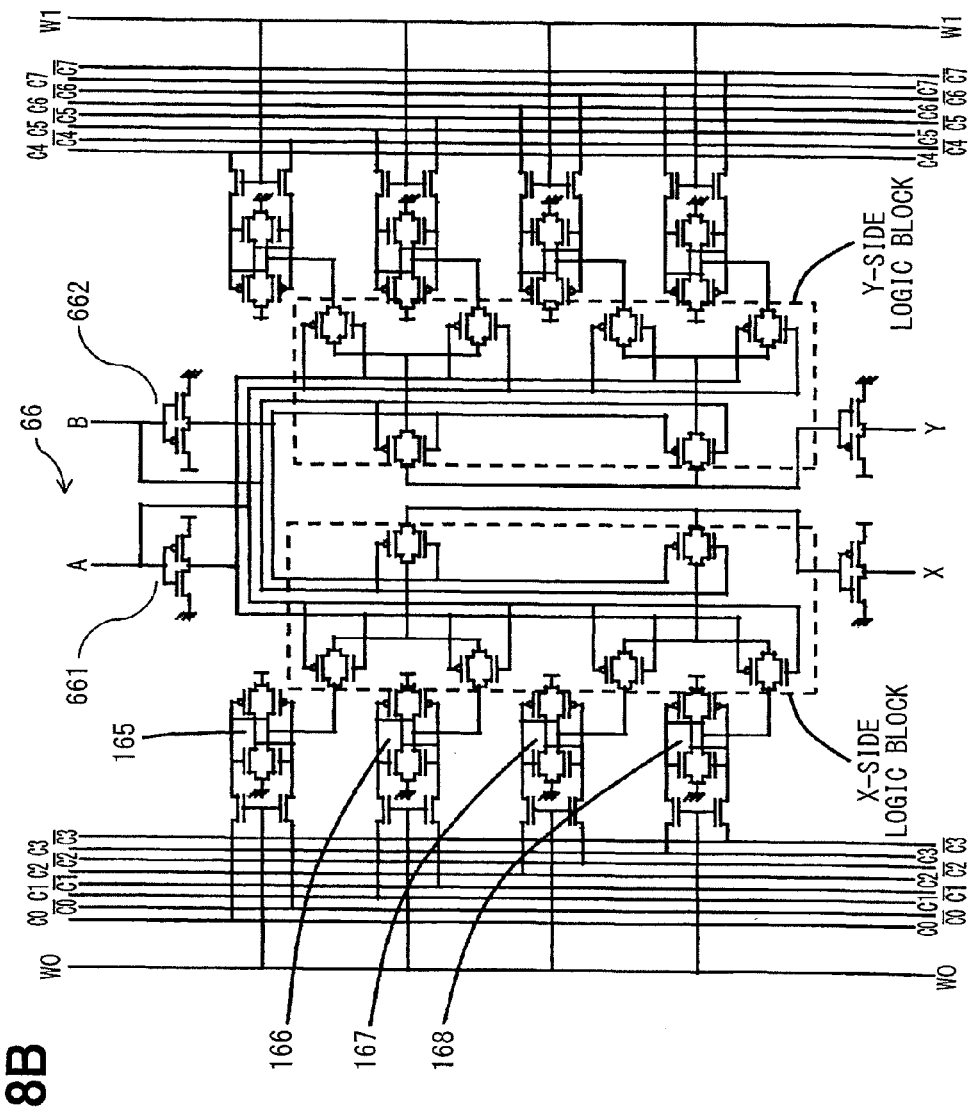
FIG. 38B is a circuit diagram illustrating a modification based on the present invention.

FIG. 38B is a transistor level circuit diagram (detailed circuit diagram) of a unit cell 66 based on the present invention. When compared with FIG. 38A, the outputs of input-stage invertors 661, 662 are reversed and the truth values of this circuit accordingly are different. The truth values are shown in FIGS. 38C and 38D.

Figure 39:
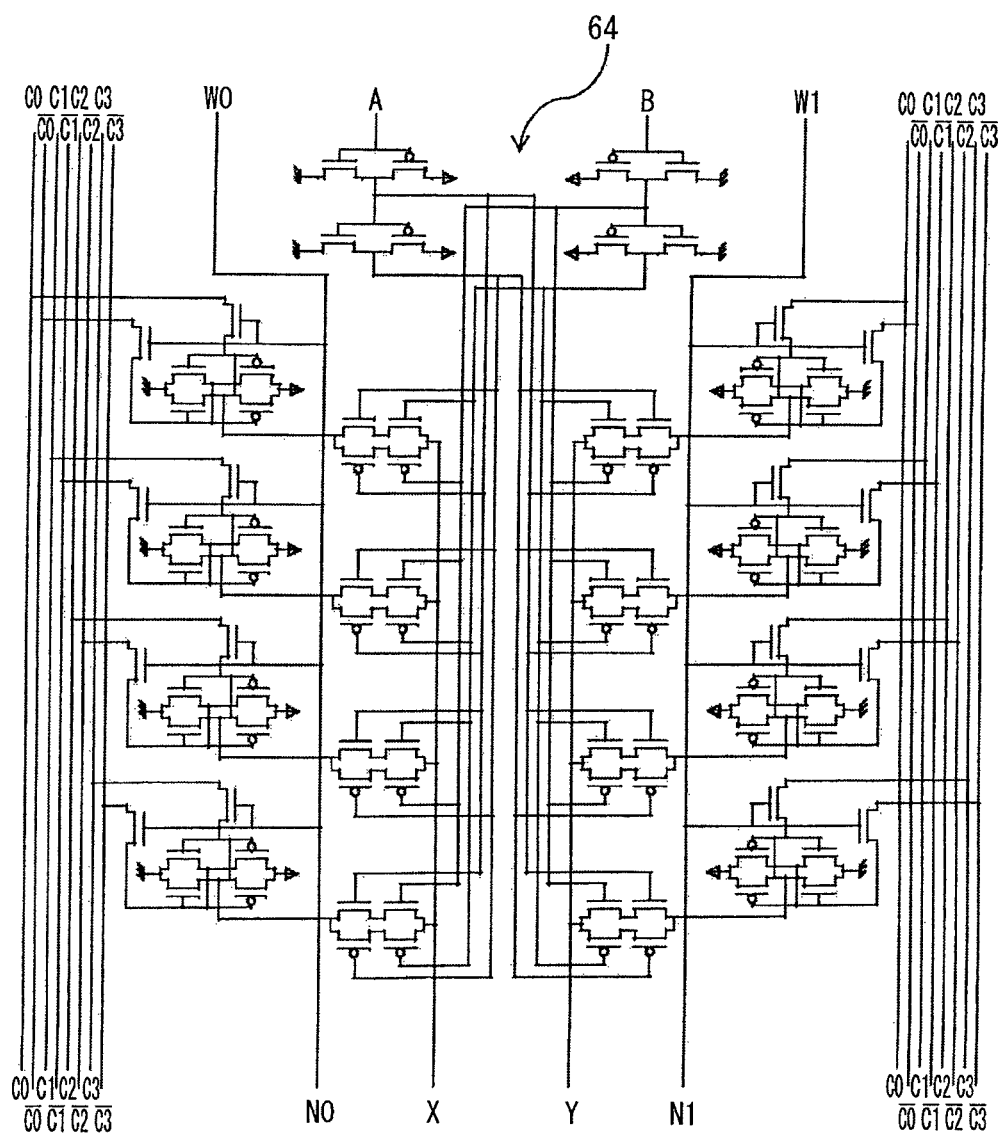
FIG. 39 illustrates a further modification of an embodiment based on the present invention.
Figure 41:
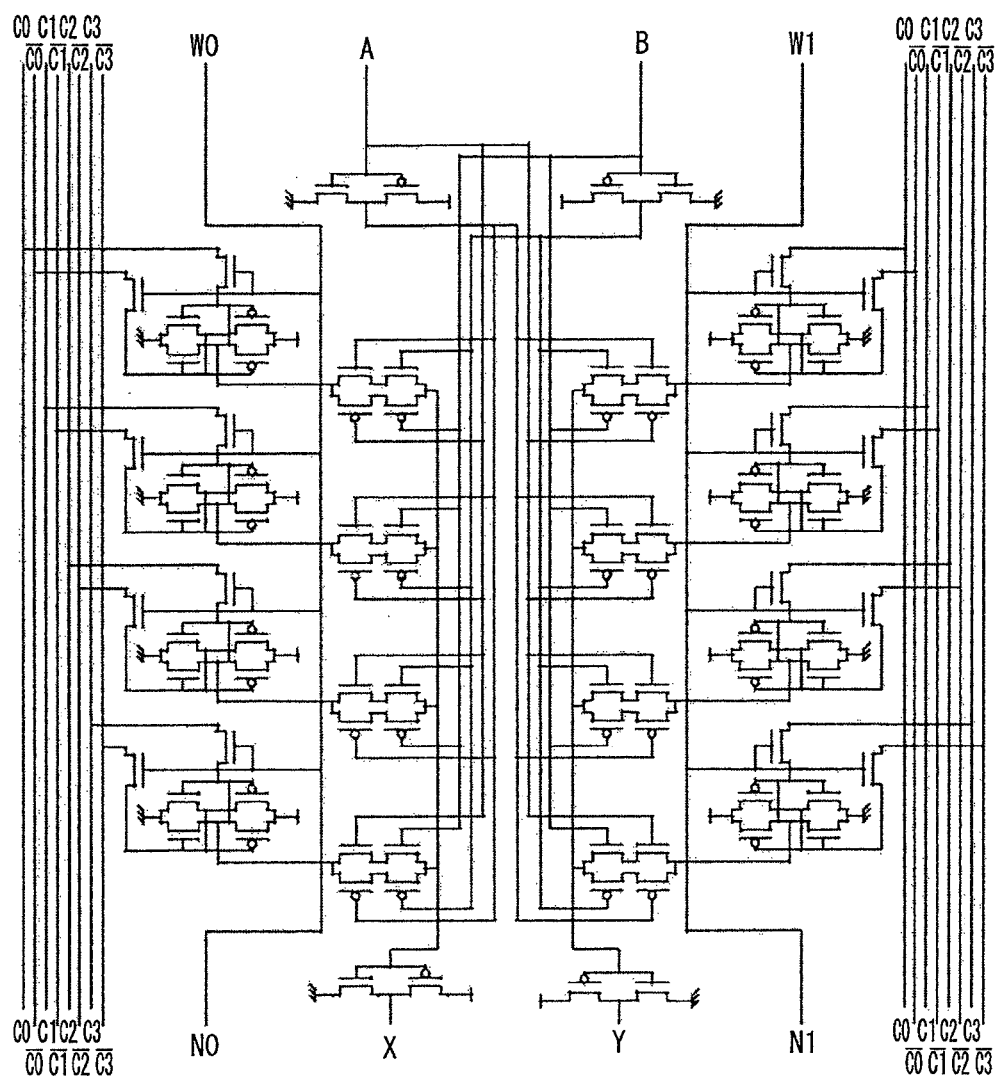
FIG. 41 illustrates a modification in which a transfer gate in the circuit diagram of FIG. 38A, 38B is modified.

FIG. 39 is a circuit diagram of a unit cell 67 according to a modification based on the present invention. In this example, the same SRAM circuit storing the logic configuration information as that shown in FIG. 24 is used, and a circuit structure for a logical operation is modified. FIG. 40 illustrates truth values corresponding to a circuit structure of FIG. 39. FIG. 41 is a circuit diagram illustrating a modification, in which transfer gates in the circuit diagrams of the unit cells 65, 66 of FIGS. 38A, 38B based on the present invention are modified. In this example, the same SRAM circuit for storing the logic configuration information as that shown in FIG. 24. Further, for a circuit portion for the logical operation, one inverter is arranged in an input stage of each of A and B and one inverter is arranged in an output stage of each of X and Y. Truth values of this example are ones shown in FIG. 40.

3-5 Example Using D Flip-Flop for Logic Reconfiguration Cell Module

Figures 42, 43:
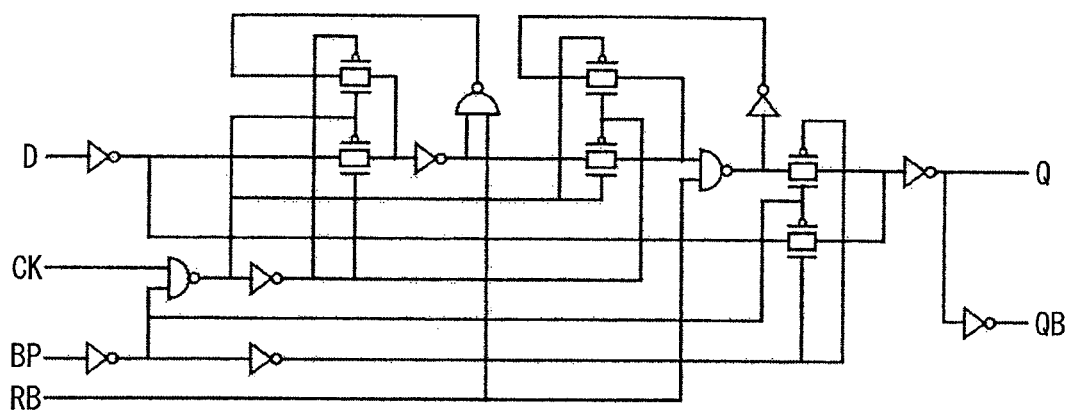
FIG. 42 is a diagram illustrating a D flip-flop having a bypass function based on the present invention.
FIG. 43 illustrates truth values corresponding to the circuit structures of FIG. 42.

FIG. 42 illustrates a D flip-flop having a bypass function. The D flip-flop has a function of performing signal bypass operation from a terminal D to terminal Q when a terminal BP is HIGH (i.e., 1), and functions as a normal D flip-flop when the terminal BP is LOW (i.e., 0). FIG. 43 illustrates truth values representing operations of the D flip-flop of FIG. 42. When the input of the terminal BP is 1, the D flip-flop is in a bypass mode from the input terminal D to the output terminal Q (both of the D input and the Q output are 0 or 1). When the input terminal BP is 0, the D flip-flop is in a mode of normal D flip-flop operation. It can be understood from these truth values that when the input of the terminal BP is 1, the D flip-flop executes the bypass operation. This D flip-flop of FIG. 42 can be defined as the memory element of the flip-flop circuit of FIG. 3. For example, if a large scale combination circuit is required in FIG. 3, the number of logical stages (four stages in FIG. 3) of the multiple unit cells 7 constituting the leaf cell module 71 may be insufficient. Thus, the memory element 13 of FIG. 3 may be replaced with the D flip-flop illustrated in FIG. 42 and the D flip-flop may be used in the bypass mode, so that the leaf cell modules 71 adjacent in the upper/lower direction as illustrated in the FIG. 3 can be used as a logical circuit operating at the same clock by locally increasing the number of logical stages. In this way, by providing the D flip-flop with the bypass mode from the input terminal D to the output terminal Q, it is possible to locally change the number of cell stages and flexibly cope with the scale of the number of logical stages.

3-6 Example of Side Loop

Figure 44:
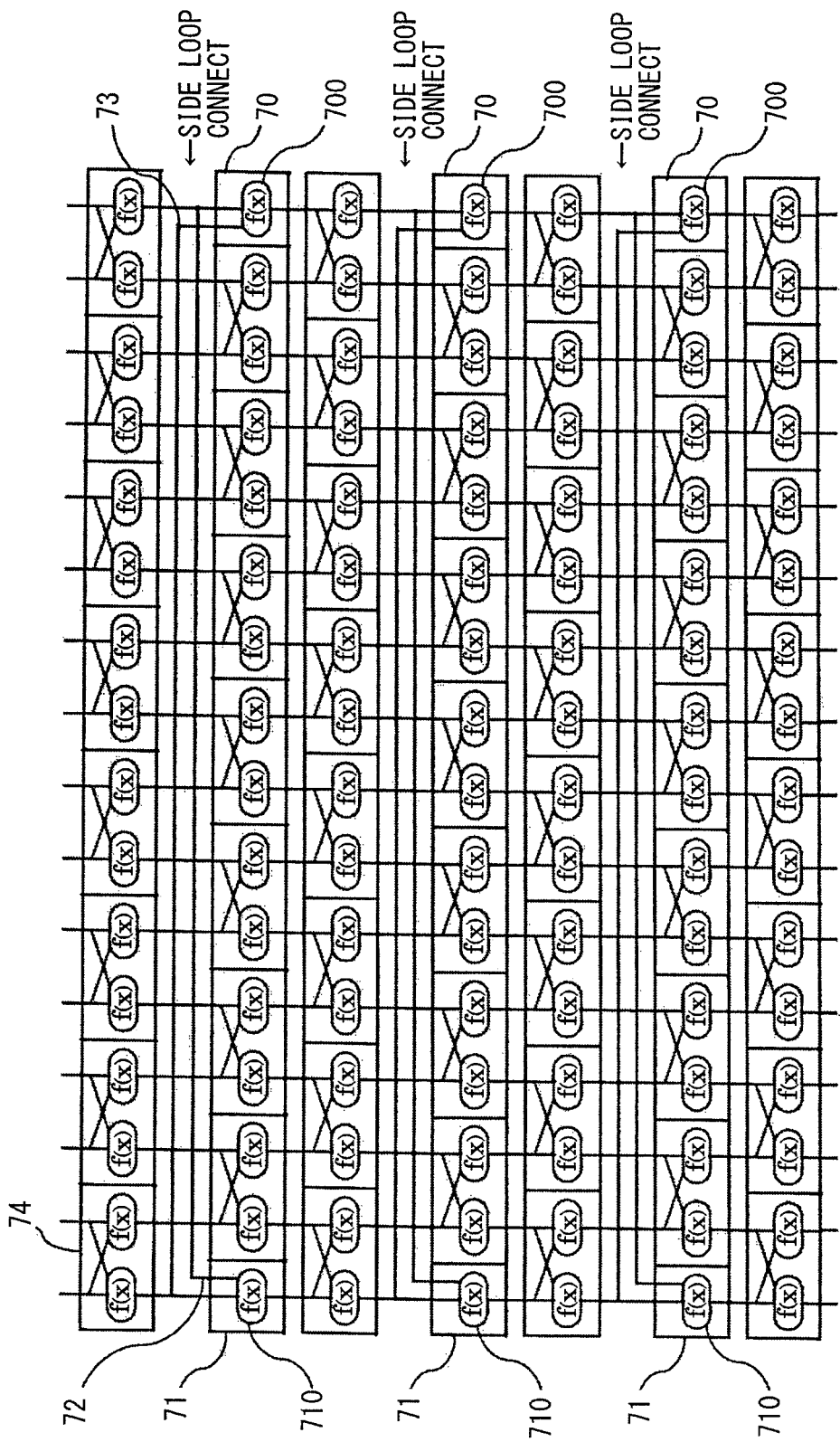
FIG. 44 is an array layout diagram illustrating a side-loop connection based on the present invention.

FIG. 44 is an array layout diagram illustrating a side loop connection. In FIG. 44, while the unit cell 74 has two logic element blocks, each of the cells 70, 71 at left and right ends of the even-number-th row has only one logic element block (the cell 70 has the logic element block 700, and the cell 71 has the logic element block 710). As shown in FIG. 44, the signals can be exchanged between the left end and the right end of the leaf cell module by the interconnection using a wiring 72 and a wiring 73. That is, a signal connection for loop in a lateral direction (side loop connection) is provided. Because of this, the cell 70 and the cell 71, in each which the one logical element block is present, can be equivalent o to one unit cell 70 in logic. This structure enables efficient implementation of circuit functions. Although FIG. 44 illustrates connection between the unit cells 74 located at both right and left ends of the leaf cell module, this does not pose a limit. For example, the output terminal of the unit cell constituting the lead cell module may be connected to the input terminal of any of unit cells (including both ends of the row) that is arranged in a next lower row and that is displaced in a row direction. This connection enables efficient implementation of circuit functions, as is the case of the connection form illustrated in FIG. 44. In the above-illustrated embodiments and modifications, the unit cell has a rectangular shape. However, this does not limit the shape of the unit cell. Specifically, the unit cell may have arbitrary shape such as a rectangular shape with a rounded corner, a rhombus shape, a trapezoidal shape, and other shapes, as long as an integrated circuit including a leaf cell module can minimize a wiring channel region for electrically connecting unit cells having logic element blocks (electrical connection between the logic element blocks). Further, by combining different shapes, the leaf cell module based on the present invention may be constructed.

INDUSTRIAL APPLICABILITY

An integrated circuit and a reconfigurable processor capable of changing an instruction function can be provided with improvement of all of factors, which are area, cost, logic change function, operating frequency, flexibility, throughput, and power consumption.

DESCRIPTION OF REFERENCE NUMERALS 161, 162, 165-168: Flip-flop 163, 164: Transfer Gate

The invention claimed is:

1. An integrated circuit comprising
an array in which a plurality of unit cells each having a predetermined shape are arranged in a matrix, wherein:
each unit cell includes a logic reconfiguration element, a memory element for determining a logic of the logic reconfiguration element, a plurality of input terminals connected to the logic reconfiguration element, and a plurality of output terminals connected to the logic reconfiguration element;
in the unit cells of the matrix, the unit cells in each row is displaced by a predetermined pitch to constitute to the array;
electrical connections between the unit cells constituting the array have the following structures:

(1) an input terminal of one unit cell is electrically connected to an output terminal of a first adjacent unit cell that is arranged adjacent to the one unit cell in a column direction and that is displaced with respect to the one unit cell by the predetermined pitch in a row direction;

(2) another input terminal of the one unit cell is electrically connected to an output terminal of a second adjacent unit cell that is arranged adjacent to the one unit cell in the row direction; and (3) the connection defined in said (1) and the connection defined in said (2) are applied to the unit cells of the array other than said one unit cell.

2. The integrated circuit according to claim 1, wherein:
the integrated circuit comprises a plurality of the arrays;
the integrated circuit comprises an interface circuit electrically connecting the arrays; and
the integrated circuit performs signal communication between the arrays via the interface circuit.

3. The integrated circuit according to claim 2, wherein:
the interface circuit includes a memory element for storing a data outputted from the array, and has a signal bypass function to bypass a signal, which is inputted to an input terminal of the memory element when a predetermined signal is applied to a predetermined terminal of the memory element, to an output terminal of the memory element;
when the predetermined signal is applied to the predetermined terminal of the memory element, the interface circuit bypasses the signal communication between the arrays connected by the interface circuit; and, when not bypassing the signal communication, the interface circuit operates as a sequential circuit storing the data outputted from the array.

4. The integrated circuit according to claim 1, wherein:
in the array, the output terminal of the unit cell is connected to the input terminal of arbitral another unit cell that is arranged in a next lower row and that is arranged in a row direction with respect to the unit cell.

5. The integrated circuit according to claim 1, wherein:
the memory element for determining the logic of the logic reconfiguration element includes a first PMOS transistor, a second PMOS transistor, a first NMOS transistor and a second NMOS transistor, and has the following structures:

(1) a drain of the first PMOS transistor and a drain of the first NMOS transistor are connected to each other, and are connected to a gate of the second PMOS transistor and a gate of the second NMOS transistor;

(2) a drain of the second PMOS transistor and a drain of the second NMOS transistor are connected to each other, and are connected to a gate of the first NMOS transistor, and serve as an output terminal;

(3) a source of the first PMOS transistor serves as an input terminal of the logic configuration element for a logic configuration data;

(4) a source of the first NMOS transistor is connected to GND and a source of the second PMOS transistor is connected to a power source;

(5) a gate of the first PMOS transistor functions as a control gate of a data input;

(6) in an initial state, a source of the second NMOS transistor is connected to a power source level; and (7) after a hold data is fixed, an electric potential of the source of the second NMOS transistor transitions from the power source level to a GND level; and (8) the memory element is constructed according to said (1) to (7).

* * * * *